United States Patent
Arayama

(10) Patent No.: US 11,586,108 B2
(45) Date of Patent: Feb. 21, 2023

(54) PATTERN-FORMING COMPOSITION, FILM, INFRARED CUT FILTER, INFRARED TRANSMITTING FILTER, SOLID IMAGE PICKUP ELEMENT, INFRARED SENSOR, AND CAMERA MODULE

(71) Applicant: FUJIFILM Corporation, Tokyo (JP)

(72) Inventor: Kyohei Arayama, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 192 days.

(21) Appl. No.: 16/819,675

(22) Filed: Mar. 16, 2020

(65) Prior Publication Data
US 2020/0218150 A1 Jul. 9, 2020

Related U.S. Application Data

(63) Continuation of application No. PCT/JP2018/031600, filed on Aug. 27, 2018.

(30) Foreign Application Priority Data

Sep. 19, 2017 (JP) .............................. JP2017-179153
Aug. 21, 2018 (JP) .............................. JP2018-154670

(51) Int. Cl.
| | | |
|---|---|---|
| G03F 7/00 | (2006.01) | |
| C08F 220/06 | (2006.01) | |
| C08F 220/68 | (2006.01) | |
| G03F 7/033 | (2006.01) | |
| G03F 7/038 | (2006.01) | |
| G03F 7/039 | (2006.01) | |

(52) U.S. Cl.
CPC .......... *G03F 7/0007* (2013.01); *C08F 220/06* (2013.01); *C08F 220/68* (2013.01); *G03F 7/033* (2013.01); *G03F 7/038* (2013.01); *G03F 7/039* (2013.01)

(58) Field of Classification Search
CPC ........ G03F 7/0007; G03F 7/033; G03F 7/038; G03F 7/039; C08F 220/06; C08F 220/68
See application file for complete search history.

(56) References Cited

U.S. PATENT DOCUMENTS

| 2009/0208868 A1 | 8/2009 | Okazaki et al. |
| 2013/0011791 A1 | 1/2013 | Suzuki et al. |

FOREIGN PATENT DOCUMENTS

| JP | 2001-264961 A | 9/2001 | |
| JP | 2004-45626 A | 2/2004 | |
| JP | 2004045626 A * | 2/2004 | ............ C08F 220/06 |
| JP | 2004-286810 A | 10/2004 | |

(Continued)

OTHER PUBLICATIONS

Japanese Office Action, dated Dec. 1, 2020, for Japanese Application No. 2019-543580, with an English machine translation.

(Continued)

*Primary Examiner* — Bijan Ahvazi
(74) *Attorney, Agent, or Firm* — Birch, Stewart, Kolasch & Birch, LLP

(57) ABSTRACT

Provided is a pattern-forming composition, including: an infrared absorbing colorant; and at least one compound selected from the group consisting of a resin having a glass transition temperature of 150° C. to 300° C. and a precursor of a resin having a glass transition temperature of 150° C. to 300° C.

10 Claims, 1 Drawing Sheet

(56) References Cited

FOREIGN PATENT DOCUMENTS

| JP | 2005-257955 A | | 9/2005 | |
|---|---|---|---|---|
| JP | 2005257955 A | * | 9/2005 | ............ C08F 290/12 |
| JP | 2010-160380 A | | 7/2010 | |
| JP | 2010-204146 A | | 9/2010 | |
| JP | 2011-213114 A | | 10/2011 | |
| JP | 2013-50593 A | | 3/2013 | |
| JP | 2013050593 A | * | 3/2013 | ............... G02B 5/22 |
| JP | 2013-222027 A | | 10/2013 | |
| JP | 2014-179677 A | | 9/2014 | |
| TW | 201710362 A | | 3/2017 | |
| WO | WO 2007/007730 A1 | | 1/2007 | |
| WO | WO 2015/141618 A1 | | 9/2015 | |
| WO | WO 2016/114363 A1 | | 7/2016 | |

OTHER PUBLICATIONS

Japanese Office Action for corresponding Japanese Application No. 2019-543500, dated Mar. 2, 2021, with English translation.
International Preliminary Report on Patentability, dated Apr. 2, 2020, and Written Opinion of the International Searching Authority(Forms PCT/IB/326, PCT/IB/373 and PCT/ISA/237), dated Oct. 30, 2018, for International Application No. PCT/JP2018/031600, with an English Translation.
International Search Report, dated Oct. 30, 2018, for International Application No. PCT/JP2018/031600, with an English translation.
Office Action dated Dec. 6, 2021 for Taiwanese Patent Application No. 107131374, with partial English translation.

* cited by examiner

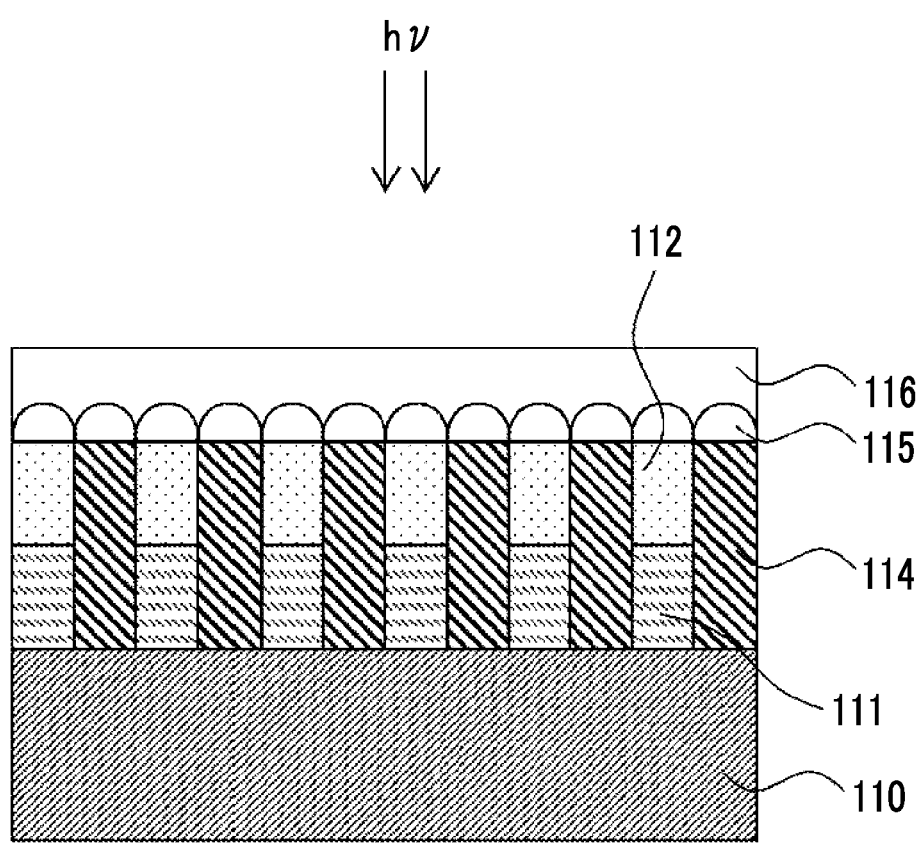

PATTERN-FORMING COMPOSITION, FILM, INFRARED CUT FILTER, INFRARED TRANSMITTING FILTER, SOLID IMAGE PICKUP ELEMENT, INFRARED SENSOR, AND CAMERA MODULE

CROSS-REFERENCE TO RELATED APPLICATIONS

This application is a continuation application of International Application No. PCT/JP2018/031600, filed Aug. 27, 2018, the disclosure of which is incorporated herein by reference in its entirety. Further, this application claims priority from Japanese Patent Application No. 2017-179153, filed Sep. 19, 2017, and Japanese Patent Application No. 2018-154670, filed Aug. 21, 2018, the disclosures of which are incorporated herein by reference in its entirety.

BACKGROUND OF THE INVENTION

1. Field of the Invention

The present disclosure relates to a pattern-forming composition, a film, an infrared cut filter, an infrared transmitting filter, a solid image pickup element, an infrared sensor, and a camera module.

2. Description of the Related Art

In a video camera, a digital still camera, a mobile phone with a camera function, or the like, a charge coupled device (CCD) or a complementary metal-oxide semiconductor (CMOS), which is a solid image pickup element for a color image, is used. In a light receiving section of this solid image pickup element, a silicon photodiode having sensitivity to infrared light is used. Therefore, visibility may be corrected using an infrared cut filter.

In addition, WO2016/114363A describes a near infrared cut filter including: an absorption layer; and a reflecting layer, in which the following requirements (1) to (3) are satisfied.

(1) An average transmittance (R) in a wavelength range of 620 to 750 nm is 20% or lower and an average transmittance (G) in a wavelength range of 495 to 570 nm is 90% or higher in a spectral transmittance curve at an incidence angle of 0°, and a ratio (R)/(G) between the average transmittances is 0.20 or less.

(2) A difference $|T_{0(600\text{-}725)}-T_{30(600\text{-}725)}|$ between an integral value $T_{0(600\text{-}725)}$ of transmittance in a wavelength range of 600 to 725 nm in the spectral transmittance curve at an incidence angle of 0°, and an integral value $T_{30(600\text{-}725)}$ of transmittance in a wavelength range of 600 to 725 nm in a spectral transmittance curve at an incidence angle of 30° is 3%·nm or less.

(3) The near-infrared cut filter has a wavelength $\lambda IR_{T(80)}$ at which a transmittance becomes 80%, a wavelength $\lambda IR_{T(50)}$ at which a transmittance becomes 50%, and a wavelength $\lambda IR_{T(20)}$ at which a transmittance becomes 20% in a wavelength range of 550 to 750 nm in a spectral transmittance curve at an incidence angle of 0° normalized by maximum transmittance in a wavelength range of 450 to 650 nm, and the wavelengths $\lambda IR_{T(80)}$, and $\lambda IR_{T(50)}$, and $\lambda IR_{T(20)}$ satisfy the following Expressions (a), (b), and (c), respectively.

$$0 \leq \lambda IR_{T(80)} - \lambda_{T(80)} \leq 30 \text{ nm} \quad (a)$$

$$0 \leq \lambda IR_{T(50)} - \lambda_{T(50)} \leq 35 \text{ nm} \quad (b)$$

$$0 \leq \lambda IR_{T(20)} - \lambda_{T(20)} \leq 37 \text{ nm} \quad (c)$$

(In the expressions, $\lambda_{T(80)}$, $\lambda_{T(50)}$, and $\lambda_{T(20)}$ represent wavelengths on a long wavelength side where relative visibility values of 0.8, 0.5, and 0.2 are exhibited in a relative visibility curve, respectively.)

Further, JP2013-050593A describes a near infrared cut filter including a glass substrate; and a near infrared reflection film that is provided on the glass substrate and includes an organic polymer layer and a dielectric multi-layer film.

SUMMARY OF THE INVENTION

In the related art, an infrared cut filter has been used as a flat film. Recently, it has also been considered to form a pattern on an infrared cut filter. For example, the use of a laminate in which each pixel (for example, a red pixel, a blue pixel, or a green pixel) of a color filter is formed on an infrared cut filter has been considered.

However, according to an investigation by the present inventors, the following was found. An infrared absorbing colorant used in an infrared cut filter or the like is likely to have low heat resistance (is thermally decomposed such that infrared absorption capacity deteriorates). On the other hand, a cured film having high heat resistance is likely to have poor pattern formability (the shape of the obtained pattern and development residue suppressing properties) such that a balance between heat resistance and pattern formability is not sufficient.

An object to be achieved by an embodiment of the present invention is to provide a pattern-forming composition having excellent development residue suppressing properties with which a pattern having an excellent shape and excellent heat resistance can be obtained.

In addition, another object that is achieved by another embodiment of the present invention is to provide a film that is formed using the pattern-forming composition, an infrared cut filter, an infrared transmitting filter, a solid image pickup element, an infrared sensor, and a camera module.

Means for achieving the objects include the following aspects.

<1> A pattern-forming composition, comprising:
an infrared absorbing colorant; and
at least one compound selected from the group consisting of a resin having a glass transition temperature of 150° C. to 300° C. and a precursor of a resin having a glass transition temperature of 150° C. to 300° C.

<2> The pattern-forming composition according to <1>,
in which the infrared absorbing colorant comprises at least one selected from the group consisting of a squarylium compound, a cyanine compound, a phthalocyanine compound, a pyrrolopyrrole compound, a perylene compound, a croconium compound, an oxonol compound, and an iminium compound.

<3> The pattern-forming composition according to <1> or <2>,
in which the at least one compound selected from the group consisting of a resin having a glass transition temperature of 150° C. to 300° C. and a precursor of a resin having a glass transition temperature of 150° C. to 300° C. comprises an acidic group or a group in which an acid group or a hydroxy group is protected with an acid-decomposable group.

<4> The pattern-forming composition according to any one of <1> to <3>,
in which the at least one compound selected from the group consisting of a resin having a glass transition temperature of 150° C. to 300° C. and a precursor of a resin having a glass transition temperature of 150° C. to 300° C. comprises at least one selected from the group consisting of a vinyl polymer, a polyimide precursor, and a polybenzoxazole precursor.

<5> The pattern-forming composition according to any one of <1> to <4>, further comprising:
a polymerizable compound; and
a photopolymerization initiator.

<6> The pattern-forming composition according to any one of <1> to <5>,
in which the resin comprises a resin comprising a constitutional unit represented by Formula 1.

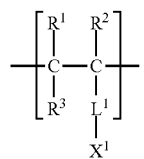

Formula 1

In Formula 1, each of $R^1$ to $R^3$ independently represents a hydrogen atom, an alkyl group, or a halogen atom, $L^1$ represents a single bond or a divalent linking group, and $X^1$ represents a carboxy group, a phenolic hydroxy group, or a sulfonamide group.

<7> The pattern-forming composition according to <6>,
in which the resin comprises a resin further comprising a constitutional unit represented by Formula 2.

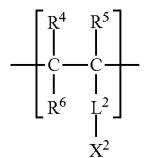

Formula 2

In Formula 2, each of $R^4$ to $R^6$ independently represents a hydrogen atom, an alkyl group, or a halogen atom, $L^2$ represents a single bond or a divalent linking group, and $X^2$ represents a (meth)acryloyloxy group, a vinyl group, a (meth)acrylamide group, a styryl group, or a maleimide group.

<8> The pattern-forming composition according to any one of <1> to <5>,
in which the precursor comprises a resin comprising a constitutional unit represented by Formula 3 or 4.

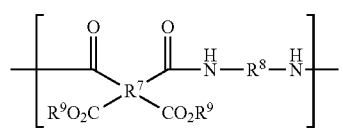

Formula 3

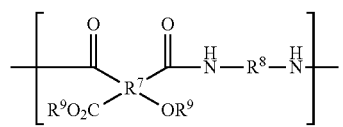

Formula 4

In Formulae 3 and 4, $R^7$ represents a tetravalent organic group, $R^8$ represents a divalent organic group, at least one of $R^7$ or $R^8$ in the precursor represents an organic group having an alicyclic group or a fluorine atom, each of $R^9$'s independently represents a hydrogen atom or an organic group, and at least one of $R^9$'s in the precursor represents a hydrogen atom and at least one of $R^9$'S in the precursor represents a polymerizable group.

<9> A film, formed by curing the pattern-forming composition according to any one of <1> to <8>.

<10> An infrared cut filter, comprising:
the film according to <9>.

<11> An infrared transmitting filter, comprising:
the film according to <9>.

<12> A solid image pickup element, comprising:
the film according to <9>.

<13> An infrared sensor, comprising:
the film according to <9>.

<14> A camera module, comprising:
a solid image pickup element; and
the infrared cut filter according to <10>.

According to one embodiment of the present invention, it is possible to provide a pattern-forming composition having excellent development residue suppressing properties with which a pattern having an excellent shape and excellent heat resistance can be obtained.

In addition, according to another embodiment of the present invention, it is possible to provide a film that is formed using the pattern-forming composition, an infrared cut filter, an infrared transmitting filter, a solid image pickup element, an infrared sensor, and a camera module.

BRIEF DESCRIPTION OF THE DRAWINGS

FIG. 1 is a schematic diagram showing an embodiment of an infrared sensor according to the present disclosure.

DESCRIPTION OF THE PREFERRED EMBODIMENTS

Hereinafter, the details of the present disclosure will be described.

In this specification, "total solid content" denotes the total mass of all the components of a composition excluding a solvent. In addition, "solid content" refers to a component excluding a solvent as described above and, for example, may be solid or liquid at 25° C.

In this specification, unless specified as a substituted group or as an unsubstituted group, a group (atomic group) denotes not only a group having no substituent but also a group having a substituent. For example, "alkyl group" denotes not only an alkyl group having no substituent (unsubstituted alkyl group) but also an alkyl group having a substituent (substituted alkyl group).

In this specification, unless specified otherwise, "exposure" denotes not only exposure using light but also drawing using a corpuscular beam such as an electron beam or an ion beam. Examples of the light generally used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In this specification, "(meth)acrylate" denotes either or both of acrylate and methacrylate, "(meth)acryl" denotes either or both of acryl and methacryl, and "(meth)acryloyl" denotes either or both of acryloyl and methacryloyl.

In this specification, in a chemical formula, Me represents a methyl group, Et represents an ethyl group, Pr represents a propyl group, Bu represents a butyl group, Ac represents an acetyl group, Bn represents a benzyl group, and Ph represents a phenyl group.

In this specification, the term "step" denotes not only an individual step but also a step which is not clearly distinguishable from another step as long as an effect expected from the step can be achieved.

In addition, in the present disclosure, "mass %" has the same definition as "wt %", and "part(s) by mass" has the same definition as "part(s) by weight".

Further, in the present disclosure, a combination of two or more preferable aspects is a more preferable aspect.

In addition, unless specified otherwise, a transmittance described in the present disclosure refers to a transmittance at 25° C.

In this specification, a weight-average molecular weight and a number-average molecular weight are defined as values in terms of polystyrene measured by gel permeation chromatography (GPC).

<Pattern-Forming Composition>

A pattern-forming composition according to an embodiment of the present disclosure (hereinafter, also referred to as "the composition according to the embodiment of the present disclosure") comprises: an infrared absorbing colorant; and at least one compound selected from the group consisting of a resin having a glass transition temperature of 150° C. to 300° C. and a precursor of a resin having a glass transition temperature of 150° C. to 300° C.

The pattern-forming composition according to the embodiment may be a negative type pattern-forming composition or a positive type pattern-forming composition. From the viewpoint of resolution ability, it is preferable that the pattern-forming composition according to the embodiment is a negative type pattern-forming composition.

As described above, an infrared absorbing colorant used in an infrared cut filter or the like has insufficient heat resistance and is thermally decomposed by heat such that infrared absorption capacity deteriorates. Therefore, a cured film obtained from a composition including the infrared absorbing colorant is likely to have insufficient heat resistance. On the other hand, in a case where a material having high heat resistance is used, pattern formability (the shape of the obtained pattern and development residue suppressing properties) is likely to be poor.

This way, the present inventors found that, in the composition including the infrared absorbing colorant in the related art, a balance between heat resistance and pattern formability is not sufficient and development residue suppressing properties is not sufficient.

As a result of the thorough investigation of the present inventors, it was found that, with the above-described configuration, a pattern-forming composition having excellent development residue suppressing properties with which a pattern having an excellent shape and excellent heat resistance can be obtained can be provided.

The action mechanism of the excellent effect is not clear but is presumed to be as follows.

By using at least one compound selected from the group consisting of a resin having a glass transition temperature of 150° C. to 300° C. and a precursor of a resin having a glass transition temperature of 150° C. to 300° C., the heat resistance of the obtained cured film itself is excellent, the thermal decomposition of the infrared absorbing colorant can also be suppressed, and development residue suppressing properties and pattern formability can be sufficiently secured. Therefore, a pattern-forming composition having excellent development residue suppressing properties with which a pattern having an excellent shape and excellent heat resistance can be obtained can be provided.

Hereinafter, each of the components of the composition according to the embodiment of the present disclosure will be described.

(At Least One Compound selected from Group consisting of Resin having Glass Transition Temperature of 150° C. to 300° C. and Precursor of Resin having Glass Transition Temperature of 150° C. To 300° C.)

The composition according to the embodiment of the present disclosure comprises: at least one compound (hereinafter, also referred to as "specific compound") selected from the group consisting of a resin having a glass transition temperature of 150° C. to 300° C. (hereinafter, also referred to as "specific resin") and a precursor of a resin having a glass transition temperature of 150° C. to 300° C. (hereinafter, also referred to as "specific precursor"; can also be referred to as "resin precursor with which a resin having a glass transition temperature of 150° C. to 300° C. can be obtained").

The glass transition temperature (Tg) of the specific resin is 150° C. to 300° C. and, from the viewpoints of pattern formability and the heat resistance of the obtained pattern, is preferably 150° C. to 250° C., more preferably 150° C. to 230° C., and still more preferably 160° C. to 220° C.

The glass transition temperature (Tg) of the resin obtained from the specific precursor is 150° C. to 300° C. and, from the viewpoints of pattern formability and the heat resistance of the obtained pattern, is preferably 180° C. to 290° C., more preferably 210° C. to 280° C., and still more preferably 240° C. to 270° C.

As the glass transition temperature (Tg) of the resin according to the embodiment of the present disclosure, measured Tg obtained by actual measurement can be applied. Specifically, as the measured Tg, a value measured using a differential scanning calorimeter (DSC) EXSTAR 6220 (manufactured by SII Nanotechnology Inc.) under typical measurement conditions can be used.

However, in a case where the measurement is difficult due to the decomposition of a polymer or the like, calculated Tg calculated from the following calculation expression is applied. The calculated Tg is calculated from the following Expression (T).

$$1/Tg = \Sigma(Xi/Tgi) \quad (T)$$

Here, it is assumed that a polymer to be calculated is obtained by copolymerization of n types monomer components (i=1 to n). Xi represents a weight fraction ($\Sigma Xi=1$) of an i-th monomer, and Tgi represents a glass transition temperature (absolute temperature) of a homopolymer of the i-th monomer. In this case, $\Sigma$ represents the sum of i=1 to n. As the value of the glass transition temperature of the homopolymer of each of the monomer, a value described in Polymer Handbook(3rd Edition) (J. Brandrup, E. H. Immergut, (Wiley-Interscience, 1989)) is adopted.

From the viewpoint of pattern formability, it is preferable that the specific compound is an acidic group or a group in which an acid group or a hydroxy group is protected with an acid-decomposable group.

In addition, in a case where the pattern-forming composition according to the embodiment of the present disclosure is a negative type composition, it is preferable that the pattern-forming composition includes an acidic group. In a case where the pattern-forming composition according to the embodiment of the present disclosure is a positive type composition, it is preferable that the pattern-forming composition includes a group in which an acid group or a hydroxy group is protected with an acid-decomposable group.

As the acidic group, from the viewpoint of pattern formability, for example, a carboxy group, a phenolic hydroxy group, a sulfo group, a sulfonamide group, a phosphonate group, or a phosphate group is preferable, a carboxy group, a phenolic hydroxy group, a sulfo group, or a sulfonamide group is more preferable, and a carboxy group, a phenolic hydroxy group, or a sulfonamide group is still more preferable, and a carboxy group is still more preferable.

As the acid group in the group in which an acid group or a hydroxy group is protected with an acid-decomposable group, from the viewpoint of pattern formability, for example, a carboxy group, a phenolic hydroxy group, a sulfo group, a phosphonate group, or a phosphate group is preferable, a carboxy group or a phenolic hydroxy group is more preferable, and a carboxy group is still more preferable.

In addition, as the hydroxy group in the group in which an acid group or a hydroxy group is protected with an acid-decomposable group, for example, a phenolic hydroxy group is preferable.

As the acid-decomposable group, from the viewpoints of sensitivity and pattern formability, at least one group selected from the group consisting of a tertiary alkyl group and an acetal type acid-decomposable group is preferable, and an acetal type acid-decomposable group is more preferable.

As the tertiary alkyl group, for example, a t-butyl group is preferable.

As the acetal type acid-decomposable group, a 1-alkoxyalkyl group, a 2-tetrahydrofuranyl group, or a 2-tetrahydropyranyl group is preferable.

As the specific compound, at least one selected from the group consisting of a vinyl polymer, a polyimide precursor, and a polybenzoxazole precursor is preferable from the viewpoints of heat resistance and pattern formability, and a vinyl polymer is more preferable from the viewpoint of pattern formability. In addition, from the viewpoint of heat resistance, at least one selected from the group consisting of a polyimide precursor and a polybenzoxazole precursor is more preferable.

In addition, as the specific resin, from the viewpoints of heat resistance and pattern formability, a vinyl polymer is preferable.

Further, as the specific precursor, at least one selected from the group consisting of a polyimide precursor and a polybenzoxazole precursor is preferable from the viewpoints of heat resistance and pattern formability.

In addition, from the viewpoint of heat resistance, it is preferable that the specific compound has an ethylenically unsaturated bond.

From the viewpoints of heat resistance and pattern formability, it is preferable that the specific compound has a nitrogen atom.

In addition, from the viewpoints of heat resistance and pattern formability, it is preferable that the specific compound has a ring structure, it is more preferable that the specific compound has a ring structure including a nitrogen atom, and it is still more preferable that the specific compound has an imide ring structure, a pyrrolidone structure, or a carbazole structure.

As the vinyl resin, from the viewpoints of heat resistance and pattern formability, a homopolymer or a copolymer of at least one compound selected from the group consisting of a (meth)acrylate compound, a (meth)acrylamide compound, a maleimide compound, a styrene compound, and an N-vinyl compound is preferable, a copolymer of two or more compounds selected from the group consisting of a (meth)acrylate compound, a (meth)acrylamide compound, a maleimide compound, a styrene compound, and an N-vinyl compound is more preferable, and a copolymer of two or more compounds selected from the group consisting of a (meth)acrylate compound, a maleimide compound, and an N-vinyl compound is still more preferable.

As the specific resin, from the viewpoints of heat resistance and pattern formability, a resin including a constitutional unit represented by Formula 1 is preferable.

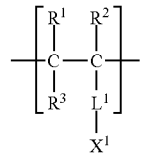

Formula 1

In Formula 1, $R^1$ to $R^3$ each independently represent a hydrogen atom, an alkyl group, or a halogen atom, $L^1$ represents a single bond or a divalent linking group, and $X^1$ represents a carboxy group, a phenolic hydroxy group, or a sulfonamide group.

It is preferable that $R^1$ represents a hydrogen atom.

$R^2$ represents preferably a hydrogen atom or an alkyl group, more preferably a hydrogen atom or a methyl group, and still more preferably a methyl group.

It is preferable that $R^3$ represents a hydrogen atom.

$L^1$ represents preferably a single bond, an alkylene group, or an arylene group, more preferably a single bond or a phenylene group, and still more preferably a single bond.

$X^1$ represents preferably a carboxy group or a phenolic hydroxy group and more preferably a carboxy group.

In addition, as the specific resin, from the viewpoints of heat resistance and pattern formability, a resin including a constitutional unit represented by Formula 2 is preferable, and a resin including a constitutional unit represented by Formula 1 and a constitutional unit represented by Formula 2 is more preferable.

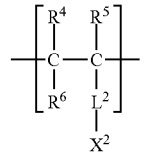

Formula 2

In Formula 2, $R^4$ to $R^6$ each independently represent a hydrogen atom, an alkyl group, or a halogen atom, $L^2$ represents a single bond or a divalent linking group, and $X^2$ represents a (meth)acryloyloxy group, a vinyl group, a (meth)acrylamide group, a styryl group ($—C_6H_4—CH=CH_2$), or a maleimide group.

It is preferable that $R^4$ represents a hydrogen atom.

$R^5$ represents preferably a hydrogen atom or an alkyl group, more preferably a hydrogen atom or a methyl group, and still more preferably a methyl group.

It is preferable that $R^6$ represents a hydrogen atom.

$L^2$ represents preferably a single bond, an alkylene group, an arylene group, or a group in which two or more structures selected from the group consisting of an alkylene group, an arylene group, an ester bond, and an ether bond are bonded, more preferably a single bond or a group in which two or more structures selected from the group consisting of an alkylene group, an arylene group, an ester bond, and an ether bond are bonded, and still more preferably a group in which two or more structures selected from the group consisting of an alkylene group, an ester bond, and an ether bond are bonded.

In addition, the alkylene group and the arylene group may have a substituent such as an alkyl group, an aryl group, a hydroxy group, an alkoxy group, or a halogen atom.

$X^2$ represents preferably a (meth)acryloyloxy group, a vinyl group, or a (meth)acrylamide group, and more preferably a (meth)acryloyloxy group or a vinyl group.

As the specific precursor, from the viewpoints of heat resistance and pattern formability, a resin including a constitutional unit represented by Formula 3 or 4 is preferable, and a resin including a constitutional unit represented by Formula 3 is more preferable.

The resin including a constitutional unit represented by Formula 3 forms polyimide by cyclization due to heat or the like.

In addition, the resin including a constitutional unit represented by Formula 4 forms polybenzoxazole by cyclization due to heat or the like.

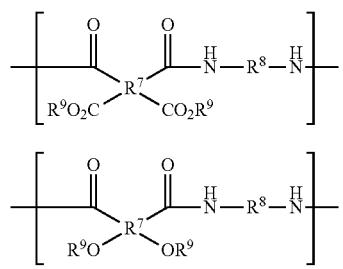

Formula 3

Formula 4

In Formulae 3 and 4, $R^7$ represents a tetravalent organic group, $R^8$ represents a divalent organic group, at least one of $R^7$ or $R^8$ in the precursor represents an organic group having an alicyclic group or a fluorine atom, $R^9$'s each independently represent a hydrogen atom or an organic group, and at least one of $R^9$'s in the precursor represents a hydrogen atom and at least one of $R^9$'s in the precursor represents a polymerizable group.

It is preferable that the tetravalent organic group represented by $R^7$ is a tetravalent organic group having a fluorine atom.

In addition, the number of carbon atoms in the tetravalent organic group represented by $R^7$ is preferably 6 to 40, more preferably 6 to 30, and still more preferably 12 to 20.

The tetravalent organic group represented by $R^7$ may be an aliphatic hydrocarbon group or an aromatic hydrocarbon group and may be a group including a combination of two or more selected from the group consisting of an aliphatic hydrocarbon group, an aromatic hydrocarbon group, and an ether bond. Among these, a tetravalent group an alicyclic structure, a bisphenol structure (a structure obtained by removing two phenolic hydroxy groups from a bisphenol compound), or a biphenyl structure is preferable, a tetravalent group having a bisphenol structure or a biphenyl structure is more preferable, a tetravalent group having a bisphenol structure is still more preferable, and a tetravalent group having a bisphenol AF structure is still more preferable.

As $R^7$, for example, the following group is preferable. A wave line portion represents a binding site to a carbonyl group or an oxygen atom.

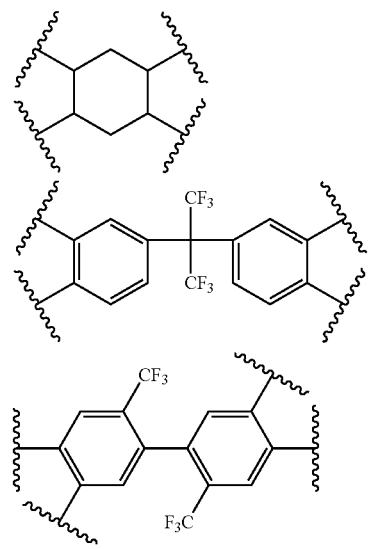

It is preferable that the divalent organic group represented by $R^8$ is a divalent organic group having a fluorine atom.

In addition, the number of carbon atoms in the divalent organic group represented by $R^8$ is preferably 6 to 40 and more preferably 12 to 30.

The divalent organic group represented by $R^8$ may be an aliphatic hydrocarbon group or an aromatic hydrocarbon group and may be a group including a combination of two or more selected from the group consisting of an aliphatic hydrocarbon group, an aromatic hydrocarbon group, and an ether bond. Among these, a divalent group an alicyclic structure, a bisphenol structure (a structure obtained by removing two phenolic hydroxy groups from a bisphenol compound), or a biphenyl structure is preferable, a divalent group having a bisphenol structure or a biphenyl structure is more preferable, and a divalent group having a bisphenol structure is still more preferable.

As $R^8$, for example, the following group is preferable. A wave line portion represents a binding site to a nitrogen atom.

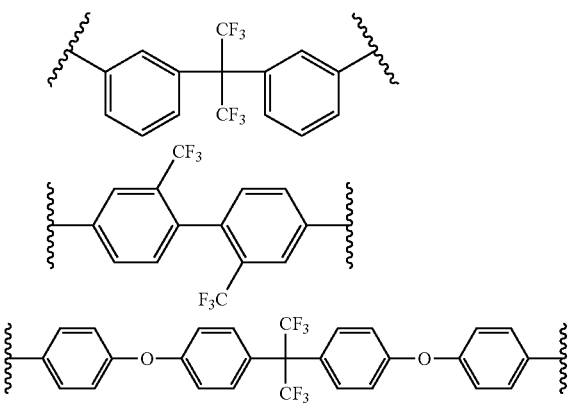

$R^9$'s each independently represent preferably a hydrogen atom or a group having an ethylenically unsaturated group, more preferably a hydrogen atom or a group having a (meth)acryloyloxy group, and still more preferably a hydrogen atom or a (meth)acryloyloxy ethyl group.

In addition, as the specific resin, from the viewpoints of heat resistance and pattern formability, a resin including a constitutional unit represented by Formula 5 or 6 is preferable, a resin including a constitutional unit represented by Formula 5 is more preferable, and a resin including a constitutional unit represented by Formula 5 and a constitutional unit represented by Formula 6 is still more preferable.

As the acetal type acid-decomposable group, a 1-alkoxyalkyl group, a 2-tetrahydrofuranyl group, or a 2-tetrahydropyranyl group is preferable.

$X^4$ represents preferably an epoxy group or an oxetanyl group and more preferably an epoxy group.

As the specific precursor, from the viewpoints of heat resistance and pattern formability, a resin including a constitutional unit represented by Formula 7 or 8 is preferable, and a resin including a constitutional unit represented by Formula 7 is more preferable.

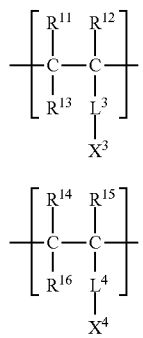

Expression 5

Expression 6

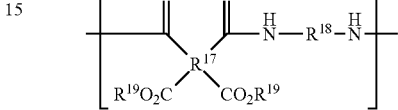

Formula 7

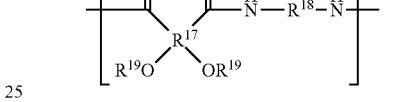

Formula 8

In Formulae 5 and 6, $R^{11}$ to $R^{16}$ each independently represent a hydrogen atom, an alkyl group, or a halogen atom, $L^3$ and $L^4$ each independently represent a single bond or a divalent linking group, $X^3$ represents a group in which an acid group or a hydroxy group is protected with an acid-decomposable group, and $X^4$ represents an epoxy group, an oxetanyl group, a methylol group, or an alkoxymethylol group.

It is preferable that $R^{11}$, $R^{13}$, $R^{14}$, and $R^{16}$ represent a hydrogen atom.

$R^{12}$ and $R^{15}$ each independently represent preferably a hydrogen atom or an alkyl group, more preferably a hydrogen atom or a methyl group, and still more preferably a methyl group.

$L^3$ and $L^4$ each independently represent preferably a single bond, an alkylene group, an arylene group, or a group in which two or more structures selected from the group consisting of an alkylene group, an arylene group, an ester bond, and an ether bond are bonded, and more preferably a single bond or a group in which two or more structures selected from the group consisting of an alkylene group, an arylene group, an ester bond, and an ether bond are bonded.

As the acid group in the group in which an acid group or a hydroxy group is protected with an acid-decomposable group represented by $X^3$, from the viewpoint of pattern formability, for example, a carboxy group, a phenolic hydroxy group, a sulfo group, a phosphonate group, or a phosphate group is preferable, a carboxy group or a phenolic hydroxy group is more preferable, and a carboxy group is still more preferable.

In addition, as the acid-decomposable group in the group in which an acid group or a hydroxy group is protected with an acid-decomposable group represented by $X^3$, at least one group selected from the group consisting of a tertiary alkyl group and an acetal type acid-decomposable group is preferable, and an acetal type acid-decomposable group is more preferable.

As the tertiary alkyl group, for example, a t-butyl group is preferable.

In Formulae 7 and 8, $R^{17}$ represents a tetravalent organic group, $R^{18}$ represents a divalent organic group, at least one of $R^{17}$ or $R^{18}$ in the precursor represents an alicyclic group or a divalent organic group having a fluorine atom, $R^{19}$'s each independently represent a hydrogen atom or an organic group, and at least one of $R^{19}$'s in the precursor represents a group that is decomposed by the action of an acid to produce an alkali-soluble group.

Preferable aspects of $R^{17}$ and $R^{18}$ are the same as those of $R^7$ and $R^8$, respectively.

$R^{19}$ represents preferably a group that is decomposed by the action of a hydrogen atom or an acid to produce an alkali-soluble group and more preferably a hydrogen atom or an acid-decomposable group.

The acid-decomposable group has the same definition and the same preferable aspect as the above-described acid-decomposable group.

From the viewpoints of development residue and pattern formability, the acid value of the specific compound is preferably 30 mgKOH/g to 300 mgKOH/g, more preferably 40 mgKOH/g to 250 mgKOH/g, and still more preferably 50 mgKOH/g to 200 mgKOH/g.

In a case where the specific compound includes an ethylenically unsaturated bond, a C═C value (iodine value) in the specific compound is preferably 0.1 mmol/g to 3.0 mmol/g, more preferably 0.2 mmol/g to 2.0 mmol/g, and still more preferably 0.3 mmol/g to 1.0 mmol/g.

The acid value and the iodine value of the compound according to the embodiment of the present disclosure are measured using a measurement method based on JIS K 0070 (1992). The iodine value (C═C value) in the present disclosure refers to the molar amount of an ethylenically unsaturated bond obtained by measurement of the iodine value based on JIS K 0070 (1992) per 1 g of the compound.

From the viewpoints of heat resistance and pattern formability, the weight-average molecular weight (Mw) of the specific compound is preferably 3,000 to 100,000, more preferably 4,000 to 50,000, and still more preferably 5,000 to 30,000.

From the viewpoints of heat resistance and pattern formability, the content of the specific compound is preferably 10 mass % to 90 mass %, more preferably 20 mass % to 80 mass %, and still more preferably 30 mass % to 70 mass % with respect to the total solid content of the pattern-forming composition.

The composition according to the embodiment of the present disclosure may include one specific compound or two or more specific compounds. In a case where the composition includes two or more specific compounds, it is preferable that the total content of the specific compounds is in the above-described range.

(Infrared Absorbing Colorant)

The composition according to the embodiment of the present disclosure comprises an infrared absorbing colorant.

The infrared absorbing colorant may be a material that absorbs infrared light or a material that reflects infrared light. As the material that absorbs infrared light, a compound having an absorption in a wavelength range of 700 nm to 2,000 nm is preferable, and a compound having a maximum absorption wavelength in a wavelength range of 700 nm to 2,000 nm is more preferable.

As the infrared absorbing colorant, from the viewpoint of heat resistance, at least one selected from the group consisting of a diiminium compound, a squarylium compound, a cyanine compound, a phthalocyanine compound, a naphthalocyanine compound, a quaterrylene compound, an aminium compound, an iminium compound, an azo compound, an anthraquinone compound, a porphyrin compound, a pyrrolopyrrole compound, an oxonol compound, a croconium compound, a hexaphyrin compound, a metal dithiol compound, a copper compound, a tungsten compound, and a metal boride is preferable, at least one selected from the group consisting of a squarylium compound, a cyanine compound, a phthalocyanine compound, a pyrrolopyrrole compound, a perylene compound, a croconium compound, an oxonol compound, and an iminium compound is more preferable, a squarylium compound, a cyanine compound, a phthalocyanine compound, or a pyrrolopyrrole compound is still more preferable, and a squarylium compound or a pyrrolopyrrole compound is still more preferable.

As the pyrrolopyrrole compound, a compound represented by Formula (PP) is preferable.

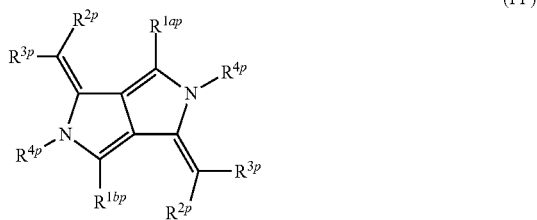

(PP)

In the formula, $R^{1ap}$ and $R^{1bp}$ each independently represent an alkyl group, an aryl group, or a heteroaryl group, $R^{2p}$ and $R^{3p}$ each independently represent a hydrogen atom or a substituent, $R^{2p}$ and $R^{3p}$ may be bonded to each other to form a ring, $R^{4p}$'s each independently represent a hydrogen atom, an alkyl group, an aryl group, a heteroaryl group, $-BR^{4Ap}R^{4Bp}$, or a metal atom, $R^{4p}$ may form a covalent bond or a coordinate bond with at least one selected from the group consisting of $R^{1ap}$, $R^{1bp}$, and $R^{3p}$, and $R^{4Ap}$ and $R^{4Bp}$ each independently represent a substituent. The details of Formula (PP) can be found in paragraphs "0017" to "0047" of JP2009-263614A, paragraphs "0011" to "0036" of JP2011-068731A, and paragraphs "0010" to "0024" of WO2015/166873A, the contents of which are incorporated herein by reference.

$R^{1ap}$ and $R^{1bp}$ each independently represent preferably an aryl group or a heteroaryl group, and more preferably an aryl group. In addition, the alkyl group, the aryl group, and the heteroaryl group represented by $R^{1ap}$ to $R^{1bp}$ may have a substituent or may be unsubstituted. Examples of the substituent include an alkoxy group, a hydroxy group, a halogen atom, a cyano group, a nitro group, $-OCOR^{11p}$, $-SOR^{12p}$, and $-SO_2R^{13p}$. $R^{11p}$ to $R^{13p}$ each independently represent a hydrocarbon group or a heteroaryl group. In addition, examples of the substituent include substituents described in paragraphs "0020" to "0022" of 2009-263614A. Among these, as the substituent, an alkoxy group, a hydroxy group, a cyano group, a nitro group, $-OCOR^{11p}$, $-SOR^{12p}$, or $-SO_2R^{13}$ is preferable. As the group represented by $R^{1ap}$ and $R^{1bp}$, an aryl group which has an alkoxy group having a branched alkyl group as a substituent, an aryl group which has a hydroxy group as a substituent, or an aryl group which has a group represented by $-OCOR^{11p}$ as a substituent is preferable. The number of carbon atoms in the branched alkyl group is preferably 3 to 30 and more preferably 3 to 20.

It is preferable that at least one of $R^{2p}$ or $R^{3p}$ represents an electron-withdrawing group, and it is more preferable that $R^{2p}$ represents an electron-withdrawing group (preferably a cyano group) and $R^{3p}$ represents a heteroaryl group. It is preferable that the heteroaryl group is a 5- or 6-membered ring. The heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the heteroaryl group is preferably 1 to 3 and more preferably 1 or 2. Examples of the heteroatom include a nitrogen atom, an oxygen atom, and a sulfur atom. It is preferable that the heteroaryl group has one or more nitrogen atoms. Two $R^{2p}$'s in Formula (PP) may be the same as or different from each other. In addition, two $R^{3p}$'s in Formula (PP) may be the same as or different from each other.

$R^{4p}$ represents preferably a hydrogen atom, an alkyl group, an aryl group, a heteroaryl group, or a group represented by $-BR^{4Ap}R^{4Bp}$, more preferably a hydrogen atom, an alkyl group, an aryl group, or a group represented by $-BR^{4Ap}R^{4Bp}$, and still more preferably a group represented by $-BR^{4Ap}R^{4Bp}$. As the substituent represented by $R^{4Ap}$ and $R^{4Bp}$, a halogen atom, an alkyl group, an alkoxy group, an aryl group, or a heteroaryl group is preferable, an alkyl group, an aryl group, or a heteroaryl group is more preferable, and an aryl group is still more preferable. Each of the groups may further have a substituent. Two $R^{4p}$'s in Formula (PP) may be the same as or different from each other.

Specific examples of the compound represented by Formula (PP) include the following compounds. In the following structural formulae, Me represents a methyl group, and Ph represents a phenyl group. In addition, examples of the pyrrolopyrrole compound include compounds described in paragraphs "0016" to "0058" of JP2009-263614A, paragraphs "0037" to "0052" of JP2011-068731A, paragraphs "0014" to "0027" of JP2014-130343A, paragraphs "0010" to "0033" of WO2015/166873A, the contents of which are incorporated herein by reference.

(A-10)
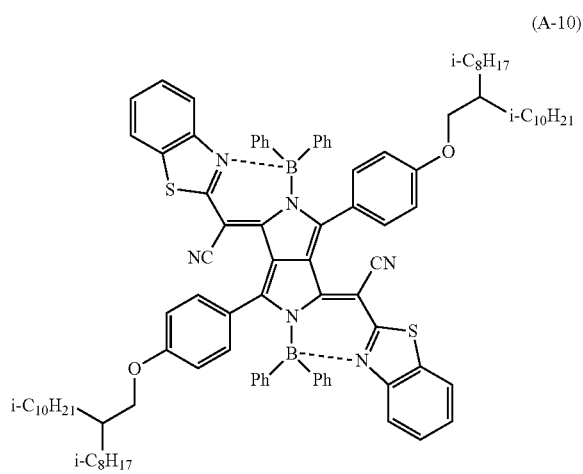

(A-11)
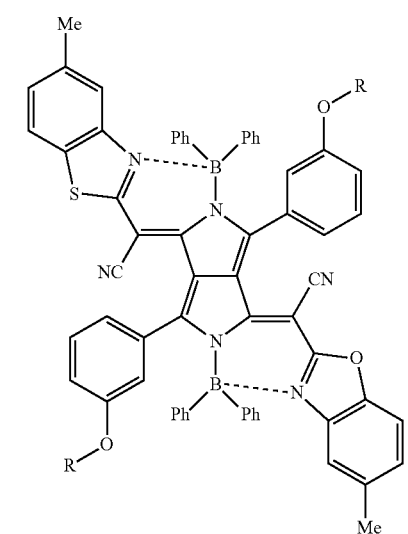

(A-12)
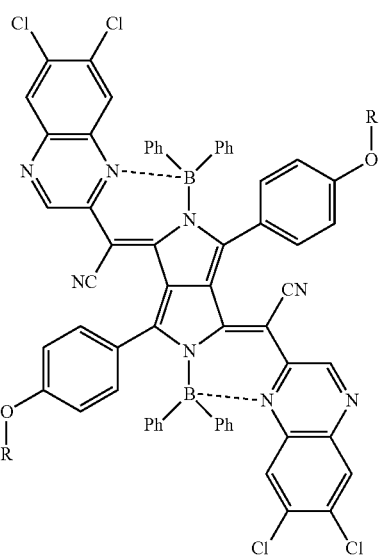

R = 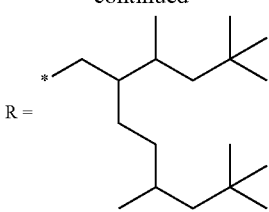

(A-16)
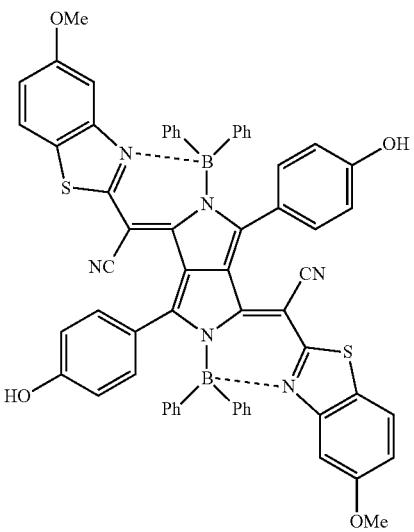

As the squarylium compound, a compound represented by the following Formula (SQ) is preferable.

(SQ)
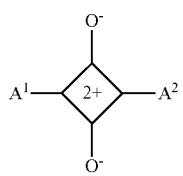

In Formula (SQ), $A^1$ and $A^2$ each independently represent an aryl group, a heteroaryl group, or a group represented by Formula (A-1).

(A-1)
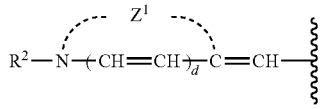

In Formula (A-1), $Z^1$ represents a non-metal atomic group for forming a nitrogen-containing heterocycle, $R^2$ represents an alkyl group, an alkenyl group, or an aralkyl group, d represents 0 or 1, and a wave line represents a direct bond. The details of Formula (SQ) can be found in paragraphs "0020" to "0049" of JP2011-208101A, the content of which is incorporated herein by reference.

As shown below, cations in Formula (SQ) are present without being localized.

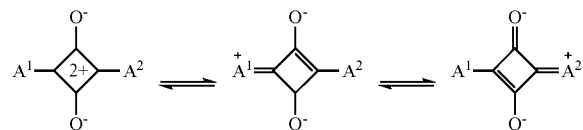

In addition, other examples of the squarylium compound include compounds described in JP3094037B, JP1985-228448A (JP-S60-228448A), JP1989-146846A (JP-H1-146846A), JP1989-228960A (JP-H1-228960A), paragraph "0178" of JP2012-215806A, and paragraphs "0044" to "0049" of JP2011-208101A, the contents of which are incorporated herein by reference.

As the cyanine compound, a compound represented by Formula (C) is preferable. Formula (C)

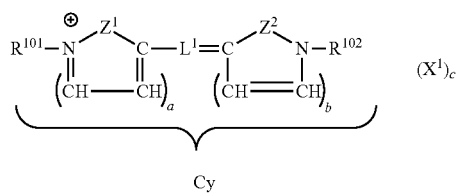

In the formula, $Z^1$ and $Z^2$ each independently represent a non-metal atomic group for forming a 5-membered or 6-membered nitrogen-containing heterocycle which may be fused.

$R^{101}$ and $R^{102}$ each independently represent an alkyl group, an alkenyl group, an alkynyl group, an aralkyl group, or an aryl group.

$L^1$ represents a methine chain including an odd number of methine groups.

a and b each independently represent 0 or 1.

In a case where a represents 0, a carbon atom and a nitrogen atom are bonded through a double bond. In a case where b represents 0, a carbon atom and a nitrogen atom are bonded through a single bond.

In a case where a site represented by Cy in the formula is a cation site, $X^1$ represents an anion, and c represents the number of $X^1$'s for balancing charge. In a case where a site represented by Cy in the formula is an anion site, $X^1$ represents a cation, and c represents the number of $X^1$'s for balancing charge. In a case where charge of a site represented by Cy in the formula is neutralized in a molecule, c represents 0.

Examples of the cyanine compound include compounds described in paragraphs "0026" to "0030" of JP2002-194040A, paragraphs "0041" and "0042" of JP2007-271745A, paragraphs "0016" and "0018" of JP2007-334325A, JP2008-088426A, paragraphs "0044" and "0045" of JP2009-108267A, JP2009-185161A, JP2009-191213A, paragraph "0160" of JP2012-215806A, paragraphs "0047" to "0049" of JP2013-155353A, JP2015-172004A, and JP2015-172102A, the contents of which are incorporated herein by reference. Examples of a commercially available product of the cyanine compound include Daito chmix 1371F (manufactured by Daito Chemix Co., Ltd.) and NK series such as NK-3212 or NK-5060 (manufactured by Hayashibara Co., Ltd.).

As the copper compound, a copper complex is preferable. It is preferable that the copper complex is a complex of copper and a compound (ligand) having a coordination site coordinated to copper. Examples of the coordination site coordinated to copper include a coordination site coordinated by an anion and a coordinating atom coordinated by an unshared electron pair. The copper complex may include two or more ligands. In a case where the copper complex includes two or more ligands, the ligands may be the same as or different from each other. The copper complex may be tetradentate-coordinated, pentadentate-coordinated, or hexadentate-coordinated, more preferably tetradentate-coordinated or pentadentate-coordinated, and still more preferably pentadentate-coordinated. In addition, in the copper complex, it is preferable that copper and the ligand form a 5-membered ring and/or a 6-membered ring. This copper complex is stable in shape and has excellent complex stability.

As the copper compound, for example, a copper complex represented by the following Formula (Cu-1) can be used. This copper complex is a copper compound in which a ligand L is coordinated to copper as central metal, and the copper is typically divalent copper. For example, the copper complex can be obtained, for example, by mixing, reaction, or the like of a compound which forms the ligand L or a salt thereof with a copper component.

$$Cu(L)_{n1} \cdot (X)_{n2} \quad \text{Formula (Cu-1)}$$

In the formula, L represents a ligand coordinated to copper, and X represents a counter ion. n1 represents an integer of 1 to 4. n2 represents an integer of 0 to 4.

X represents a counter ion. The copper compound may be a neutral complex having no charge, a cationic complex, or an anionic complex. In this case, optionally, a counter ion is present to neutralize the charge of the copper compound.

L represents a ligand coordinated to copper. Examples of the ligand coordinated to copper include a compound having a coordination site coordinated to copper. For example, a compound having one or more selected from a coordination site coordinated to copper by an anion or a coordinating atom coordinated to copper by an unshared electron pair can be used. The coordination site coordinated by an anion may or may not be dissociable. As the ligand L, a compound (multidentate ligand) having two or more coordination sites coordinated to copper is preferable. In addition, in order to improve visible transparency, it is preferable that a plurality of π-conjugated systems such as aromatic compounds are not continuously bonded to each other in the ligand L. As the ligand L, a compound (monodentate ligand) having one coordination site coordinated to copper and a compound (multidentate ligand) having two or more coordination sites coordinated to copper can also be used in combination. Examples of the monodentate ligand include a compound having one coordination site coordinated to copper by an anion or one coordinating atom coordinated to copper by an unshared electron pair.

As the anion in the ligand L, an oxygen anion, a nitrogen anion, or a sulfur anion is preferable. As the coordinating atom coordinated by an unshared electron pair in the ligand L, an oxygen atom, a nitrogen atom, a sulfur atom, or a phosphorus atom is preferable, an oxygen atom, a nitrogen atom, or a sulfur atom is more preferable, an oxygen atom or a nitrogen atom is still more preferable, and a nitrogen atom is still more preferable. In a case where the coordinating atom coordinated by an unshared electron pair is a nitrogen atom, that an atom adjacent to the nitrogen atom is preferably a carbon atom or a nitrogen atom and more preferably a carbon atom. In addition, the coordinating atom coordinated by an unshared electron pair may be included in a ring. In a case where the coordinating atom coordinated by an unshared electron pair is included in a ring, the ring including the coordinating atom coordinated by an unshared electron pair may be monocyclic or polycyclic and may be aromatic or nonaromatic. The ring including the coordinating atom coordinated by an unshared electron pair is preferably a 5- to 12-membered ring and more preferably a 5- to 7-membered ring. In addition, as the ligand L, for example, a phosphate compound or a sulfonic acid compound can also be used. The details of the ligand can be found in, for example, paragraphs "0022" to "0042" of JP2014-041318A, paragraphs "0021" to "0039" of JP2015-043063A, and paragraphs "0013" to "0070" of JP2016-006476A, the contents of which are incorporated herein by reference. In addition, specific examples of the copper compound include compounds described in JP2013-253224A, JP2014-032380A, JP2014-026070A, JP2014-026178A, JP2014-139616A, JP2014-139617A, JP2014-041318A, JP2015-043063A, and JP2016-006476A, the contents of which are incorporated herein by reference.

Examples of the diiminium compound include compounds described in JP1989-113482A (JP-H1-113482A), JP1998-180922A (JP-H10-180922A), WO2003/005076A, WO2004/048480A, WO2005/044782A, WO2006/120888A, JP2007-246464A, WO2007/148595A, JP2011-038007A, and paragraph "0118" of WO2011/118171A, the contents of which are incorporated herein by reference. Examples of a commercially available product of the diiminium compound include: EPOLIGHT series such as EPOLIGHT 1178 (manufactured by Epolin Inc.); CIR-108X series such as CIR-1085 and CIR-96X series (manufactured by Japan Carlit Co., Ltd.); and IRG 022, IRG 023, and PDC-220 (manufactured by Nippon Kayaku Co., Ltd.). Examples of the phthalocyanine compound include compounds described in JP1985-224589A (JP-S60-224589A), JP2005-537319A, JP1992-023868A (JP-H4-023868A), JP1992-039361A (JP-H4-039361A), JP1993-078364A (JP-H5-078364A), JP1993-222047A (JP-H5-222047A), JP1993-222301A (JP-H5-222301A), JP1993-222302A (JP-H5-222302A), JP1993-345861A (JP-H5-345861A), JP1994-025548A (JP-H6-025548A), JP1994-107663A (JP-H6-107663A), JP1994-192584A (JP-H6-192584A), JP1994-228533A (JP-H6-228533A), JP1995-118551A (JP-H7-118551A), JP1995-118552A (JP-H7-118552A), JP1996-120186A (JP-H8-120186A), JP1996-225751A (JP-H8-225751A), JP1997-202860A (JP-H9-202860A), JP1998-120927A (JP-H10-120927A), JP1998-182995A (JP-H10-182995A), JP1999-035838A (JP-H11-035838A), JP2000-026748A, JP2000-063691A, JP2001-106689A, JP2004-018561A, JP2005-220060A, JP2007-169343A, and paragraphs "0026" and "0027" of JP2013-195480A, the contents of which are incorporated herein by reference. Examples of a commercially available product of the phthalocyanine compound include: FB series such as FB-22 or FB-24 (manufactured by Yamada Chemical Co., Ltd.); Excolor series such as Excolor TX-EX720 or Excolor 708K (manufactured by Nippon Shokubai Co., Ltd.); Lumogen IR788 (manufactured by BASF SE); ABS643, ABS654, ABS667, ABS670T, IRA693N, and IRA735 (manufactured by Exciton Inc.); SDA3598, SDA6075, SDA8030, SDA8303, SDA8470, SDA3039, SDA3040, SDA3922, and SDA7257 (manufactured by H. W. Sands Corporation); and TAP-15 and IR-706 (manufactured by Yamada Chemical Co., Ltd.). Examples of the naphthalocyanine compound include compounds described in JP1999-152413A (JP-H11-152413A), JP1999-152414A (JP-H11-152414A), JP1999-152415A (JP-H11-152415A), and paragraphs "0046" to "0049" of JP2009-215542A, the contents of which are incorporated herein by reference. Examples of the quaterrylene compound include a compound described in paragraph "0021" of JP2008-009206A, the contents of which are incorporated herein by reference. Examples of a commercially available product of the quaterrylene compound include Lumogen IR765 (manufactured by BASF SE). Examples of the aminium compound include compounds described in paragraph "0018" of JP1996-027371A (JP-H8-027371A) and JP2007-039343A, the contents of which are incorporated herein by reference. Examples of a commercially available product of the aminium compound include IRG002 and IRG003 (manufactured by Nippon Kayaku Co., Ltd.). Examples of the iminium compound include compounds described in paragraph "0116" of WO2011/118171A, the content of which is incorporated herein by reference. Examples of the azo compound include a compound described in paragraphs "0114" to "0117" of JP2012-215806A, the content of which is incorporated herein by reference. Examples of the anthraquinone compound include a compound described in paragraphs "0128" and "0129" of JP2012-215806A, the content of which is incorporated herein by reference. Examples of the porphyrin compound include a compound represented by Formula (1) described in JP3834479B, the content of which is incorporated herein by reference. Examples of the oxonol compound include a compound described in paragraph "0046" of JP2007-271745A, the content of which is incorporated herein by reference. Examples of the croconium compound include compounds described in paragraph "0049" of JP2007-271745A, JP2007-031644A, and JP2007-169315A, the contents of which are incorporated herein by reference. Examples of the hexaphyrin compound include a compound represented by Formula (1) described in WO2002/016144A, the content of which is incorporated herein by reference. Examples of the metal dithiol compound include compounds described in JP1989-114801A (JP-H1-114801A), JP1989-074272A (JP-S64-074272A), JP1987-039682A (JP-S62-039682A), JP1986-080106A (JP-S61-080106A), JP1986-042585A (JP-S61-042585A), and JP1986-032003A (JP-S61-032003A), the contents of which are incorporated herein by reference. As the tungsten compound, a tungsten oxide compound is preferable, cesium tungsten oxide or rubidium tungsten oxide is more preferable, and cesium tungsten oxide is still more preferable. Examples of a compositional formula of cesium tungsten oxide include $Cs_{0.33}WO_3$. In addition, examples of a compositional formula of rubidium tungsten oxide include $Rb_{0.33}WO_3$. The tungsten oxide compound is also available in the form of, for example, a dispersion of tungsten particles such as YMF-02A (manufactured by Sumitomo Metal Mining Co., Ltd.). Examples of the metal boride include a compound described in paragraph "0049" of JP2012-068418A, the content of which is incorporated herein by reference. In particular, lanthanum boride is preferable.

In addition, the infrared absorbing colorant may be a derivative (hereinafter, also referred to as "pigment derivative") in which a substituent is introduced into the infrared absorbing colorant.

As the pigment derivative, a compound having a structure in which a portion of a colorant is substituted with an acidic group, a basic group, or a group having a salt structure is preferable, and a pigment derivative represented by the following Formula (3D) is more preferable. In the pigment derivative represented by the following Formula (3D), a colorant structure $P^{3D}$ is likely to adsorb to a surface of the infrared absorbing colorant other than the pigment derivative. Therefore, the dispersibility of the infrared absorbing colorant in the composition can be improved. In addition, in a case where the composition includes a resin, a terminal portion $X^{3D}$ of the pigment derivative adsorbs to the resin due to an interaction with an adsorption portion (for example, a polar group) of the resin. Therefore, the dispersibility of the infrared absorbing colorant can be further improved.

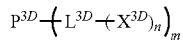  (3D)

In Formula (3D), $P^{3D}$ represents a colorant structure, $L^{3D}$'s each independently represent a single bond or a linking group, $X^{3D}$'S each independently represent an acidic group, a basic group, or a group having a salt structure, m represents an integer of 1 or more, and n represents an integer of 1 or more.

As the colorant structure represented by $P^{3D}$, from the viewpoints of infrared shielding properties and heat resistance, at least one selected from the group consisting of a pyrrolopyrrole colorant structure, a squarylium colorant structure, a diketo pyrrolopyrrole colorant structure, a quinacridone colorant structure, an anthraquinone colorant structure, a dianthraquinone colorant structure, a benzoisoindole colorant structure, a thiazine indigo colorant structure, an azo colorant structure, a quinophthalone colorant structure, a cyanine colorant structure, a phthalocyanine colorant structure, a dioxazine colorant structure, a perylene colorant structure, a perinone colorant structure, a benzimidazolinone colorant structure, a croconium colorant structure, an oxonol colorant structure, and an iminium colorant structure is preferable, at least one selected from the group consisting of a squarylium colorant structure, a cyanine colorant structure, a phthalocyanine colorant structure, a pyrrolopyrrole colorant structure, a perylene colorant structure, a croconium colorant structure, an oxonol colorant structure, and an iminium colorant structure is more preferable, and at least one selected from the group consisting of a squarylium colorant structure and a pyrrolopyrrole colorant structure is still more preferable.

The linking group represented by $L^{3D}$ is preferably a group composed of 1 to 100 carbon atoms, 0 to 10 nitrogen atoms, 0 to 50 oxygen atoms, 1 to 200 hydrogen atoms, and 0 to 20 sulfur atoms, and may be unsubstituted or may further have a substituent. As the substituent, an alkyl group, an aryl group, a hydroxy group, or a halogen atom is preferable.

The linking group is preferably an alkylene group, an arylene group, a nitrogen-containing heterocyclic group, —NR'—, —SO$_2$—, —S—, —O—, —CO—, —COO—, —CONR—, or a group including a combination of two or more of the above-described groups and more preferably an alkylene group, an arylene group, —SO$_2$—, —COO—, or a group including a combination of two or more of the above-described groups. R' represents a hydrogen atom, an alkyl group (preferably having 1 to 30 carbon atoms) or an aryl group (preferably 6 to 30 carbon atoms).

The number of carbon atoms in the alkylene group is preferably 1 to 30, more preferably 1 to 15, and still more preferably 1 to 10. The alkylene group may have a substituent. The alkylene group may be linear, branched, or cyclic. In addition, the cyclic alkylene group may be monocyclic or polycyclic.

As the arylene group, an arylene group having 6 to 18 carbon atoms is preferable, an arylene group having 6 to 14 carbon atoms is more preferable, an arylene group having 6 to 10 carbon atoms is still more preferable, and a phenylene group is even still more preferable.

It is preferable that the nitrogen-containing heterocyclic group is a 5-membered or 6-membered ring. The nitrogen-containing heterocyclic group is preferably a monocycle or a fused ring, more preferably a monocycle or a fused ring composed of 2 to 8 rings, and still more preferably a monocycle or a fused ring composed of 2 to 4 rings. The number of nitrogen atoms in the nitrogen-containing heterocyclic group is preferably 1 to 3 and more preferably 1 or 2. The nitrogen-containing heterocyclic group may include a heteroatom other than a nitrogen atom. Examples of the heteroatom other than a nitrogen atom include an oxygen atom and a sulfur atom. The number of heteroatoms other than a nitrogen atom is preferably 0 to 3 and more preferably 0 or 1.

Examples of the nitrogen-containing heterocyclic group include a piperazine ring group, a pyrrolidine ring group, a pyrrole ring group, a piperidine ring group, a pyridine ring group, an imidazole ring group, a pyrazole ring group, an oxazole ring group, a thiazole ring group, a pyrazine ring group, a morpholine ring group, a thiazine ring group, an indole ring group, an isoindole ring group, a benzimidazole ring group, a purine ring group, a quinoline ring group, an isoquinoline ring group, a quinoxaline ring group, a cinnoline ring group, a carbazole ring group, and a group represented by any one of the following Formulae (L-1) to (L-7).

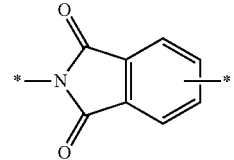  (L-1)

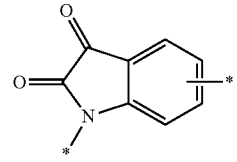  (L-2)

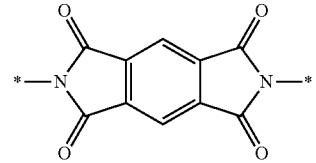  (L-3)

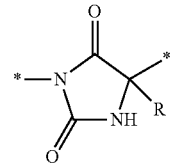  (L-4)

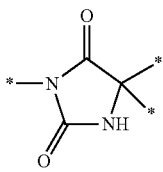
(L-5)

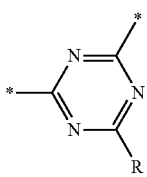
(L-6)

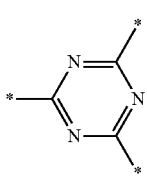
(L-7)

In the formulae, * represents a binding site to $P^{3D}$, $L^{3D}$, or $X^{3D}$, and R represents a hydrogen atom or a substituent. Examples of the substituent include a substituent T. Examples of the substituent T include an alkyl group having 1 to 10 carbon atoms, an alkoxy group having 1 to 10 carbon atoms, an thioalkoxy group having 1 to 10 carbon atoms, a hydroxy group, a carboxy group, an acetyl group, a cyano group, and a halogen atom (a fluorine atom, a chlorine atom, a bromine atom, or an iodine atom). These substituents may further have a substituent.

Specific examples of the linking group include an alkylene group, an arylene group, —SO₂—, a group represented by Formula (L-1), a group represented by Formula (L-5), a group including a combination of —O— and an alkylene group, a group including a combination of —NR'— and an alkylene group, a group including a combination of —NR'—, —CO—, and an alkylene group, a group including a combination of —NR'—, —CO—, an alkylene group, and an arylene group, a group including a combination of —NR'—, —CO—, and an arylene group, a group including a combination of —NR'—, —SO₂—, and an alkylene group, a group including a combination of —NR'—, —SO₂—, an alkylene group, and an arylene group, a group including a combination of the group represented by (L-1) and an alkylene group, a group including a combination of the group represented by (L-1) and an arylene group, a group including a combination of the group represented by (L-1), —SO₂—, and an alkylene group, a group including a combination of the group represented by (L-1), —S, and an alkylene group, a group including a combination of the group represented by (L-1), —O—, and an arylene group, a group including a combination of the group represented by (L-1), —NR'—, —CO—, and an arylene group, a group including a combination of the group represented by (L-3) and an arylene group, a group including a combination of —COO— and an arylene group, and a group including a combination of an arylene group, —COO—, and an alkylene group.

In Formula (3D), $X^{3D}$ represents an acidic group, a basic group, or a group having a salt structure.

Examples of the acidic group include a carboxy group, a sulfo group, and a phospho group.

Examples of the basic group include groups represented by Formulae (X-3) to (X-8) described below.

Examples of the group having a salt structure include salts of the above-described acidic groups and salts of the above-described basic groups. Examples of an atom or an atomic group constituting the salts include a metal atom and tetrabutylammonium. As the metal atom, an alkali metal atom or an alkali earth metal atom is more preferable. Examples of the alkali metal atom include lithium, sodium, and potassium. Examples of the alkali earth metal atom include calcium and magnesium.

In addition, the substituent may be the substituent T. The substituent T may be further substituted with another substituent. Examples of the other substituent include a carboxy group, a sulfo group, and a phospho group.

$X^{3D}$ represents preferably at least one selected from the group consisting of a carboxy group, a sulfo group, and a group represented by any one of the following Formulae (X-1) to (X-8).

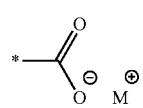
(X-1)

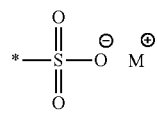
(X-2)

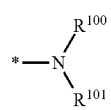
(X-3)

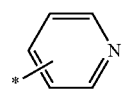
(X-4)

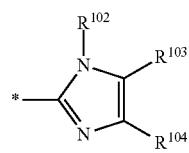
(X-5)

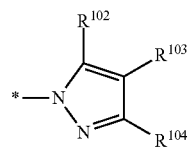
(X-6)

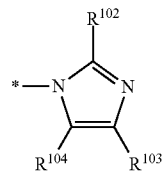
(X-7)

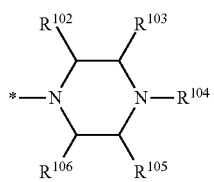

(X-8)

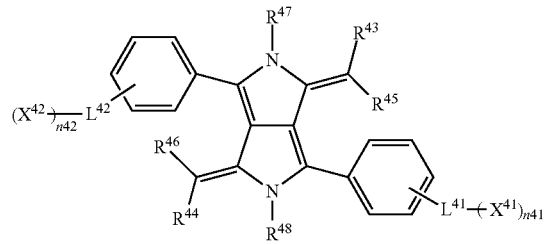

(4D)

In Formulae (X-1) to (X-8), * represents a binding site to $L^{3D}$ in Formula (3D), $R^{100}$ to $R^{106}$ each independently represent a hydrogen atom, an alkyl group, an alkenyl group, or an aryl group, $R^{100}$ and $R^{101}$ may be linked to each other to form a ring, and M represents an atom or an atomic group constituting an anion and a salt.

The alkyl group may be linear, branched, or cyclic. The number of carbon atoms in the linear alkyl group is preferably 1 to 20, more preferably 1 to 12, and still more preferably 1 to 8. The number of carbon atoms in the branched alkyl group is preferably 3 to 20, more preferably 3 to 12, and still more preferably 3 to 8. The cyclic alkyl group may be monocyclic or polycyclic. The number of carbon atoms in the cyclic alkyl group is preferably 3 to 20, more preferably 4 to 10, and still more preferably 6 to 10.

The number of carbon atoms in the alkenyl group is preferably 2 to 10, more preferably 2 to 8, and still more preferably 2 to 4.

The number of carbon atoms in the aryl group is preferably 6 to 18, more preferably 6 to 14, and still more preferably 6 to 10.

$R^{100}$ and $R^{101}$ may be linked to each other to form a ring. The ring may be an alicyclic ring or an aromatic ring. The ring may be a monocycle or a polycycle. In a case where $R^{100}$ and $R^{101}$ are bonded to each other to form a ring, a linking group may be a divalent linking group selected from the group consisting of —CO—, —O—, —NH—, a divalent aliphatic group, a divalent aromatic group, and a combination thereof. Specific examples include a piperazine ring, a pyrrolidine ring, a pyrrole ring, a piperidine ring, a pyridine ring, an imidazole ring, a pyrazole ring, an oxazole ring, a thiazole ring, a pyrazine ring, a morpholine ring, a thiazine ring, an indole ring, an isoindole ring, a benzimidazole ring, a purine ring, a quinoline ring, an isoquinoline ring, a quinoxaline ring, a cinnoline ring, and a carbazole ring.

M represents an atom or an atomic group constituting an anion and a salt. M has the same exemplary groups and the same preferable ranges as described above.

The upper limit of m represents the number of substituents which may be included in the colorant structure $P^{3D}$ and, for example, is preferably 10 or less and more preferably 5 or less. In a case where m represents 2 or more, a plurality of $L^{3D}$'s and a plurality of $X^{3D}$'s may be different from each other.

n represents preferably an integer of 1 to 3 and more preferably 1 or 2. In a case where n represents 2 or more, a plurality of X's may be different from each other.

The pigment derivative is preferably a pigment derivative represented by the following Formula (4D). In the pigment derivative represented by the following Formula (4D), $P^{3D}$ in formula (3D) represents a compound having a pyrrolopyrrole colorant structure.

In Formula (4D), $R^{43}$ to $R^{46}$ each independently represent a cyano group, an acyl group, an alkoxycarbonyl group, an alkylsulfinyl group, an arylsulfinyl group, or a heteroaryl group, $R^{47}$ and $R^{48}$ each independently represent a hydrogen atom, an alkyl group, an aryl group, a heteroaryl group, —$BR^{49}R^{50}$, or a metal atom, $R^{47}$ may form a covalent bond or a coordinate bond with $R^{43}$ or $R^{45}$, $R^{48}$ may form a covalent bond or a coordinate bond with $R^{44}$ or $R^{46}$, $R^{49}$ and $R^{50}$ each independently represent a hydrogen atom, a halogen atom, an alkyl group, an alkenyl group, an aryl group, a heteroaryl group, an alkoxy group, an aryloxy group, or a heteroaryloxy group, $R^{49}$ and $R^{50}$ may be bonded to each other to form a ring, $L^{41}$ and $L^{42}$ each independently represent a single bond, an alkylene group, an arylene group, a nitrogen-containing heterocyclic group, —O—, —S—, —NR'—, —CO—, —$SO_2$—, or a linking group including a combination of two or more kinds of the above-described groups, R' represents a hydrogen atom, an alkyl group, or an aryl group, $X^{41}$ and $X^{42}$ each independently represent an acidic group, a basic group, or a group having a salt structure, n41 and n42 each independently represent an integer of 0 to 4, and at least one of n41 or n42 represents 1 or more.

From the viewpoint of infrared absorbing properties, it is preferable that $R^{43}$ to $R^{46}$ in Formula (4D) each independently represent a cyano group or a heteroaryl group.

From the viewpoint of infrared absorbing properties, it is preferable that two of $R^{43}$ to $R^{46}$ represent a cyano group, and it is more preferable that $R^5$ and $R^6$ represent a cyano group.

In addition, from the viewpoint of infrared absorbing properties, it is preferable that two of $R^{43}$ to $R^{46}$ represent a heteroaryl group, and it is more preferable that $R^{43}$ and $R^{44}$ represent a heteroaryl group.

From the viewpoint of infrared absorbing properties, it is preferable that at least a nitrogen atom is included as the heteroaryl group represented by $R^{43}$ to $R^{46}$.

In addition, from the viewpoint of infrared absorbing properties, the heteroaryl group represented by $R^{43}$ to $R^{46}$ is preferably a heteroaryl group in which a benzene ring or a naphthalene ring is fused to a heteroaryl ring and more preferably a heteroaryl group in which a benzene ring is fused to a heteroaryl ring.

Further, the heteroaryl ring in the heteroaryl group represented by $R^{43}$ to $R^{46}$ is preferably a 5-membered ring or a 6-membered ring, more preferably an oxazole ring, a thiazole ring, a pyridine ring, a pyrimidine ring, or a pyrazine ring, and still more preferably an oxazole ring, a thiazole ring, or a pyrazine ring.

From the viewpoints infrared absorbing properties and dispersibility, $R^{47}$ and $R^{48}$ in Formula (4D) each independently represent preferably an alkyl group, an aryl group, a heteroaryl group, or —$BR^{49}R^{40}$, and more preferably —$BR^{49}R5$ From the viewpoints infrared absorbing properties and dispersibility, $R^{49}$ and $R^{50}$ each independently represent preferably a halogen atom, an alkyl group, an aryl group, or an aryloxy group and more preferably an aryl group.

In addition, it is preferable that $R^{49}$ and $R^{50}$ represent the same group.

$X^{41}$ and $X^{42}$ in Formula (4D) have the same definitions and the same preferable aspects as of $X^{3D}$ in Formula (3D).

In Formula (4), $L^{41}$ and $L^{42}$ have the same definitions and the same preferable aspects as $L^{3D}$ in Formula (3D). Further, from the viewpoints of synthesis suitability and visible transparency, the following linking groups are more preferable.

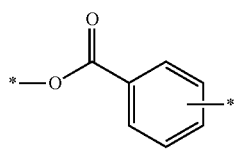
(L-8)

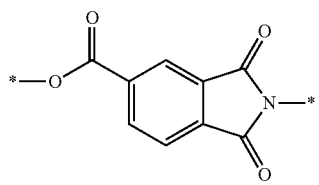
(L-9)

In addition, in $L^{41}$, the number of atoms constituting a chain through which a benzene ring directly linked to a pyrrolopyrrole structure as the mother nucleus structure of the pigment derivative is linked to $X^{41}$ is preferably 1 to 20. The lower limit is more preferably 2 or more and still more preferably 3 or more. The upper limit is more preferably 15 or less and still more preferably 10 or less. In addition, in $L^{42}$, the number of atoms constituting a chain through which a benzene ring directly linked to a pyrrolopyrrole structure as the mother nucleus structure of the pigment derivative is linked to $X^{42}$ is preferably 1 to 20. The lower limit is more preferably 2 or more and still more preferably 3 or more. The upper limit is more preferably 15 or less and still more preferably 10 or less. According to this aspect, the pigment dispersibility can be further improved. The detailed reason is not clear but is presumed to be that, by increasing the distance from the pyrrolopyrrole structure as the mother nucleus structure of the pigment derivative to $X^{41}$ and $X^{42}$, $X^{41}$ and $X^{42}$ is not likely to undergo steric hindrance, the interaction with the resin or the like is likely to occur, and thus the pigment dispersibility can be improved.

A solubility of the compound represented by Formula (4D) in the solvent (25° C.) included in the composition is preferably 0 g/L to 0.1 g/L and more preferably 0 g/L to 0.01 g/L. In the above-described range, the pigment dispersibility can be further improved.

Specific examples of the pigment derivative represented by Formula (3D) include the following (3-1) to (3-25). In the following formulae, m, m1, m2, and m3 each independently represent an integer of 1 or more.

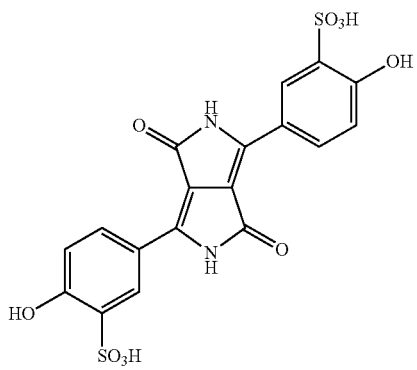
(3-1)

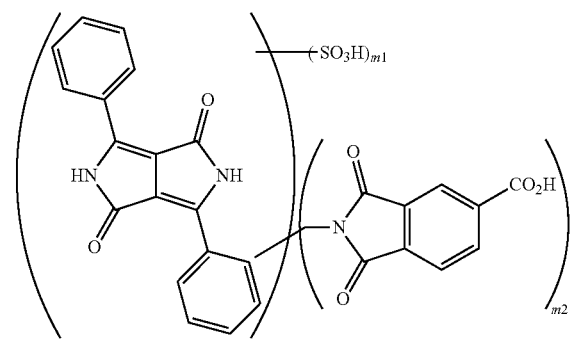
(3-2)

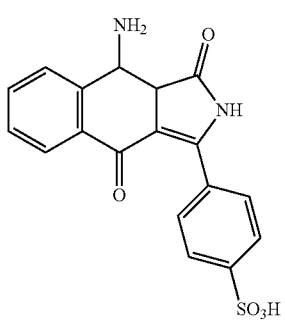
(3-3)

(3-4)
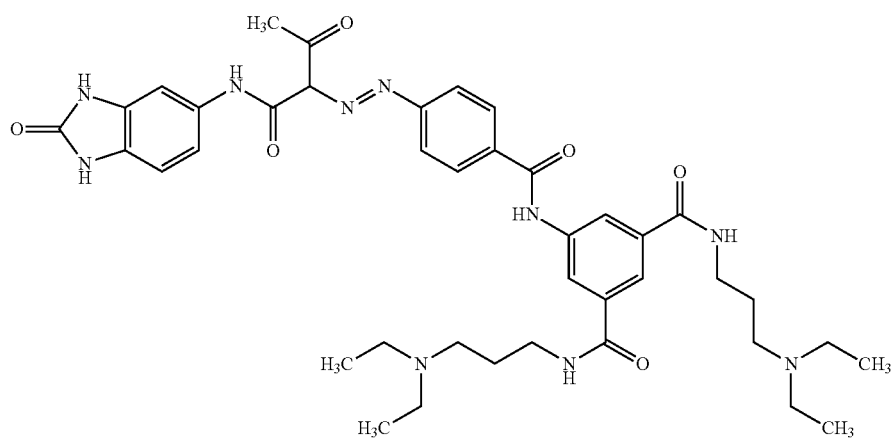
(3-5)
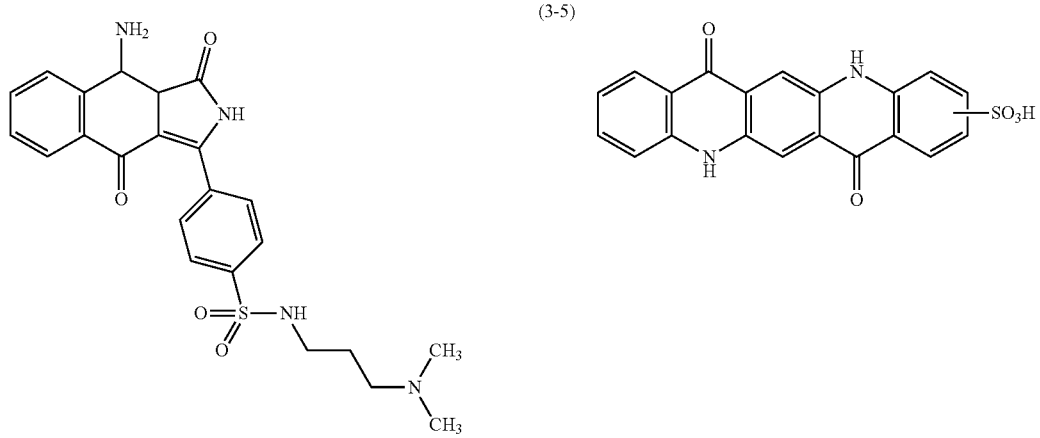
(3-6)
(3-7)
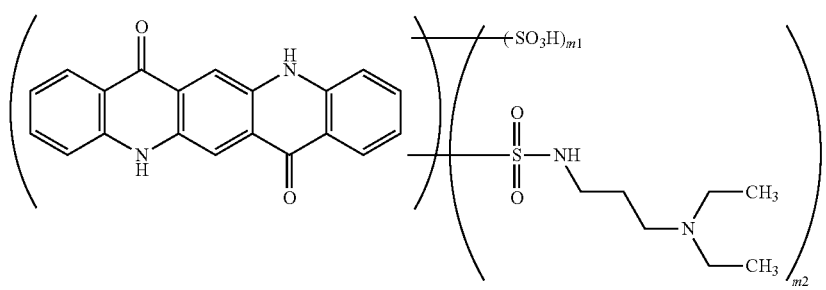
(3-8)
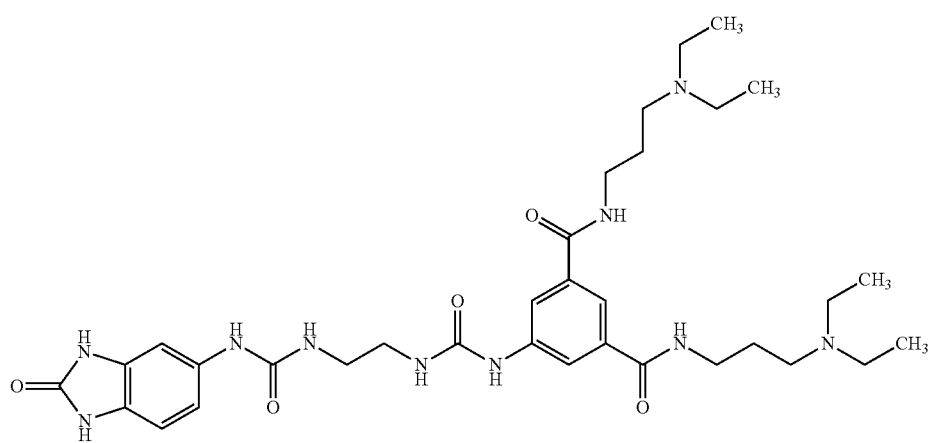

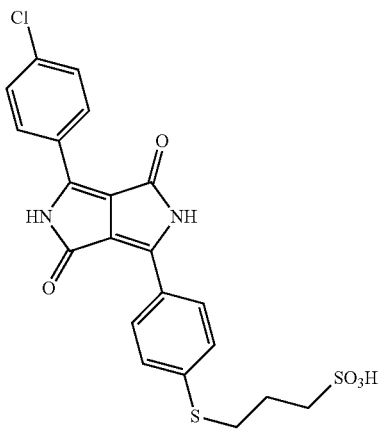
(3-9)
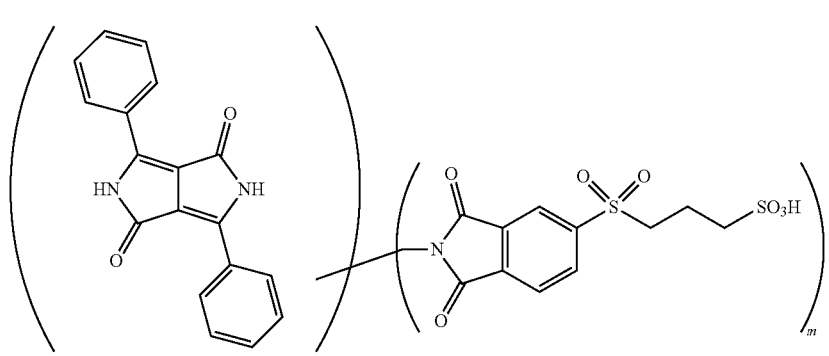
(3-10)
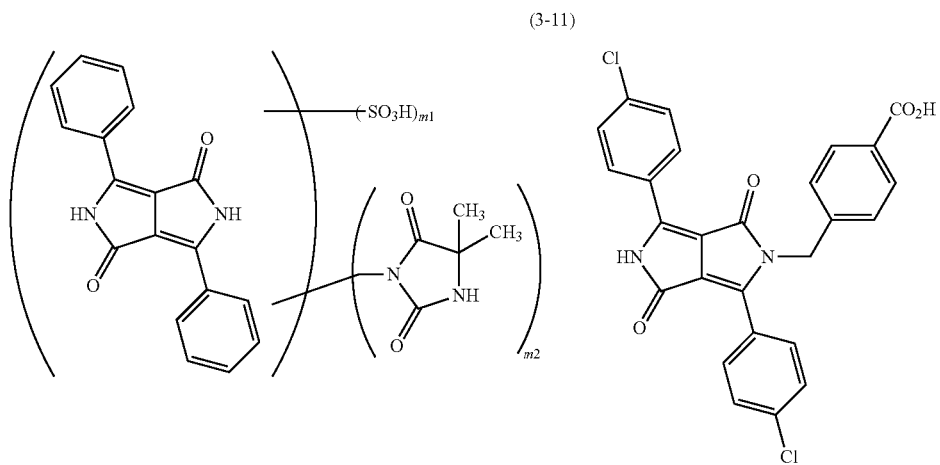
(3-11)
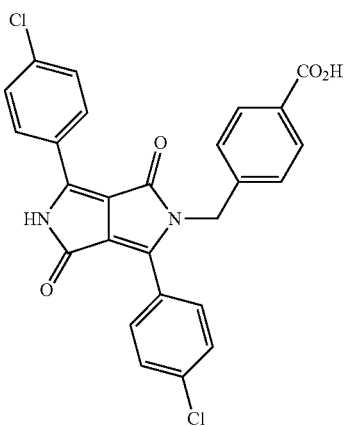
(3-12)
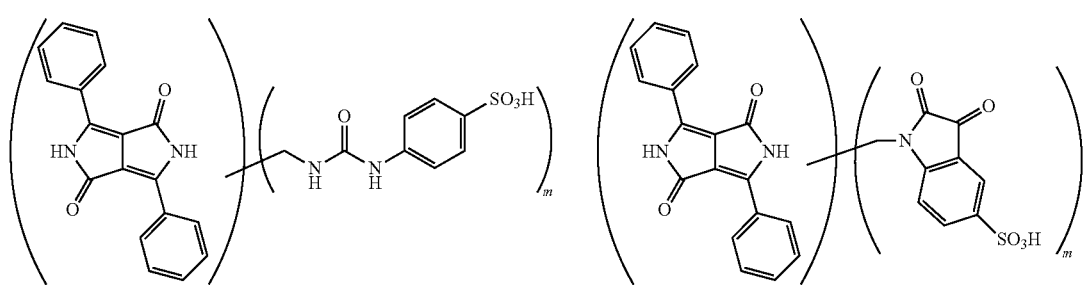
(3-13)
(3-14)

-continued
(3-17)
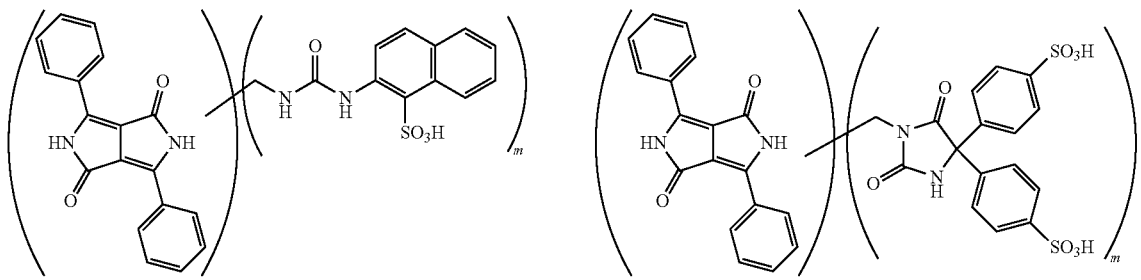
(3-18)
(3-19)
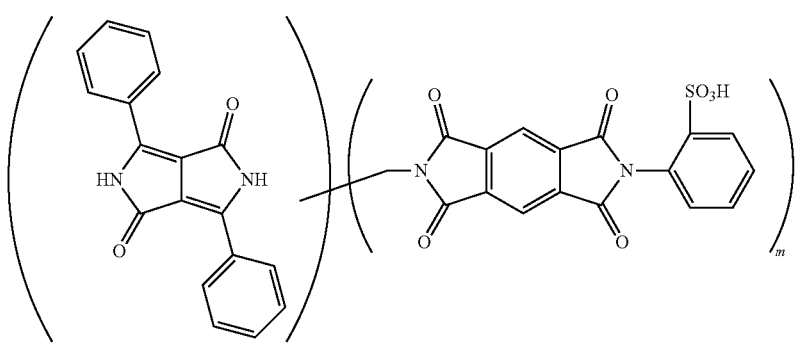
(3-20)
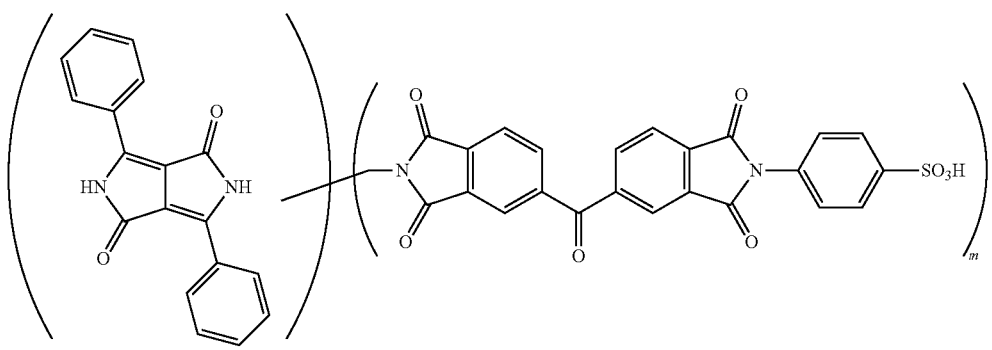
(3-21)
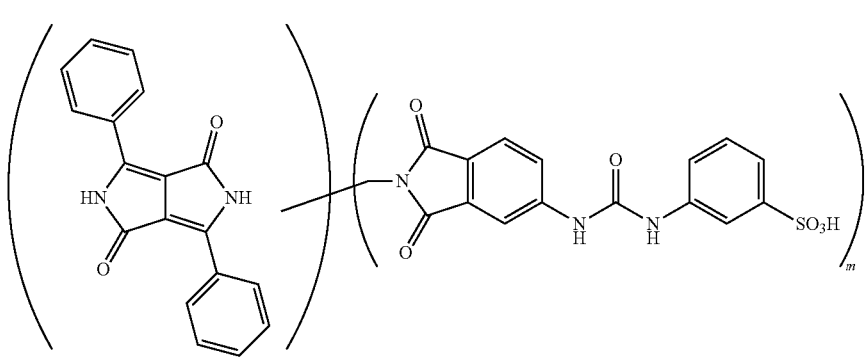

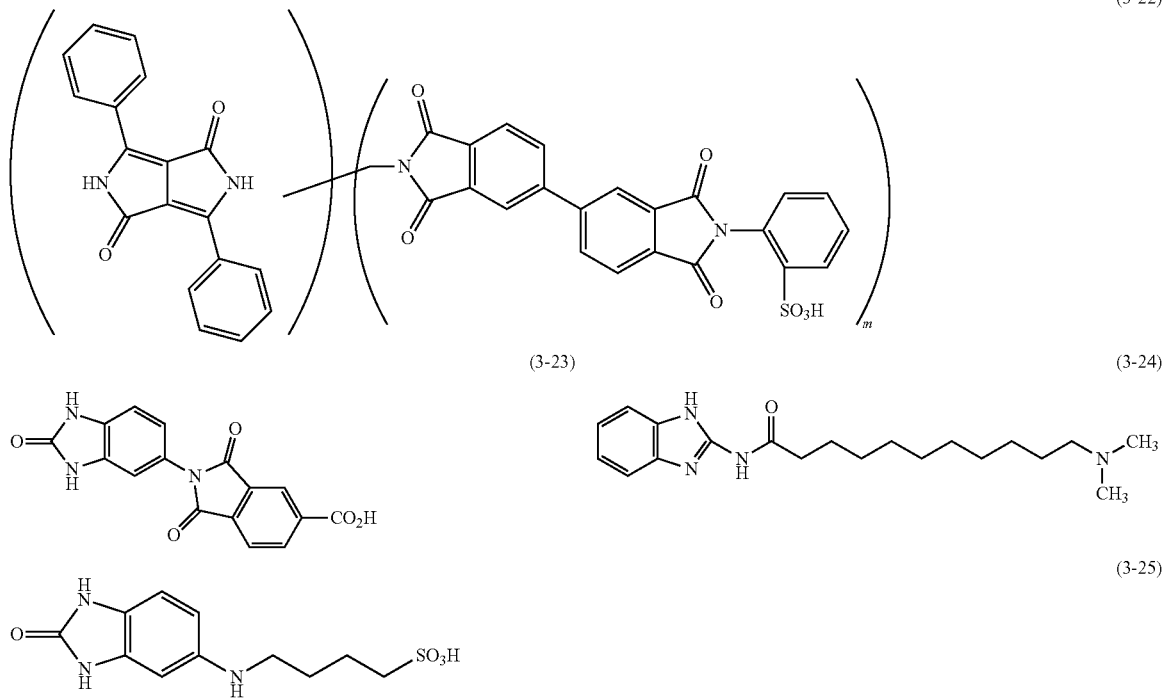

Specific examples of the compound represented by Formula (4D) include the following compounds. In the following structural formulae, Me represents a methyl group, Bu represents a butyl group, and Ph represents a phenyl group. Ar-1 to Ar-31 and R-1 to R-7 in the following tables are as follows. In the following structures, "*" represents a direct bond.

| | Ar | R$^{1X}$ | R$^{2X}$ | R$^{7X}$ |
|---|---|---|---|---|
| 4-1 | Ar-1 | H | H | R-1 |
| 4-2 | Ar-1 | Cl | H | R-1 |
| 4-3 | Ar-1 | H | Cl | R-1 |
| 4-4 | Ar-1 | Cl | Cl | R-1 |
| 4-5 | Ar-1 | Me | H | R-1 |
| 4-6 | Ar-1 | H | Me | R-1 |
| 4-7 | Ar-1 | Me | Me | R-1 |
| 4-8 | Ar-1 | OMe | H | R-1 |
| 4-9 | Ar-1 | H | OMe | R-1 |
| 4-10 | Ar-1 | OMe | OMe | R-1 |
| 4-11 | Ar-1 | Cl | Cl | R-1 |
| 4-12 | Ar-1 | Cl | Cl | R-1 |
| 4-13 | Ar-1 | Cl | Cl | R-1 |
| 4-14 | Ar-1 | Cl | Cl | R-1 |
| 4-15 | Ar-1 | Cl | Cl | R-1 |
| 4-16 | Ar-1 | Cl | Cl | R-1 |
| 4-17 | Ar-1 | Cl | Cl | R-1 |
| 4-18 | Ar-2 | Cl | Cl | R-1 |
| 4-19 | Ar-2 | H | H | R-1 |
| 4-20 | Ar-3 | Cl | Cl | R-1 |
| 4-21 | Ar-3 | H | H | R-1 |
| 4-22 | Ar-4 | H | H | R-1 |
| 4-23 | Ar-4 | Cl | H | R-1 |
| 4-24 | Ar-4 | H | Cl | R-1 |
| 4-25 | Ar-4 | Cl | Cl | R-1 |
| 4-26 | Ar-4 | Me | H | R-1 |
| 4-27 | Ar-4 | H | Me | R-1 |
| 4-28 | Ar-4 | Me | Me | R-1 |
| 4-29 | Ar-4 | OMe | H | R-1 |
| 4-30 | Ar-4 | H | OMe | R-1 |
| 4-31 | Ar-4 | OMe | OMe | R-1 |
| 4-32 | Ar-4 | Cl | Cl | R-1 |
| 4-33 | Ar-4 | Cl | Cl | R-1 |
| 4-34 | Ar-4 | Cl | Cl | R-1 |
| 4-35 | Ar-4 | Cl | Cl | R-1 |
| 4-36 | Ar-4 | Cl | Cl | R-1 |
| 4-37 | Ar-4 | Cl | Cl | R-1 |
| 4-38 | Ar-4 | Cl | Cl | R-1 |
| 4-39 | Ar-5 | H | H | R-1 |
| 4-40 | Ar-5 | Cl | H | R-1 |
| 4-41 | Ar-5 | H | Cl | R-1 |
| 4-42 | Ar-5 | Cl | Cl | R-1 |
| 4-43 | Ar-5 | Me | H | R-1 |
| 4-44 | Ar-5 | H | Me | R-1 |
| 4-45 | Ar-5 | Me | Me | R-1 |

-continued

| | | | | |
|---|---|---|---|---|
| 4-46 | Ar-5 | OMe | H | R-1 |
| 4-47 | Ar-5 | H | OMe | R-1 |
| 4-48 | Ar-5 | OMe | OMe | R-1 |
| 4-49 | Ar-6 | Cl | Cl | R-1 |
| 4-50 | Ar-7 | Cl | Cl | R-1 |
| 4-51 | Ar-8 | H | H | R-1 |
| 4-52 | Ar-8 | Cl | H | R-1 |
| 4-53 | Ar-8 | H | Cl | R-1 |
| 4-54 | Ar-8 | Cl | Cl | R-1 |
| 4-55 | Ar-8 | Me | H | R-1 |
| 4-56 | Ar-8 | H | Me | R-1 |
| 4-57 | Ar-8 | Me | Me | R-1 |
| 4-58 | Ar-8 | OMe | H | R-1 |
| 4-59 | Ar-8 | H | OMe | R-1 |
| 4-60 | Ar-8 | OMe | OMe | R-1 |
| 4-61 | Ar-9 | Cl | Cl | R-1 |
| 4-62 | Ar-10 | Cl | Cl | R-1 |
| 4-63 | Ar-11 | Cl | Cl | R-1 |
| 4-64 | Ar-12 | Cl | Cl | R-1 |
| 4-65 | Ar-13 | Cl | H | R-1 |
| 4-66 | Ar-13 | H | Cl | R-1 |
| 4-67 | Ar-13 | Cl | Cl | R-1 |
| 4-68 | Ar-13 | Me | Me | R-1 |
| 4-69 | Ar-13 | OMe | OMe | R-1 |
| 4-70 | Ar-14 | Cl | Cl | R-1 |
| 4-71 | Ar-15 | Cl | H | R-1 |
| 4-72 | Ar-15 | H | Cl | R-1 |
| 4-73 | Ar-15 | Cl | Cl | R-1 |
| 4-74 | Ar-15 | Me | Me | R-1 |
| 4-75 | Ar-15 | OMe | OMe | R-1 |
| 4-76 | Ar-16 | Cl | Cl | R-1 |
| 4-77 | Ar-17 | Cl | Cl | R-1 |
| 4-78 | Ar-18 | Cl | Cl | R-1 |
| 4-79 | Ar-19 | Cl | H | R-1 |
| 4-80 | Ar-20 | Me | Me | R-1 |
| 4-81 | Ar-21 | Cl | Cl | R-1 |
| 4-82 | Ar-22 | Cl | Cl | R-1 |
| 4-83 | Ar-23 | Cl | H | R-1 |
| 4-84 | Ar-24 | H | Cl | R-1 |
| 4-85 | Ar-25 | Me | Me | R-1 |
| 4-86 | Ar-26 | OMe | OMe | R-1 |
| 4-87 | Ar-27 | OMe | OMe | R-1 |
| 4-88 | Ar-28 | Cl | Cl | R-1 |
| 4-89 | Ar-29 | Cl | H | R-1 |
| 4-90 | Ar-30 | Cl | H | R-1 |
| 4-91 | Ar-31 | Cl | Cl | R-1 |

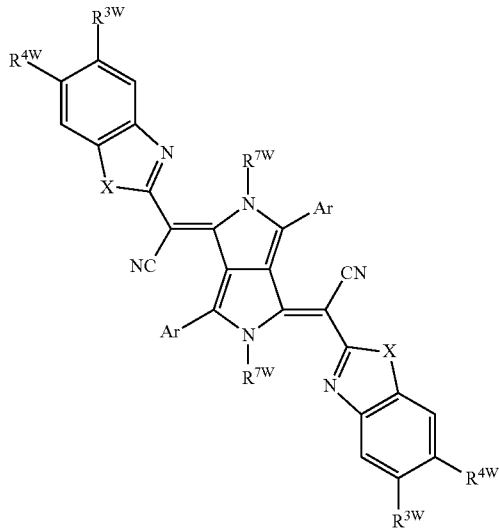

| | X | Ar | $R^{3W}$ | $R^{4W}$ | $R^{7W}$ |
|---|---|---|---|---|---|
| 4-91 | O | Ar-1 | H | H | R-1 |
| 4-92 | O | Ar-1 | Me | H | R-1 |
| 4-93 | O | Ar-1 | Cl | H | R-1 |
| 4-94 | O | Ar-1 | OMe | H | R-1 |
| 4-95 | O | Ar-1 | H | Me | R-1 |
| 4-96 | O | Ar-2 | H | H | R-1 |
| 4-97 | O | Ar-3 | H | H | R-1 |
| 4-98 | O | Ar-4 | H | H | R-1 |
| 4-99 | O | Ar-4 | Me | H | R-1 |
| 4-100 | O | Ar-4 | Cl | H | R-1 |
| 4-101 | O | Ar-4 | OMe | H | R-1 |
| 4-102 | O | Ar-4 | H | Me | R-1 |
| 4-103 | O | Ar-5 | H | H | R-1 |
| 4-104 | O | Ar-5 | Me | H | R-1 |
| 4-105 | O | Ar-5 | OMe | H | R-1 |
| 4-106 | O | Ar-6 | H | H | R-1 |
| 4-107 | O | Ar-7 | H | H | R-1 |
| 4-108 | O | Ar-8 | H | H | R-1 |
| 4-109 | O | Ar-8 | Me | H | R-1 |
| 4-110 | O | Ar-8 | OMe | H | R-1 |
| 4-111 | O | Ar-9 | H | H | R-1 |
| 4-112 | O | Ar-10 | H | H | R-1 |
| 4-113 | O | Ar-11 | H | H | R-1 |
| 4-114 | O | Ar-12 | H | H | R-1 |
| 4-115 | O | Ar-13 | H | H | R-1 |
| 4-116 | O | Ar-13 | Me | H | R-1 |
| 4-117 | O | Ar-13 | OMe | H | R-1 |
| 4-118 | O | Ar-14 | H | H | R-1 |
| 4-119 | O | Ar-15 | H | H | R-1 |
| 4-120 | O | Ar-15 | Me | H | R-1 |
| 4-121 | O | Ar-15 | OMe | H | R-1 |
| 4-122 | O | Ar-16 | H | H | R-1 |
| 4-123 | O | Ar-17 | H | H | R-1 |
| 4-124 | O | Ar-18 | H | H | R-1 |
| 4-125 | O | Ar-19 | H | H | R-1 |
| 4-126 | O | Ar-20 | H | H | R-1 |
| 4-127 | O | Ar-21 | H | H | R-1 |
| 4-128 | O | Ar-22 | H | H | R-1 |
| 4-129 | O | Ar-23 | H | H | R-1 |
| 4-130 | O | Ar-24 | H | H | R-1 |
| 4-131 | O | Ar-25 | H | H | R-1 |
| 4-132 | O | Ar-26 | H | H | R-1 |
| 4-133 | O | Ar-27 | H | H | R-1 |
| 4-134 | O | Ar-28 | H | H | R-1 |
| 4-135 | O | Ar-29 | H | H | R-1 |
| 4-136 | O | Ar-30 | H | H | R-1 |
| 4-137 | O | Ar-31 | H | H | R-1 |
| 4-139 | S | Ar-1 | H | H | R-1 |
| 4-140 | S | Ar-1 | Me | H | R-1 |
| 4-141 | S | Ar-1 | Cl | H | R-1 |
| 4-142 | S | Ar-1 | OMe | H | R-1 |
| 4-143 | S | Ar-1 | Me | Me | R-1 |
| 4-144 | S | Ar-2 | H | H | R-1 |
| 4-145 | S | Ar-3 | H | H | R-1 |
| 4-146 | S | Ar-4 | H | H | R-1 |
| 4-147 | S | Ar-4 | Me | H | R-1 |
| 4-148 | S | Ar-4 | Cl | H | R-1 |
| 4-149 | S | Ar-4 | OMe | H | R-1 |
| 4-150 | S | Ar-4 | Me | Me | R-1 |
| 4-151 | S | Ar-4 | Me | Me | R-1 |
| 4-152 | S | Ar-5 | H | H | R-1 |
| 4-153 | S | Ar-5 | Me | Me | R-1 |
| 4-154 | S | Ar-5 | OMe | H | R-1 |
| 4-155 | S | Ar-6 | H | H | R-1 |
| 4-156 | S | Ar-7 | H | H | R-1 |
| 4-157 | S | Ar-8 | H | H | R-1 |
| 4-158 | S | Ar-8 | Me | Me | R-1 |
| 4-159 | S | Ar-8 | OMe | H | R-1 |
| 4-160 | S | Ar-9 | H | H | R-1 |
| 4-161 | S | Ar-10 | H | H | R-1 |
| 4-162 | S | Ar-11 | H | H | R-1 |
| 4-163 | S | Ar-12 | H | H | R-1 |
| 4-164 | S | Ar-13 | H | H | R-1 |
| 4-165 | S | Ar-13 | Me | Me | R-1 |
| 4-166 | S | Ar-13 | OMe | H | R-1 |
| 4-167 | S | Ar-14 | H | H | R-1 |
| 4-168 | S | Ar-15 | H | H | R-1 |
| 4-169 | S | Ar-15 | Me | Me | R-1 |
| 4-170 | S | Ar-15 | OMe | H | R-1 |
| 4-171 | S | Ar-16 | H | H | R-1 |
| 4-172 | S | Ar-17 | H | H | R-1 |
| 4-173 | S | Ar-18 | H | H | R-1 |
| 4-174 | S | Ar-19 | H | H | R-1 |
| 4-175 | S | Ar-20 | H | H | R-1 |

-continued
| | | | | | |
|---|---|---|---|---|---|
| 4-176 | S | Ar-21 | H | H | R-1 |
| 4-177 | S | Ar-22 | H | H | R-1 |
| 4-178 | S | Ar-23 | H | H | R-1 |
| 4-179 | S | Ar-24 | H | H | R-1 |
| 4-180 | S | Ar-25 | H | H | R-1 |
| 4-181 | S | Ar-26 | H | H | R-1 |
| 4-182 | S | Ar-27 | H | H | R-1 |
| 4-183 | S | Ar-28 | H | H | R-1 |
| 4-184 | S | Ar-29 | H | H | R-1 |
| 4-185 | S | Ar-30 | H | H | R-1 |
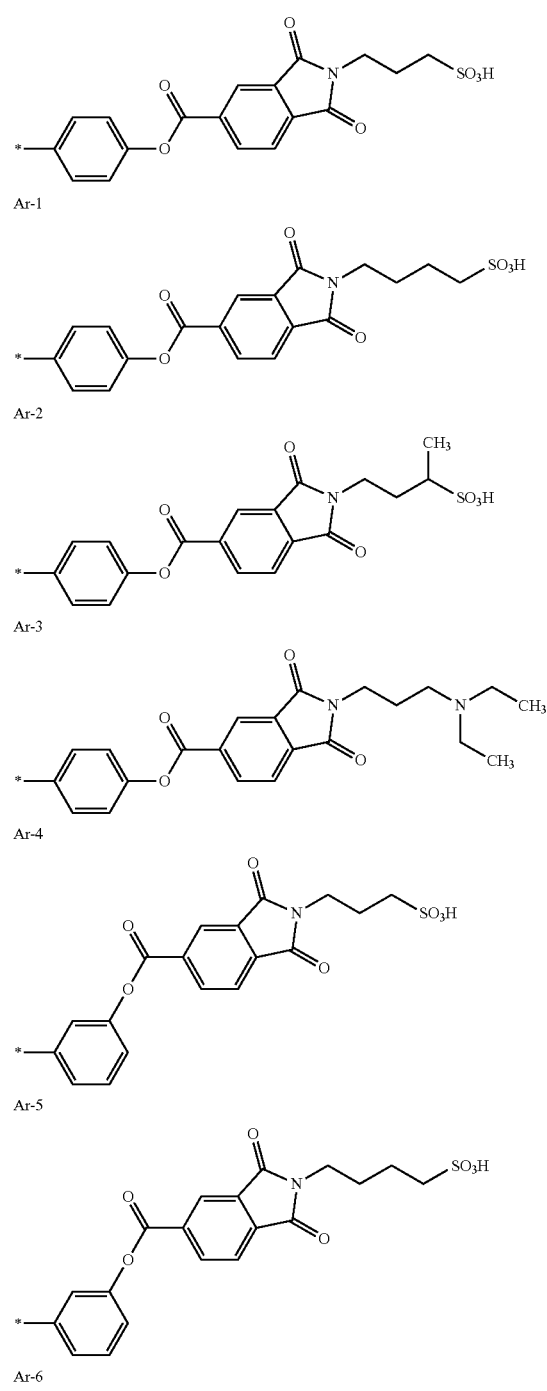
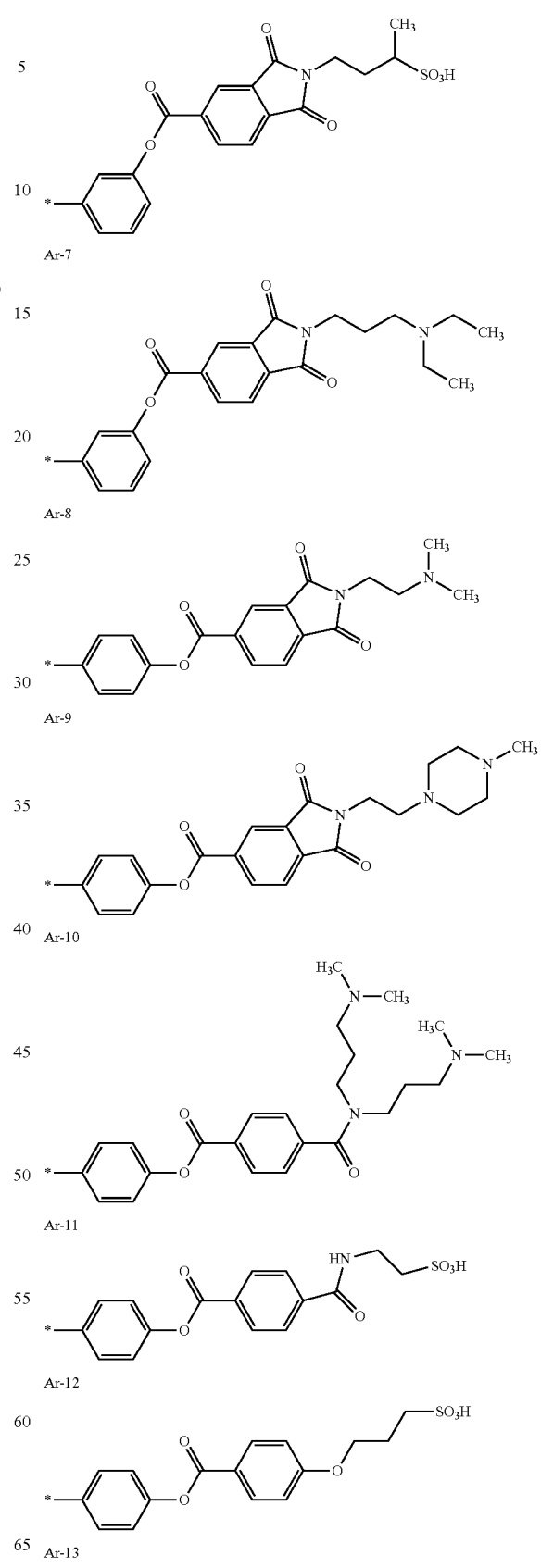

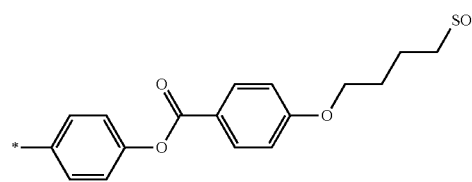
Ar-14
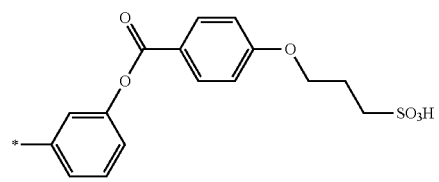 [SMILES: *c1cccc(OC(=O)c2ccc(OCCCS(=O)(=O)O)cc2)c1]
Ar-15
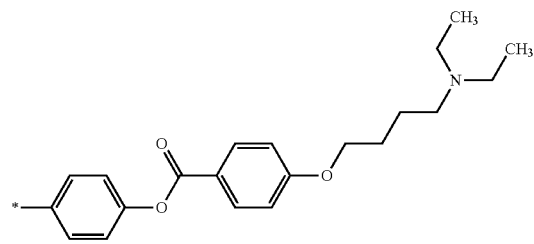 [SMILES: *c1ccc(OC(=O)c2ccc(OCCCCN(CC)CC)cc2)cc1]
Ar-16
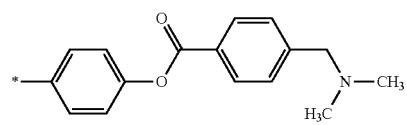
Ar-17
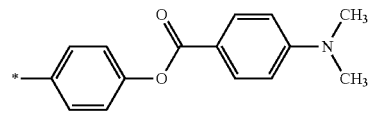
Ar-18
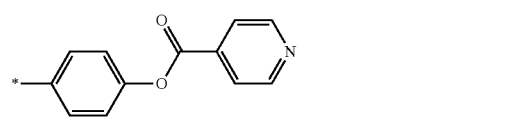
Ar-19
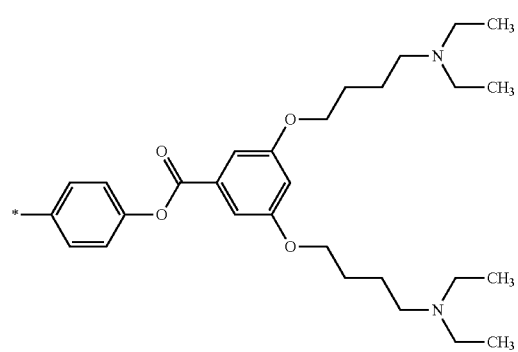 [SMILES: *c1ccc(OC(=O)c2cc(OCCCCN(CC)CC)cc(OCCCCN(CC)CC)c2)cc1]
Ar-20
Ar-21
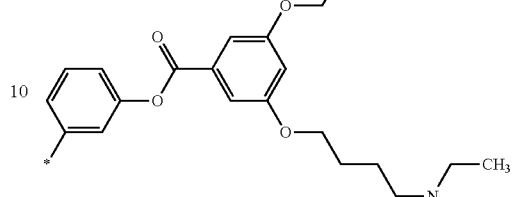
Ar-22
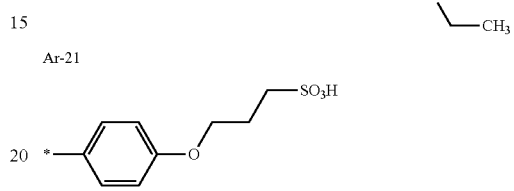
Ar-23
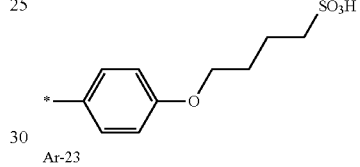
Ar-24
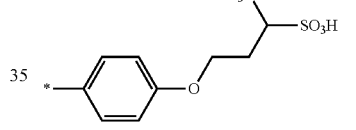
Ar-25
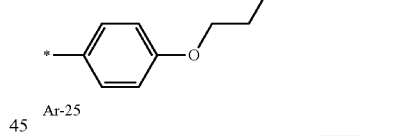
Ar-26
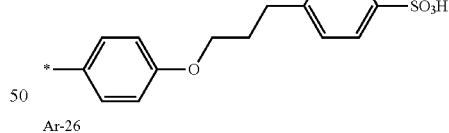
Ar-27
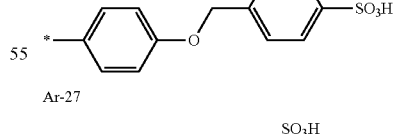
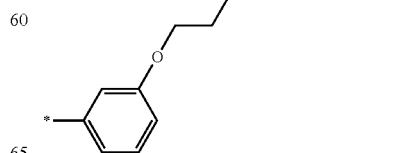
Ar-28

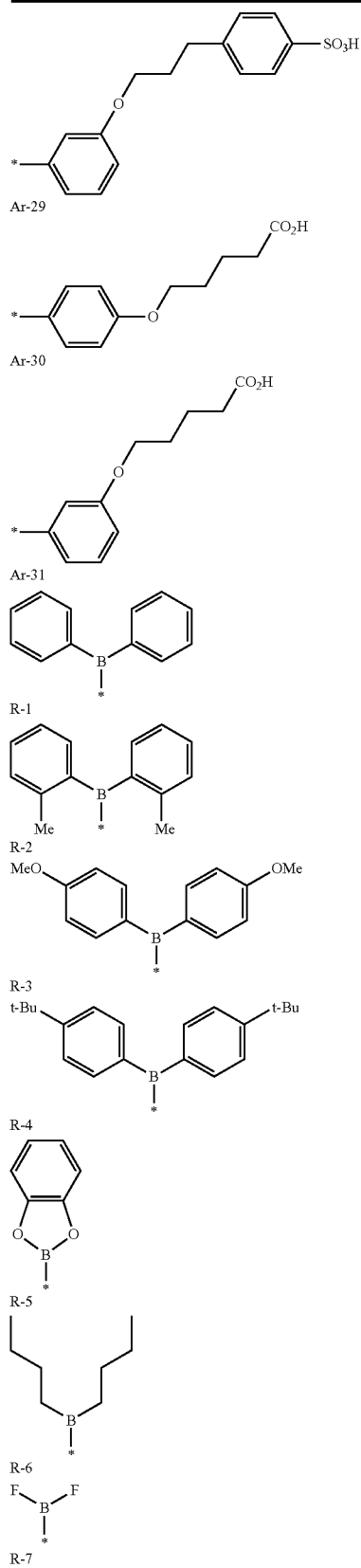

The infrared absorbing colorant has a maximum absorption wavelength preferably in a wavelength range of 700 nm to 1,200 nm, more preferably in a wavelength range of 750 nm to 1,200 nm, and still more preferably in a wavelength range of 750 nm to 1,000 nm.

In addition, from the viewpoint of dispersibility, it is preferable that the infrared absorbing colorant is in the form of particles.

From the viewpoint of dispersibility, the volume average particle size of the infrared absorbing colorant is preferably 5 nm to 500 nm, more preferably 5 nm to 100 nm, and still more preferably 5 nm to 50 nm.

From the viewpoint of infrared shielding properties, the content of the infrared absorbing colorant is preferably 1 mass % to 90 mass %, more preferably 5 mass % to 70 mass %, and still more preferably 10 mass % to 50 mass % with respect to the total solid content of the composition.

As the infrared absorbing colorant, one kind may be used alone, or two or more kinds may be used in combination. In a case where two or more infrared absorbing colorants are used in combination, it is preferable that the total content of the near infrared absorbing colorants is in the above-described range.

(Solvent)

The composition according to the embodiment of the present disclosure may include a solvent.

The solvent is not particularly limited as long as the respective components of the composition can be uniformly dissolved or dispersed therein, and can be appropriately selected according to the purpose. For example, water or an organic solvent can be used, and an organic solvent is preferable.

Preferable examples of the organic solvent include an alcohol (for example, methanol), a ketone, an ester, an aromatic hydrocarbon, a halogenated hydrocarbon, dimethylformamide, dimethylacetamide, dimethyl sulfoxide, and sulfolane. Among these, one kind may be used alone, or two or more kinds may be used in combination.

In particular, at least one organic solvent selected from the group consisting of an ester having a cyclic alkyl group and a ketone is preferably used.

Specific examples of the alcohol, the aromatic hydrocarbon, and the halogenated hydrocarbon can be found in, for example, paragraph "0136" of JP2012-194534A, the content of which is incorporated herein by reference.

Specific examples of the ester, the ketone, and the ether can be found in, for example, paragraph "0497" of JP2012-208494A (corresponding to paragraph "0609" of US2012/0235099A). Other examples include n-amyl acetate, ethyl propionate, dimethyl phthalate, ethyl benzoate, methyl sulfate, acetone, methyl isobutyl ketone, diethyl ether, and ethylene glycol monobutyl ether acetate.

As the solvent, one or more selected from ethanol, methanol, methyl 3-methoxypropionate, ethyl 3-methoxypropionate, methyl 3-ethoxypropionate, ethyl 3-ethoxypropionate, N-methyl-2-pyrrolidone, ethyl cellosolve acetate, ethyl lactate, butyl acetate, cyclohexyl acetate, diethylene glycol dimethyl ether, 2-heptanone, cyclopentanone, cyclohexanone, ethyl carbitol acetate, butyl carbitol acetate, ethylene glycol monobutyl ether acetate, propylene glycol monomethyl ether, and propylene glycol monomethyl ether acetate are preferable.

The content of the solvent is preferably 10 mass % to 90 mass % with respect to the total solid content of the composition. The lower limit is more preferably 15 mass % or higher and still more preferably 20 mass % or higher. The upper limit is more preferably 80 mass % or lower, and still more preferably 70 mass % or lower.

As the solvent, one kind or two or more kinds may be used. In a case where two or more solvents are used, it is preferable that the total content of the two or more solvents is in the above-described range.

(Polymerizable Compound)

From the viewpoints of physical properties of a film to be formed, it is preferable that the composition according to the embodiment of the present disclosure further includes a polymerizable compound, and it is more preferable that the composition according to the embodiment of the present disclosure further includes a polymerizable compound and a polymerization initiator.

The polymerizable compound may be in any chemical form of a monomer, an oligomer, a prepolymer, a polymer, or the like. The details of the polymerizable compound can be found in, for example, paragraphs "0070" to "0191" of JP2014-041318A (corresponding to paragraphs "0071" to "0192" of WO2014/017669A) or paragraphs "0045" to "0216" of JP2014-032380A, the content of which is incorporated herein by reference.

In addition, examples of a commercially available product of a urethane resin having a methacryloyl group include 8UH-1006 and 8UH-1012 (both of which are manufactured by Taisei Fine Chemical Co., Ltd.).

The polymerizable compound may be a radically polymerizable compound or a cationically polymerizable compound. For example, a compound having a polymerizable group such as an ethylenically unsaturated bond or a cyclic ether (epoxy, oxetane) can be used. As the ethylenically unsaturated bond, a vinyl group, a styryl group, a (meth)acryloyl group), or a (meth)allyl group is preferable. Thee polymerizable compound may be a monofunctional compound having one polymerizable group or a polyfunctional polymerizable compound having two or more polymerizable groups, and is preferably a polyfunctional polymerizable compound and more preferably a polyfunctional (meth)acrylate compound. By the composition including the polyfunctional polymerizable compound, film hardness can be further improved.

Examples of the polymerizable compound include a monofunctional (meth)acrylate compound, a polyfunctional (meth)acrylate compound (preferably a trifunctional to hexafunctional (meth)acrylate compound), a polybasic acid-modified acrylic oligomer, an epoxy resin, and a polyfunctional epoxy resin.

As the polymerizable compound, an ethylenically unsaturated compound can also be used. Examples of the ethylenically unsaturated compound can be found in paragraphs "0033" and "0034" of JP2013-253224A, the content of which is incorporated herein by reference.

As the ethylenically unsaturated compound, ethyleneoxy-modified pentaerythritol tetraacrylate (as a commercially available product, NK ESTER ATM-35E manufactured by Shin-Nakamura Chemical Co., Ltd.), dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., A-DPH-12E, manufactured by Shin-Nakamura Chemical Co., Ltd.), or a compound having a structure in which the (meth)acryloyl group is bonded through an ethylene glycol residue or a propylene glycol residue is preferable. In addition, oligomers of the above-described examples can be used.

In addition, diglycerin ethylene oxide (EO)-modified (meth)acrylate (as a commercially available product, M-460 manufactured by Toagosei Co., Ltd.) is preferable. Pentaerythritol tetraacrylate (A-TMMT manufactured by Shin-Nakamura Chemical Co., Ltd.) or 1,6-hexanediol diacrylate (KAYARAD HDDA manufactured by Nippon Kayaku Co., Ltd.) is also preferable. Oligomers of the above-described examples can be used. For example, RP-1040 (manufactured by Nippon Kayaku Co., Ltd.) is used.

The ethylenically unsaturated compound may have an acid group such as a carboxy group, a sulfonate group, or a phosphate group.

Examples of the acid group and the ethylenically unsaturated compound include an ester of an aliphatic polyhydroxy compound and an unsaturated carboxylic acid. A compound having an acid group obtained by causing a nonaromatic carboxylic anhydride to react with an unreacted hydroxy group of an aliphatic polyhydroxy compound is preferable. In particular, it is more preferable that, in this ester, the aliphatic polyhydroxy compounds is pentaerythritol or dipentaerythritol. Examples of a commercially available product of the monomer having an acid group include M-510 and M-520 of ARONIX series as polybasic acid-modified acrylic oligomer (manufactured by Toagosei Co., Ltd.).

The acid value of the acid group and the ethylenically unsaturated compound is preferably 0.1 mgKOH/g to 40 mgKOH/g. The lower limit is more preferably 5 mgKOH/g or higher. The upper limit is more preferably 30 mgKOH/g or lower.

In the present disclosure, as the polymerizable compound, a compound having an epoxy group or an oxetanyl group can be used. Examples of the compound having an epoxy group or an oxetanyl group include a polymer having an epoxy group at a side chain and a monomer or an oligomer having two or more epoxy groups in a molecule. Examples of the compound include a bisphenol A epoxy resin, a bisphenol F epoxy resin, a phenol novolac epoxy resin, a cresol novolac epoxy resin, and an aliphatic epoxy resin. In addition, a monofunctional or polyfunctional glycidyl ether compound can also be used, and a polyfunctional aliphatic glycidyl ether compound is preferable.

The weight-average molecular weight is preferably 500 to 5,000,000 and more preferably 1,000 to 500,000.

As the compound, a commercially available product may be used, or a compound obtained by introducing an epoxy group into a side chain of the polymer may be used. Examples of the commercially available product include CYCLOMER P ACA 200M, CYCLOMER P ACA 230AA, CYCLOMER P ACA Z250, CYCLOMER P ACA Z251, CYCLOMER P ACA Z300, and CYCLOMER P ACA Z320 (all of which are manufactured by Daicel Corporation).

The content of the polymerizable compound is preferably 1 mass % to 90 mass % with respect to the total solid content of the composition. The lower limit is more preferably 5 mass % or higher, still more preferably 10 mass % or higher, and even still more preferably 20 mass % or higher. The upper limit is more preferably 80 mass % or lower, and still more preferably 75 mass % or lower.

As the polymerizable compound, one kind may be used alone, or two or more kinds may be used. In a case where two or more polymerizable compounds are used in combination, it is preferable that the total content of the two or more polymerizable compounds is in the above-described range.

(Polymerization Initiator)

It is preferable that the composition according to the embodiment of the present disclosure further includes a polymerization initiator in addition to the polymerizable compound. The composition according to the embodiment of the present disclosure can be suitably used as a negative type pattern-forming composition by including a polymerizable compound and a polymerization initiator.

The polymerization initiator may be a photopolymerization initiator or a thermal polymerization initiator and is preferably a photopolymerization initiator.

In addition, the polymerization initiator may be a radical polymerization initiator or a cationic polymerization initiator.

Examples of the photoradical polymerization initiator include: a halogenated hydrocarbon derivative (For example, a compound having a triazine skeleton or a compound having an oxadiazole skeleton); an acylphosphine compound such as acylphosphine oxide; an oxime compound such as hexaarylbiimidazole or an oxime derivative; an organic peroxide, a thio compound, a ketone compound, an aromatic onium salt, keto oxime ether, an aminoacetophenone compound, and hydroxyacetophenone. Examples of the halogenated hydrocarbon compound having a triazine skeleton include a compound described in Bull. Chem. Soc. Japan, 42, 2924 (1969) by Wakabayshi et al., a compound described in Great Britain Patent No. 1388492, a compound described in JP1978-133428A (JP-S53-133428A), a compound described in German Patent No. 3337024, a compound described in J. Org. Chem.; 29, 1527 (1964) by F. C. Schaefer et al., a compound described in JP1987-058241A (JP-S62-058241A), a compound described in JP1993-281728A (JP-H5-281728A), a compound described in JP1993-034920A (JP-S5-034920A), and a compound described in U.S. Pat. No. 4,212,976A.

In addition, from the viewpoint of exposure sensitivity, as the photoradical polymerization initiator, a compound selected from the group consisting of an oxime compound, a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, and a 3-aryl-substituted coumarin compound is preferable, and an oxime compound is more preferable.

Specific examples of the oxime compound include a compound described in JP2001-233842A, a compound described in JP2000-080068A, a compound described in JP2006-342166A, and a compound described in JP2016-021012A. In addition, examples of the oxime compound include a compound described in J.C.S. Perkin II (1979), pp. 1653-1660, J.C.S. Perkin II (1979), pp. 156-162 and Journal of Photopolymer Science and Technology (1995), pp. 202-232, JP2000-066385A, JP2000-080068A, JP2004-534797A, or JP2006-342166A.

As a commercially available product of the oxime compound, IRGACURE-OXE01, IRGACURE-OXE02, IRGACURE-OXE03, or IRGACURE-OXE04 (all of which are manufactured by BASF SE) can be preferably used. In addition, TR-PBG-304 (manufactured by Changzhou Tronly New Electronic Materials Co., Ltd.), ADEKA ARKLS NCI-831 (manufactured by Adeka Corporation), ADEKA ARKLS NCI-930 (manufactured by Adeka Corporation), or ADEKA OPTOMER N-1919 (manufactured by Adeka Corporation) can also be used.

In addition, in addition to the above-described oxime compounds, for example, a compound described in JP2009-519904A in which oxime is linked to an N-position of a carbazole ring, a compound described in U.S. Pat. No. 7,626,957B in which a hetero substituent is introduced into the benzophenone site, a compound described in JP2010-015025A or US2009/292039A in which a nitro group is introduced into a colorant site, a ketoxime compound described in WO2009/131189A, a compound described in U.S. Pat. No. 7,556,910B having a triazine skeleton and an oxime skeleton in the same molecule, a compound described in JP2009-221114A having an absorption maximum at 405 nm and having excellent sensitivity to a light source of g-rays may be used.

Other preferable examples of the oxime compound can be found in paragraphs "0274" to "0275" of JP2013-029760A, the content of which is incorporated herein by reference.

Specifically, as the oxime compound, a compound represented by the following Formula (OX-1) is preferable. In the oxime compound, an N—O bond of oxime may form an (E) isomer, a (Z) isomer, or a mixture of an (E) isomer and a (Z) isomer.

(OX-1)

In Formula (OX-1), $R^{O1}$ and $R^{O2}$ each independently represent a monovalent substituent, $R^{O3}$ represents a divalent organic group, and $Ar^{O1}$ represents an aryl group.

In Formula (OX-1), it is preferable that the monovalent substituent represented by $R^{O1}$ is a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. In addition, these groups may have one or more substituents. In addition, the above-described substituent may be further substituted with another substituent.

Examples of the substituent include a halogen atom, an aryloxy group, an alkoxycarbonyl group or aryloxycarbonyl group, an acyloxy group, an acyl group, an alkyl group, and an aryl group.

In Formula (OX-1), as the monovalent substituent represented by $R^{O2}$, an aryl group, a heterocyclic group, an arylcarbonyl group, or a heterocyclic carbonyl group is preferable. These groups may have one or more substituents. Examples of the substituent are as described above.

In Formula (OX-1), as the divalent organic group represented by $R^{O3}$, an alkylene group having 1 to 12 carbon atoms, a cycloalkylene group, or an alkynylene group is preferable. These groups may have one or more substituents. Examples of the substituent are as described above.

A compound represented by the following Formula (X-1) or (X-2) can also be used as the photopolymerization initiator.

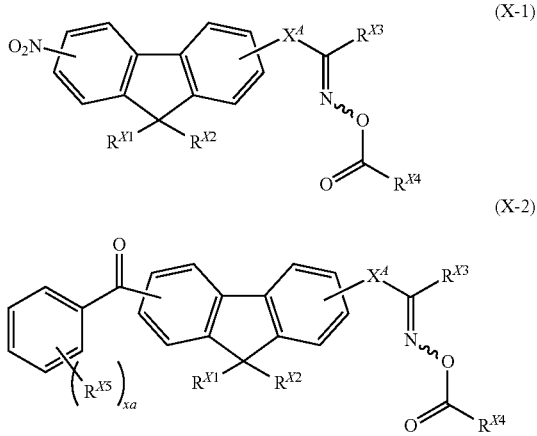

In Formula (X-1), $R^{X1}$ and $R^{X2}$ each independently represent an alkyl group having 1 to 20 carbon atoms, an alicyclic hydrocarbon group having 4 to 20 carbon atoms, an aryl group having 6 to 30 carbon atoms, or an arylalkyl group having 7 to 30 carbon atoms; in a case where $R^{X1}$ and $R^{X2}$ represent a phenyl group, the phenyl groups may be bonded to each other to form a fluorene group; $R^{X3}$ and $R^{X4}$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 4 to 20 carbon atoms; and $X^A$ represents a single bond or a carbonyl group.

In Formula (X-2), $R^{X1}$, $R^{X2}$, $R^{X3}$, and $R^{X4}$ have the same definitions as those of $R^{X1}$, $R^{X2}$, $R^{X3}$, and $R^{X4}$ in Formula (X-1), $R^{X5}$ represents $—R^{X6}$, $—OR^{X6}$, $—SR^{X6}$, $—COR^{X6}$, $—CONR^{X6}R^{X6}$, $—NR^{X6}COR^{X6}$, $—OCOR^{X6}—COOR^{X6}—$ $SCOR^{X6}—OCSR^{X6}—COSR^{X6}—CSOR^{X6}—CN$, a halogen atom, or a hydroxy group, $R^{X6}$ represents an alkyl group having 1 to 20 carbon atoms, an aryl group having 6 to 30 carbon atoms, an arylalkyl group having 7 to 30 carbon atoms, or a heterocyclic group having 4 to 20 carbon atoms, $X^A$ represents a single bond or a carbonyl group, and xa represents an integer of 0 to 4.

In Formulae (X-1) and (X-2), it is preferable that $R^1$ and $R^2$ each independently represent a methyl group, an ethyl group, an n-propyl group, i-propyl, a cyclohexyl group, or a phenyl group. It is preferable that $R^{X3}$ represents a methyl group, an ethyl group, a phenyl group, a tolyl group, or a xylyl group. It is preferable that $R^{X4}$ represents an alkyl group having 1 to 6 carbon atoms or a phenyl group. It is preferable that $R^{X5}$ represents a methyl group, an ethyl group, a phenyl group, a tolyl group, or a naphthyl group. It is preferable that $X^A$ represents a single bond.

Specific examples of the compounds represented by Formulae (X-1) and (X-2) include compounds described in paragraphs "0076" to "0079" of JP2014-137466A. The content is incorporated herein by reference.

As the photopolymerization initiator, an oxime compound having a nitro group can be used. It is preferable that the oxime compound having a nitro group is a dimer. Specific examples of the oxime compound having a nitro group include compounds described in paragraphs "0031" to "0047" of JP2013-114249A and paragraphs "0008" to "0012" and "0070" to "0079" of JP2014-137466A, paragraphs "0007" to 0025" of JP4223071B, and ADEKA ARKLS NCI-831 (both of which are manufactured by Adeka Corporation).

The oxime compound preferably has a maximum absorption wavelength in a wavelength range of 350 nm to 500 nm, more preferably has an absorption wavelength in a wavelength range of 360 nm to 480 nm, and still more preferably has a high absorbance at 365 nm and 405 nm.

The molar absorption coefficient of the oxime compound at 365 nm or 405 nm is preferably 1,000 to 300,000, more preferably 2,000 to 300,000, and still more preferably 5,000 to 200,000 from the viewpoint of sensitivity.

The molar absorption coefficient of the compound can be measured using a well-known method. For example, it is preferable that the molar absorption coefficient is measured using an ultraviolet-visible spectrophotometer (Cary-5 spectrophotometer, manufactured by Varian Medical Systems, Inc.) and ethyl acetate as a solvent at a concentration of 0.01 g/L.

Specific examples of the oxime compound which are preferably used in the present disclosure are shown below, but the present disclosure is not limited thereto.

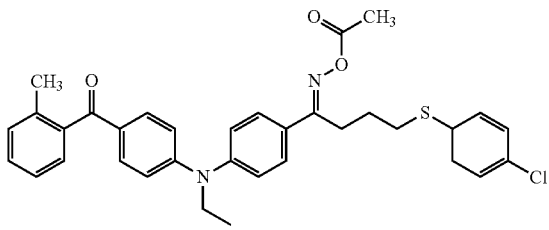

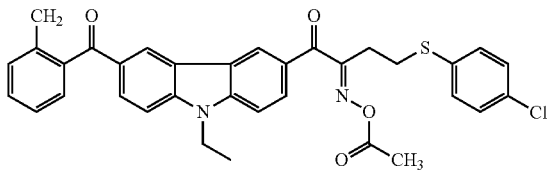

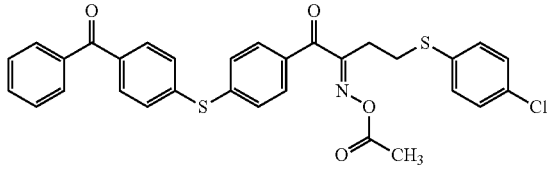

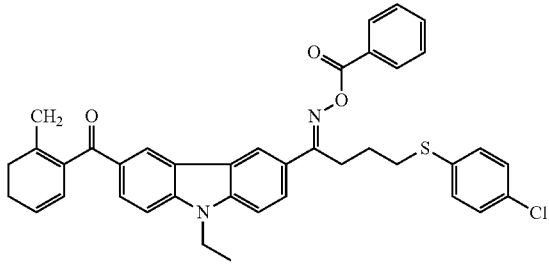

(C-5)
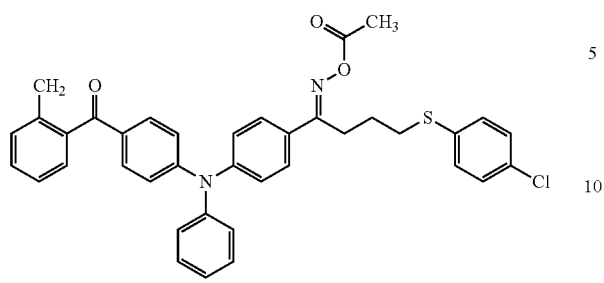

(C-6)
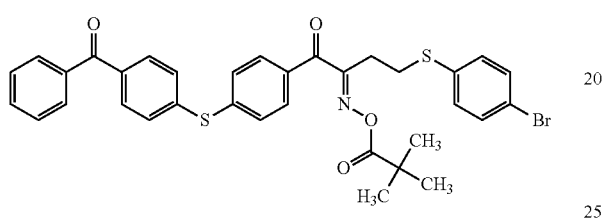

(C-7)
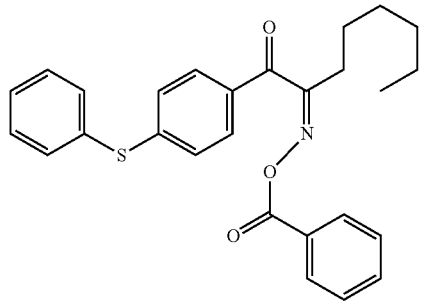

(C-8)
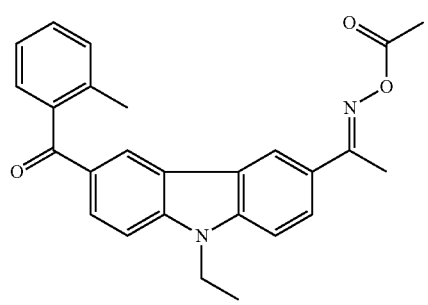

(C-9)
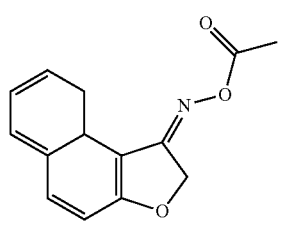

(C-10)
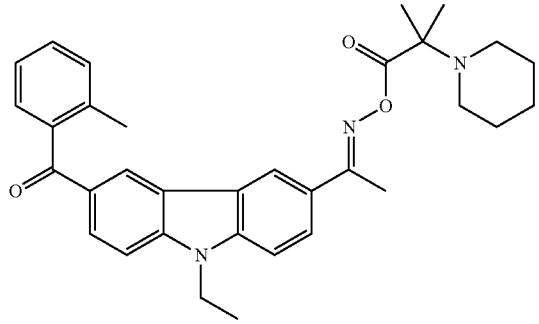

(C-11)

(C-12)

Examples of the $OC_9F_{17}$ in (C-12) shown above include the following groups.

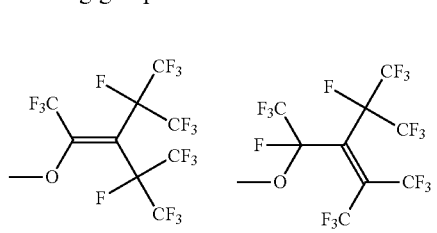

As the photopolymerization initiator, an oxime compound having a fluorine atom can also be used. Specific examples of the oxime compound having a fluorine atom include a compound described in JP2010-262028A, Compound 24 and 36 to 40 described in JP2014-500852A, and Compound (C-3) described in JP2013-164471A. The content is incorporated herein by reference.

Examples of the photocationic polymerization initiator include a photoacid generator. Examples of the photoacid generator include compounds which are decomposed by light irradiation to generate an acid including: an onium salt compound such as a diazonium salt, a phosphonium salt, a sulfonium salt, or an iodonium salt; and a sulfonate compound such as imidosulfonate, oximesulfonate, diazodisulfone, disulfone, or o-nitrobenzyl sulfonate. The details of the photocationic polymerization initiator can be found in paragraphs "0139" to "0214" of JP2009-258603A, the content of which is incorporated herein by reference.

As the photocationic polymerization initiator, a commercially available product can also be used. Examples of the commercially available product of the photocationic polymerization initiator include ADEKA ARKLS SP series manufactured by Adeka Corporation (for example, ADEKA ARKLS SP-606) and IRGACURE 250, IRGACURE 270, and IRGACURE 290 manufactured by BASF SE.

The content of the polymerization initiator is preferably 0.01 mass % to 30 mass % with respect to the total solid content of the composition. The lower limit is more preferably 0.1 mass % or higher and still more preferably 0.5 mass % or higher. The upper limit is more preferably 20 mass % or lower, and still more preferably 15 mass % or lower.

As the polymerization initiator, one kind or two or more kinds may be used. In a case where two or more polymerization initiators are used, it is preferable that the total content of the two or more polymerization initiators is in the above-described range.

(Photoacid Generator)

It is preferable that the composition according to the embodiment of the present disclosure further includes a photoacid generator. In particular, in a case where the composition according to the embodiment of the present disclosure is a positive type pattern-forming composition, it is more preferable that the composition includes a photoacid generator.

It is preferable that the photoacid generator is a compound that reacts with an actinic ray having a wavelength of 300 nm or longer and preferably 300 to 450 nm to produce an acid. In addition, even a photoacid generator that does not directly react with an actinic ray having a wavelength of 300 nm or longer can be preferably used in combination with a sensitizer as long as it is a compound that reacts with an actinic ray having a wavelength of 300 nm or longer to produce an acid by using a sensitizer in combination.

As the photoacid generator, a photoacid generator that generates an acid having a pKa of 4 or lower is preferable, a photoacid generator that generates an acid having a pKa of 3 or lower is more preferable, and a photoacid generator that generates an acid having a pKa of 2 or lower is still more preferable. In the present disclosure, basically, pKa refers to a value measured in water at 25° C. In a case where the pKa of a photoacid generator cannot be measured in water, the pKa refers to a value measured in a solvent that is suitable for the measurement. Specifically, the pKa described in Handbook of Chemistry or the like can be referred to. As the acid having a pKa of 4 or lower, sulfonic acid or phosphonic acid is preferable, and sulfonic acid is more preferable.

Examples of the photoacid generator include an onium salt compound, a trichloromethyl-s-triazine, a sulfonium salt, an iodonium salt, a quaternary ammonium salt, a diazomethane compound, an imide sulfonate compound, and an oxime sulfonate compound. Among these, an onium salt compound, an imide sulfonate compound, or an oxime sulfonate compound is preferable, an onium salt compound or an oxime sulfonate compound is more preferable, and an oxime sulfonate compound is still more preferable. The details of the photoacid generator can be found in paragraphs "0082" to "0172" of JP2011-221494A, paragraphs "0084" to "0122" of JP2016-189006A, and paragraphs "0440" to "0509" of WO2016/136481A, the contents of which are incorporated herein by reference. As the sulfonium salt, a compound having the following structure can also be used.

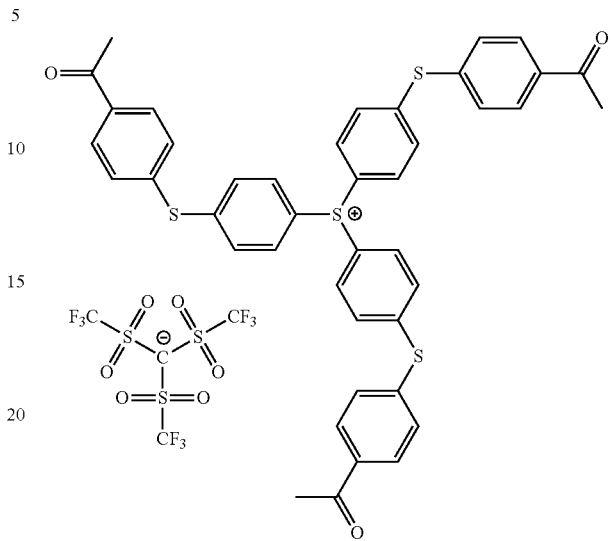

Preferable examples of the oxime sulfonate compound include a compound having an oxime sulfonate structure represented by the following Formula (OS-1).

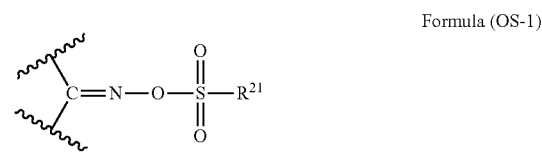

Formula (OS-1)

In Formula (OS-1), $R^{21}$ represents an alkyl group or an aryl group, and a wave line portion represents a direct bond to another group or an atom constituting the oxime sulfonate compound.

The alkyl group or the aryl group represented by $R^{21}$ in Formula (OS-1) may have a substituent or may be unsubstituted. In a case where $R^{21}$ represents an alkyl group, it is preferable that $R^{21}$ represents a linear or branched alkyl group having 1 to 10 carbon atoms. The alkyl group represented by $R^{21}$ may be substituted with a halogen atom, an aryl group having 6 to 11 carbon atoms, an alkoxy group having 1 to 10 carbon atoms, or a cyclic alkyl group (including a bridged alicyclic group such as a 7,7-dimethyl-2-oxonorbornyl group; preferably a bicycloalkyl group). In a case where $R^{21}$ represents an aryl group, $R^{21}$ represents preferably an aryl group having 6 to 11 carbon atoms and more preferably a phenyl group or a naphthyl group. The aryl group represented by $R^{21}$ may be substituted with an alkyl group, an alkoxy group, or a halogen atom. The details of the compound having an oxime sulfonate structure represented by Formula (OS-1) can be found in paragraphs "0071" to "0087" of WO2015/033879A and paragraphs "0108" to "0133" of JP2014-238438A, the contents of which are incorporated herein by reference. Specific examples of the compound having an oxime sulfonate structure represented by Formula (OS-1) include a compound having the following structure.

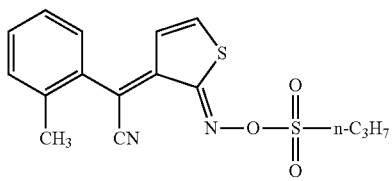

The content of the photoacid generator is preferably 0.1 mass % to 20 mass % with respect to the total solid content of the pattern-forming composition. For example, the lower limit is more preferably 0.2 mass % or higher and still more preferably 0.5 mass % or higher. For example, the upper limit is more preferably 10 mass % or lower and still more preferably 5 mass % or lower.

(Chromatic Colorant, Black Colorant, Colorant that Shields Visible Light)

The composition according to the present disclosure may include at least one selected from the group consisting of a chromatic colorant and a black colorant (hereinafter, a chromatic colorant and a black colorant will also be collectively called "visible colorant"). In the present disclosure, "chromatic colorant" denotes a colorant other than a white colorant and a black colorant. It is preferable that the chromatic colorant is a colorant having an absorption in a wavelength range of 400 nm or longer and shorter than 650 nm.

—Chromatic Colorant—

In the present disclosure, the chromatic colorant may be a pigment or a dye.

It is preferable that an average particle size (r) of the pigment satisfies preferably 20 nm≤r≤300 nm, more preferably 25 nm≤r≤250 nm, and still more preferably 30 nm≤r≤200 nm. "Average particle size" described herein denotes the average particle size of secondary particles which are aggregates of primary particles of the pigment.

In addition, regarding a particle size distribution of the secondary particles of the pigment (hereinafter, simply referred to as "particle size distribution") which can be used, it is preferable that secondary particles having a particle size of (average particle size±100) nm account for 70 mass % or higher, preferably, 80 mass % or higher in the pigment. The particle size distribution of the secondary particles can be measured using a scattering intensity distribution.

The average particle size of primary particles can be obtained by observing a pigment with a scanning electron microscope (SEM) or a transmission electron microscope (TEM), measuring particle sizes of 100 particles in a region where particles do not aggregate, and obtaining an average value of the measured particle sizes.

As the pigment, an organic pigment is preferable. Examples of the pigment are as follows. However, the present disclosure is not limited to the examples.

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

Among these pigments, one kind may be used alone, or two or more kinds may be used in combination.

As the dye, well-known dyes can be used without any particular limitation. In terms of a chemical structure, a dye such as a pyrazole azo dye, an anilino azo dye, a triphenylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, or a pyrromethene dye can be used. In addition, a polymer of the above-described dyes may be used. In addition, dyes described in JP2015-028144A and JP2015-34966A can also be used.

In addition, as the dye, at least one of an acid dye or a derivative thereof may be suitably used. Furthermore, for example, at least one of a direct dye, a basic dye, a mordant dye, an acid mordant dye, an azoic dye, a dispersed dye, an oil-soluble dye, a food dye, or a derivative thereof can be suitably used.

Specific examples of the acid dye are shown below, but the present disclosure is not limited to these examples. For example, the following dyes and derivatives thereof can be used:

acid alizarin violet N;
acid blue 1, 7, 9, 15, 18, 23, 25, 27, 29, 40 to 45, 62, 70, 74, 80, 83, 86, 87, 90, 92, 103, 112, 113, 120, 129, 138, 147, 158, 171, 182, 192, 243, and 324:1;
acid chrome violet K;
acid Fuchsin and acid green 1, 3, 5, 9, 16, 25, 27, and 50;
acid orange 6, 7, 8, 10, 12, 50, 51, 52, 56, 63, 74, and 95;
acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266, and 274;
acid violet 6B, 7, 9, 17, and 19;
acid yellow 1, 3, 7, 9, 11, 17, 23, 25, 29, 34, 36, 42, 54, 72, 73, 76, 79, 98, 99, 111, 112, 114, 116, 184, and 243; and
Food Yellow 3.

In addition to the above-described examples, an azo acid dye, a xanthene acid dye, and a phthalocyanine acid dye are preferably used, and acid dyes, such as C.I. Solvent Blue 44 and 38, C.I. Solvent Orange 45, Rhodamine B, and Rhodamine 110 and derivatives of the dyes are also preferably used.

Among these, it is preferable that the dye is a colorant selected from the group consisting of a triarylmethane dye, an anthraquinone dye, an azomethine dye, a benzylidene dye, an oxonol dye, a cyanine dye, a phenothiazine dye, a pyrrolopyrazole azomethine dye, a xanthene dye, a phthalocyanine dye, a benzopyran dye, an indigo dye, a pyrazole azo dye, an anilino azo dye, a pyrazolotriazole azo dye, a pyridone azo dye, an anthrapyridone dye, and a pyrromethene dye.

Further, a combination of a pigment and a dye may be used.

—Black Colorant—

It is preferable that the black colorant is an organic black colorant. In the present disclosure, the black colorant as the colorant that shields visible light denotes a material that absorbs visible light and allows transmission of at least a part of infrared light. Accordingly, in the present disclosure, examples of the black colorant as the colorant that shields visible light do not include carbon black and titanium black. As the black colorant as the colorant that shields visible light, for example, a bisbenzofuranone compound, an azomethine compound, a perylene compound, or an azo compound can also be used.

Examples of the bisbenzofuranone compound include compounds described in JP2010-534726A, JP2012-515233A, and JP2012-515234A. For example, "Irgaphor Black" (manufactured by BASF SE) is available.

Examples of the perylene compound include C.I. Pigment Black 31 and 32.

Examples of the azomethine compound include compounds described in JP1989-170601A (JP-H1-170601A) and JP1990-034664A (JP-H2-034664A). For example, "CHROMOFINE BLACK A1103" (manufactured by Dainichiseika Color & Chemicals Mfg. Co., Ltd.) is available. The azo compound is not particularly limited, and for example, a compound represented by the following Formula (A-1) can be suitably used.

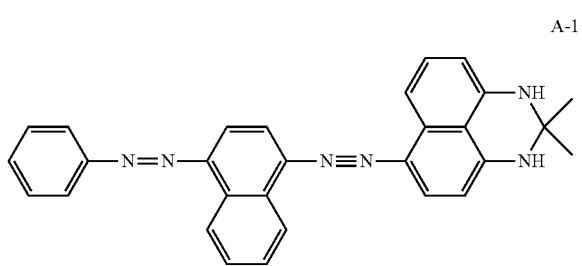

A-1

—Colorant that Shields Visible Light—

In a case where an infrared transmitting filter that allows transmission of infrared light in a range that is not absorbed by the infrared absorbing colorant to be included is manufactured using the composition according to the embodiment of the present disclosure, it is preferable that the composition includes the colorant that shields visible light.

In addition, it is preferable that black, gray, or a color similar to black or gray is exhibited using a combination of a plurality of colorants that shields visible light.

In addition, it is preferable that the colorant that shields visible light is a material that absorbs light in a wavelength range of violet to red.

In addition, it is preferable that the colorant that shields visible light is a colorant that shields light in a wavelength range of 450 nm to 650 nm.

In the present disclosure, it is preferable that the colorant that shields visible light satisfies at least one of the following requirement (1) or (2), and it is more preferable that the coloring material that shields visible light satisfies the requirement (1).

(1): An aspect in which the colorant that shields visible light includes two or more chromatic colorants (2): An aspect in which the colorant that shields visible light includes a black colorant In addition, in the present disclosure, the black colorant as the colorant that shields visible light denotes a material that absorbs visible light and allows transmission of at least a part of infrared light. Accordingly, in the present disclosure, the organic black colorant as the colorant that shields visible light does not denote a black colorant that absorbs both visible light and infrared light, for example, carbon black or titanium black.

It is preferable that the colorant that shields visible light is a material in which a ratio A/B of a minimum value A of an absorbance in a wavelength range of 450 nm to 650 nm to a minimum value B of an absorbance in a wavelength range of 900 nm to 1,300 nm is 4.5 or higher.

The above-described characteristics may be satisfied using one material alone or using a combination of a plurality of materials. For example, in the aspect (1), it is preferable that the spectral characteristics are satisfied using a combination of a plurality of chromatic colorants.

In a case where the colorant that shields visible light includes two or more chromatic colorants, it is preferable that the chromatic colorants are selected from the group consisting of a red colorant, a green colorant, a blue colorant, a yellow colorant, a violet colorant, and an orange colorant.

In a case where the colorant that shields visible light is formed using a combination of two or more chromatic colorants, examples of the combination of chromatic colorants are as follows.

(1) An aspect in which the colorant that shields visible light includes a yellow colorant, a blue colorant, a violet colorant, and a red colorant (2) An aspect in which the colorant that shields visible light includes a yellow colorant, a blue colorant, and a red colorant (3) An aspect in which the colorant that shields visible light includes a yellow colorant, a violet colorant, and a red colorant (4) An aspect in which the colorant that shields visible light includes a yellow colorant and a violet colorant (5) An aspect in which the colorant that shields visible light includes a green colorant, a blue colorant, a violet colorant, and a red colorant (6) An aspect in which the colorant that shields visible light includes a violet colorant and an orange colorant (7) An aspect in which the colorant that shields visible light includes a green colorant, a violet colorant, and a red colorant (8) An aspect in which the colorant that shields light in the visible range includes a green colorant and a red colorant Specific examples of the aspect (1) include C.I. Pigment Yellow 139 or 185 as a yellow pigment, C.I. Pigment Blue 15:6 as a blue pigment, C.I. Pigment Violet 23 as a violet pigment, and C.I. Pigment Red 254 or 224 as a red pigment.

Specific examples of the aspect (2) include C.I. Pigment Yellow 139 or 185 as a yellow pigment, C.I. Pigment Blue 15:6 as a blue pigment, and C.I. Pigment Red 254 or 224 as a red pigment.

Specific examples of the aspect (3) include C.I. Pigment Yellow 139 or 185 as a yellow pigment, C.I. Pigment Violet 23 as a violet pigment, and C.I. Pigment Red 254 or 224 as a red pigment.

Specific examples of the aspect (4) include C.I. Pigment Yellow 139 or 185 as a yellow pigment, and C.I. Pigment Violet 23 as a violet pigment.

Specific examples of the aspect (5) include C.I. Pigment Green 7 or 36 as a green pigment, C.I. Pigment Blue 15:6 as a blue pigment, C.I. Pigment Violet 23 as a violet pigment, and C.I. Pigment Red 254 or 224 as a red pigment.

Specific examples of the aspect (6) include C.I. Pigment Violet 23 as a violet pigment, and C.I. Pigment Orange 71 as an orange pigment.

Specific examples of the aspect (7) include C.I. Pigment Green 7 or 36 as a green pigment, C.I. Pigment Violet 23 as a violet pigment, and C.I. Pigment Red 254 or 224 as a red pigment.

Specific examples of the aspect (8) include C.I. Pigment Green 7 or 36 as a green pigment, and C.I. Pigment Red 254 or 224 as a red pigment.

For example, ratios (mass ratios) between the respective colorants are as follows.

| No. | Yellow Colorant | Green Colorant | Blue Colorant | Violet Colorant | Red Colorant | Orange Colorant |
|-----|-----------------|----------------|---------------|-----------------|--------------|-----------------|
| 1 | 0.1 to 0.4 | | 0.1 to 0.6 | 0.01 to 0.3 | 0.1 to 0.6 | |
| 2 | 0.1 to 0.4 | | 0.1 to 0.6 | | 0.2 to 0.7 | |
| 3 | 0.1 to 0.6 | | | 0.1 to 0.6 | 0.1 to 0.6 | |
| 4 | 0.2 to 0.8 | | | | 0.2 to 0.8 | |
| 5 | | 0.1 to 0.4 | 0.1 to 0.4 | 0.1 to 0.4 | 0.1 to 0.4 | |
| 6 | | | | | 0.2 to 0.6 | 0.4 to 0.8 |
| 7 | | 0.1 to 0.5 | | 0.2 to 0.7 | 0.1 to 0.4 | |
| 8 | | 0.5 to 0.8 | | | 0.2 to 0.5 | |

In a case where the composition according to the embodiment of the present disclosure includes a visible colorant, the content of the visible colorant is preferably 0.01 mass % to 50 mass % with respect to the total solid content of the composition. The lower limit is more preferably 0.1 mass % or higher and still more preferably 0.5 mass % or higher. The upper limit is more preferably 30 mass % or lower, and still more preferably 15 mass % or lower.

The content of the visible colorant is preferably 10 parts by mass to 1,000 parts by mass and more preferably 50 parts by mass to 800 parts by mass with respect to 100 parts by mass of the infrared absorbing colorant.

(Silane Coupling Agent)

The composition according to the embodiment of the present disclosure may include a silane coupling agent. In the present disclosure, the silane coupling agent refers to a silane compound having a functional group other than a hydrolyzable group. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group. Among these, an alkoxy group is preferable. That is, it is preferable that the silane coupling agent is a compound having an alkoxysilyl group. In addition, it is preferable that the functional group other than a hydrolyzable group is a group which interacts with the resin or the like or forms a bond with the resin or the like to exhibit affinity. Examples of the functional group other than a hydrolyzable group include a vinyl group, a styryl group, a (meth)acryloyl group, a mercapto group, an epoxy group, an oxetanyl group, an amino group, an ureido group, a sulfide group, and an isocyanate group. Among these, a (meth)acryloyl group or an epoxy group is preferable. In addition, examples of the silane coupling agent include a compound described in paragraphs "0018" to "0036" of JP2009-288703A, a compound described in paragraphs "0056" to "0066" of JP2009-242604A, and a compound described in paragraphs "0229" to "0236" of WO2015/166779A, the content of which is incorporated herein by reference.

The content of the silane coupling agent is preferably 0.01 mass % to 15.0 mass % and more preferably 0.05 mass % to 10.0 mass % with respect to the total solid content of the composition. As the silane coupling agent, one kind may be used alone, or two or more kinds may be used. In a case where two or more antioxidants are used in combination, it is preferable that the total content of the antioxidants is in the above-described range.

(Surfactant)

The composition according to the embodiment of the present disclosure may include a surfactant from the viewpoint of further improving application properties. As the surfactants, various surfactants such as a fluorine surfactant, a nonionic surfactant, a cationic surfactant, an anionic surfactant, or a silicone surfactant can be used. The details of the surfactant can be found in paragraphs "0238" to "0245" of WO2015/166779A, the content of which is incorporated herein by reference.

By the composition according to the embodiment of the present disclosure containing a fluorine surfactant, liquid characteristics (for example, fluidity) of a coating solution prepared from the coloring composition are further improved, and the uniformity in coating thickness and liquid saving properties can be further improved. In addition, a film having a uniform thickness with reduced unevenness in thickness can be formed more suitably.

The fluorine content in the fluorine surfactant is preferably 3 mass % to 40 mass %, more preferably 5 mass % to 30 mass %, and still more preferably 7 mass % to 25 mass %. The fluorine surfactant in which the fluorine content is in the above-described range is effective from the viewpoints of the uniformity in the thickness of the coating film and liquid saving properties, and the solubility thereof in the composition is also excellent.

Specific examples of the fluorine surfactant include a surfactant described in paragraphs "0060" to "0064" of JP2014-041318A (paragraphs "0060" to "0064" of corresponding WO2014/017669A) and a surfactant described in paragraphs "0117" to "0132" of JP2011-132503A, the contents of which are incorporated herein by reference. Examples of a commercially available product of the fluorine surfactant include: MEGAFACE F171, F172, F173, F176, F177, F141, F142, F143, F144, R30, F437, F475, F479, F482, F554, and F780 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.).

In addition, as the fluorine surfactant, an acrylic compound in which, in a case where heat is applied to a molecular structure which has a functional group having a fluorine atom, the functional group having a fluorine atom is cut and a fluorine atom is volatilized can also be preferably used. Examples of the fluorine surfactant include MEGAFACE DS series (manufactured by DIC Corporation, The Chemical Daily, Feb. 22, 2016, Nikkei Business Daily, Feb. 23, 2016), for example, MEGAFACE DS-21.

As the fluorine surfactant, a block polymer can also be used. Examples of the block polymer include a compound described in JP2011-089090A. As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group).

The weight-average molecular weight of the block polymer is preferably 3,000 to 50,000.

In addition, as the fluorine surfactant, a fluorine-containing polymer having an ethylenically unsaturated group at a side chain can also be used. Specific examples include compounds described in paragraphs "0050" to "0090" and paragraphs "0289" to "0295" of JP2010-164965A, for example, MEGAFACE RS-101, RS-102, RS-718K, and RS-72-K manufactured by DIC Corporation. As the fluorine surfactant, a compound described in paragraphs "0015" to "0158" of JP2015-117327A can also be used.

Examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC L10, L31, L61, L62, 10R5, 17R2, and 25R2 (manufactured by BASF SE), TETRONIC 304, 701, 704, 901, 904, and 150R1 (manufactured by BASF SE)), SOLSPERSE 20000 (manufactured by Lubrication Technology Inc.), NCW-101, NCW-1001, and NCW-1002 (all of which are manufactured by Wako Pure Chemical Industries, Ltd.), PIONIN D-6112, D-6112-W, and D-6315 (all of which are manufactured by Takemoto Oil&Fat Co., Ltd.), and OLFINE E1010, SURFYNOL 104, 400, and 440 (all of which are manufactured by Nissin Chemical Co., Ltd.).

The content of the surfactant is preferably 0.001 mass % to 5.0 mass % and more preferably 0.005 to 3.0 mass % with respect to the total solid content of the composition. As the surfactant, one kind may be used alone, or two or more kinds may be used. In a case where two or more surfactants are used in combination, it is preferable that the total content of the two or more surfactants is in the above-described range.

(Ultraviolet Absorber)

It is preferable that the composition according to the embodiment of the present disclosure further includes an ultraviolet absorber. Examples of the ultraviolet absorber include conjugated diene compound and a diketone compound. Among these, a conjugated diene compound is preferable. As the conjugated diene compound, a compound represented by the following Formula (UV-1) is more preferable.

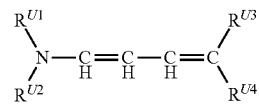

(UV-1)

In Formula (UV-1), $R^{U1}$ and $R^{U2}$ each independently represent a hydrogen atom, an alkyl group having 1 to 20 carbon atoms, or an aryl group having 6 to 20 carbon atoms, and may be the same as or different from each other but does not represent a hydrogen atom at the same time.

$R^{U1}$ and $R^{U2}$ may form a cyclic amino group with a nitrogen atom bonded to $R^{U1}$ and $R^{U2}$. Examples of the cyclic amino group include a piperidino group, a morpholino group, a pyrrolidino group, a hexahydroazepino group, and a piperazino group.

$R^{U1}$ and $R^{U2}$ each independently represent preferably an alkyl group having 1 to 20 carbon atoms, more preferably an alkyl group having 1 to 10 carbon atoms, and still more preferably an alkyl group having 1 to 5 carbon atoms.

$R^{U3}$ and $R^{U4}$ represent an electron-withdrawing group. $R^{U3}$ and $R^{U4}$ represent preferably an acyl group, a carbamoyl group, an alkyloxycarbonyl group, an aryloxycarbonyl group, a cyano group, a nitro group, an alkylsulfonyl group, an arylsulfonyl group, a sulfonyloxy group, or a sulfamoyl group, and more preferably an acyl group, a carbamoyl group, an alkyloxycarbonyl group, an aryloxycarbonyl group, a cyano group, an alkylsulfonyl group, an arylsulfonyl group, a sulfonyloxy group, or a sulfamoyl group. In addition, $R^{U3}$ and $R^{U4}$ may be bonded to each other to form a cyclic electron-withdrawing group. Examples of the cyclic electron-withdrawing group which is formed by $R^{U3}$ and $R^{U4}$ being bonded to each other include a 6-membered ring having two carbonyl groups.

At least one of $R^{U1}$, $R^{U2}$, $R^{U3}$, or $R^{U4}$ may represent a polymer obtained from a monomer which is bonded to a vinyl group through a linking group. At least one of $R^{U1}$, $R^{U2}$, $R^{U3}$, or $R^{U4}$ may represent a copolymer obtained from the above polymer and another monomer.

The description of the substituent of the ultraviolet absorber represented by Formula (UV-1) can be found in paragraph "0320" to "0327" of JP2013-068814A, the content of which is incorporated herein by reference. Examples of a commercially available product of the ultraviolet absorber represented by Formula (UV-1) include UV503 (manufactured by Daito Chemical Co., Ltd.).

As the diketone compound used as the ultraviolet absorber, a compound represented by the following Formula (UV-2) is preferable.

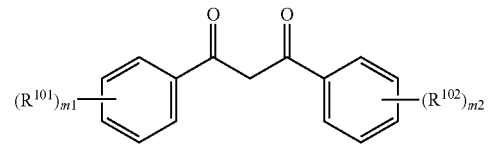

(UV-2)

In Formula (UV-2), $R^{101}$ and $R^{102}$ each independently represent a substituent, and m1 and m2 each independently represent an integer of 0 to 4. Examples of the substituent include an alkyl group, an alkenyl group, an aryl group, a heteroaryl group, an alkoxy group, an aryloxy group, a heteroaryloxy group, an acyl group, an alkoxycarbonyl group, an aryloxycarbonyl group, a heteroaryloxycarbonyl group, an acyloxy group, an amino group, an acylamino group, an alkoxycarbonylamino group, an aryloxycarbonylamino group, a heteroaryloxycarbonylamino group, a sulfonylamino group, a sulfamoyl group, a carbamoyl group, an alkylthio group, an arylthio group, a heteroarylthio group, an alkylsulfonyl group, an arylsulfonyl group, a heteroarylsulfonyl group, an alkylsulfinyl group, an arylsulfinyl group, a heteroarylsulfinyl group, an ureido group, a phosphoric amide group, a mercapto group, a sulfo group, a carboxy group, a nitro group, a hydroxamic acid group, a sulfino group, a hydrazino group, an imino group, a silyl group, a hydroxy group, a halogen atom, and a cyano group. Among these, an alkyl group or an alkoxy group is preferable.

The number of carbon atoms in the alkyl group is preferably 1 to 20. The alkyl group is, for example, linear, branched, or cyclic, and is preferably linear or branched and more preferably branched.

The number of carbon atoms in the alkoxy group is preferably 1 to 20. The alkoxy group is, for example, linear, branched, or cyclic, and is preferably linear or branched and more preferably branched.

A combination in which one of $R^{101}$ and $R^{102}$ represents an alkyl group and the other one of $R^{101}$ and $R^{102}$ represents an alkoxy group is preferable.

m1 and m2 each independently represent preferably an integer of 0 to 2, more preferably 0 or 1, and still more preferably 1.

Examples of the compound represented by Formula (UV-2) include the following compound.

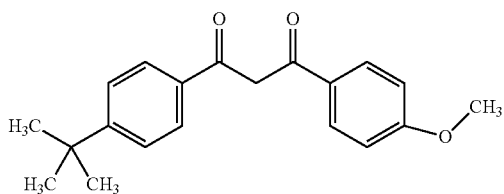 [SMILES: COc1ccc(C(=O)CC(=O)c2ccc(C(C)(C)C)cc2)cc1]

As the ultraviolet absorber, UVINUL A (manufactured by BASF SE) can also be used. In addition, as the ultraviolet absorber, an ultraviolet absorber such as an amino diene compound, a salicylate compound, a benzophenone compound, a benzotriazole compound, an acrylonitrile compound, or a triazine compound can be preferably used. Specifically, a compound described in JP2013-068814A can be used. As the benzotriazole compound, MYUA series (manufactured by Miyoshi Oil&Fat Co., Ltd.; The Chemical Daily, Feb. 1, 2016) may be used.

The content of the ultraviolet absorber is preferably 0.01 mass % to 10 mass % and more preferably 0.01 mass % to 5 mass % with respect to the mass of the total solid content of the composition.

(Polymerization Inhibitor)

The composition according to the embodiment of the present disclosure may include a polymerization inhibitor. Examples of the polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), and N-nitrosophenylhydroxyamine salt (for example, an ammonium salt or a cerium (III) salt). Among these, p-methoxyphenol is preferable. The polymerization inhibitor may also function as an antioxidant. The content of the polymerization inhibitor is preferably 0.01 mass % to 5 mass % with respect to the total solid content of the composition.

(Other Components)

Optionally, the composition according to the embodiment of the present disclosure may further include a sensitizer, a crosslinking agent, a curing accelerator, a filler, a thermal curing accelerator, a plasticizer, and other auxiliary agents (for example, conductive particles, a filler, an antifoaming agent, a flame retardant, a leveling agent, a peeling accelerator, an antioxidant, an aromatic chemical, a surface tension adjuster, or a chain transfer agent). By the infrared absorbing composition appropriately including the components, desired stability, film properties, and the like of an optical filter such as an infrared cut filter can be adjusted. The details of the components can be found in, for example, paragraph "0183" of JP2012-003225A (corresponding to paragraph "0237" of US2013/0034812A) and paragraphs "0101" to "0104" and "0107" to "0109" of JP2008-250074A, the contents of which are incorporated herein by reference.

As the antioxidant, for example, a phenol compound, a phosphorus compound, (for example, a compound described in paragraph "0042" of JP2011-090147A), or a thioether compound can be used. Examples of a commercially available product of the antioxidant include ADEKA STAB series (AO-20, AO-30, AO-40, AO-50, AO-50F, AO-60, AO-60G, AO-80, and AO-330, manufactured by Adeka Corporation). The content of the antioxidant is preferably 0.01 mass % to 20 mass % and more preferably 0.3 mass % to 15 mass % with respect to the total solid content of the composition. As the antioxidant, one kind may be used alone, or two or more kinds may be used. In a case where two or more antioxidants are used in combination, it is preferable that the total content of the antioxidants is in the above-described range.

(Preparation of Composition)

The composition according to the embodiment of the present disclosure can be prepared by mixing the above-described various components. In addition, It is preferable that the composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (having a high density and an ultrahigh molecular weight) such as polyethylene or polypropylene (PP). Among these materials, polypropylene (including high-density polypropylene) or nylon is preferable.

The pore size of the filter is preferably 0.01 μm to 7.0 μm, more preferably 0.01 μm to 3.0 μm, and still more preferably 0.05 μm to 0.5 m. In the above-described range, fine foreign matter, which inhibits preparation of a fine and smooth composition in the next step, can be reliably removed. In addition, a fibrous filter material is also preferably used, and examples of the filter material include polypropylene fiber, nylon fiber, and glass fiber. Specifically, a filter cartridge of SBP type series (manufactured by Roki Techno Co., Ltd.; for example, SBP008), TPR type series (for example, TPR002 or TPR005), SHPX type series (for example, SHPX003), or the like can be used.

In a filter is used, a combination of different filters may be used. At this time, the filtering using a first filter may be performed once, or twice or more.

In addition, a combination of first filters having different pore sizes in the above-described range may be used. Here, the pore size of the filter can refer to a nominal value of a manufacturer of the filter. A commercially available filter can be selected from various filters manufactured by Pall Corporation (for example, DFA4201NXEY), Toyo Roshi Kaisha, Ltd., Entegris Japan Co., Ltd., or Kits Microfilter Corporation.

(Use of Composition)

The composition according to the embodiment of the present disclosure can be made liquid. Therefore, a film can be easily formed, for example, by applying the composition according to the embodiment of the present disclosure to a substrate or the like and drying the composition.

For example, in a case where a film is formed by coating, the viscosity of the composition according to the embodiment of the present disclosure is preferably in a range of 1 mPa·s to 100 mPa·s from the viewpoint of application properties. The lower limit is more preferably 2 mPa·s or higher and still more preferably 3 mPa·s or higher. The upper limit is more preferably 50 mPa·s or lower, still more preferably 30 mPa·s or lower, and still more preferably 15 mPa·s or lower.

The total solid content of the composition according to the embodiment of the present disclosure changes depending on a coating method and, for example, is preferably 1 mass % to 50 mass %. The lower limit is more preferably 10 mass % or higher. The upper limit is more preferably 30 mass % or lower.

The use of the composition according to the embodiment of the present disclosure is not particularly limited. The composition according to the embodiment of the present disclosure can be preferably used to form an infrared cut filter or the like. For example, the composition can be preferably used, for example, for an infrared cut filter (for example, an infrared cut filter for a wafer level lens) on a light receiving side of a solid image pickup element or as an infrared cut filter on a back surface side (opposite to the light receiving side) of a solid image pickup element. In particular, the composition can be preferably used as an infrared cut filter on a light receiving side of a solid image pickup element. In addition, by the composition according to the embodiment of the present disclosure including the colorant that shields visible light, an infrared transmitting filter that can allow transmission of infrared light at a specific wavelength or higher can also be formed. For example, an infrared transmitting filter that shields light in a wavelength range of 400 nm to 900 nm and can allow transmission of infrared light in a wavelength range of 900 nm or longer can also be formed.

In addition, it is preferable that the composition according to the embodiment of the present disclosure is stored in a storage container.

As the storage container, in order to prevent infiltration of impurities into the raw materials or the composition, a multilayer bottle in which a container inner wall having a six-layer structure is formed of six kinds of resins or a bottle in which a container inner wall having a seven-layer structure is formed of six kinds of resins is preferably used. Examples of the container include a container described in JP2015-123351A.

<Film>

A film according to the embodiment of the present disclosure is a film that is formed of the composition according to the embodiment of the present disclosure or a film that is formed by curing the composition according to the embodiment of the present disclosure but is preferably a film that is formed by curing the composition according to the embodiment of the present disclosure.

The above-described curing may be curing by polymerization of a negative type composition, curing by polymerization of a positive type composition, or curing by cyclization of the specific precursor. In addition, in a case where the composition includes a solvent, the above-described curing may be curing by drying.

The film according to the embodiment of the present disclosure can be preferably used as an infrared cut filter. In addition, the film according to the embodiment of the present disclosure can also be used as a heat ray shielding filter or an infrared transmitting filter. The film according to the embodiment of the present disclosure may be used in a state where it is laminated on a support, or is peeled off from a support. The film according to the embodiment of the present disclosure may be a film having a pattern or a film (flat film) not having a pattern.

The thickness of the film according to the embodiment of the present disclosure can be appropriately adjusted according to the purpose. The thickness of the film is preferably 20 μm or less, more preferably 10 μm or less, and still more preferably 5 μm or less. For example, the lower limit of the thickness of the film is preferably 0.1 μm or more, more preferably 0.2 μm or more, and still more preferably 0.3 μm or more.

The film according to the embodiment of the present disclosure has a maximum absorption wavelength preferably in a wavelength range of 600 nm to 1,200 nm, more preferably in a wavelength range of 700 nm to 1,000 nm, and still more preferably in a wavelength range of 740 nm to 960 nm.

In a case where the film according to the embodiment of the present disclosure is used as an infrared cut filter, in the present invention, it is preferable that the film according to the embodiment of the present disclosure satisfies at least one of the following condition (1), . . . , or (4), and it is more preferable that the film satisfies all the following conditions (1) to (4).

(1) A transmittance at a wavelength of 400 nm is preferably 70% or higher, more preferably 80% or higher, still more preferably 85% or higher, and still more preferably 90% or higher (2) A transmittance at a wavelength of 500 nm is preferably 70% or higher, more preferably 80% or higher, still more preferably 90% or higher, and still more preferably 95% or higher (3) A transmittance at a wavelength of 600 nm is preferably 70% or higher, more preferably 80% or higher, still more preferably 90% or higher, and still more preferably 95% or higher (4) A transmittance at a wavelength of 650 nm is preferably 70% or higher, more preferably 80% or higher, still more preferably 90% or higher, and still more preferably 95% or higher The film according to the embodiment of the present disclosure can also be used in combination with a color filter that includes a chromatic colorant. The color filter can be manufactured using a coloring composition including a chromatic colorant. Examples of the chromatic colorant include the chromatic colorants described regarding the composition according to the embodiment of the present disclosure. The coloring composition may further include, for example, a resin, a curable compound, a polymerization initiator, a surfactant, a solvent, a polymerization inhibitor, and an ultraviolet absorber. In more detail, for example, the materials described above can be used.

In a case where the film according to the embodiment of the present disclosure is used in combination with a color filter, it is preferable that the color filter is disposed on an optical path of the film according to the embodiment of the present disclosure. For example, the film according to the embodiment of the present disclosure and the color filter can be laminated to be used as a laminate. In the laminate, the film according to the embodiment of the present disclosure and the color filter may be or may not be adjacent to each other in a thickness direction. In a case where the film according to the embodiment of the present disclosure is not adjacent to the color filter in the thickness direction, the film according to the embodiment of the present disclosure may be formed on another support other than a support on which the color filter is formed, or another member (for example, a microlens or a planarizing layer) constituting a solid image pickup element may be interposed between the film according to the embodiment of the present disclosure and the color filter.

In the present disclosure, "infrared cut filter" refers to a filter that allows transmission of light (visible light) in the visible range and shields at least a part of light (infrared light) in the near infrared range. The infrared cut filter may be a filter that allows transmission of light in the entire wavelength range of the visible range, or may be a filter that allows transmission of light in a specific wavelength range of the visible range and shields light in another specific wavelength range of the visible range. In addition, in the present disclosure, a color filter refers to a filter that allows transmission of light in a specific wavelength range of the visible range and shields light in another specific wavelength range of the visible range. In addition, in the present disclosure, "infrared transmitting filter" refers to a filter that shields visible light and allows transmission of at least a part of infrared light.

The film according to the embodiment of the present disclosure can be used in various devices including a solid image pickup element such as a charge coupled device (CCD) or a complementary metal-oxide semiconductor (CMOS), an infrared sensor, or an image display device.

<Film Forming Method>

Next, a method of forming the film according to the embodiment of the present disclosure will be described. The film according to the embodiment of the present disclosure can be formed through a step of applying the composition according to the embodiment of the present disclosure.

In the method of forming the film according to the embodiment of the present disclosure, it is preferable that the composition is applied to a support. Examples of the support include a substrate formed of a material such as silicon, non-alkali glass, soda glass, PYREX (registered trade name) glass, or quartz glass. For example, an organic film or an inorganic film may be formed on the substrate. Examples of a material of the organic film include the above-described transparent resin. In addition, as the support, a substrate formed of the above-described resin can also be used. In addition, a charge coupled device (CCD), a complementary metal-oxide semiconductor (CMOS), a transparent conductive film, or the like may be formed on the support. In addition, a black matrix that separates pixels from each other may be formed on the support. In addition, optionally, an undercoat layer may be provided on the support to improve adhesiveness with a layer above the support, to prevent diffusion of materials, or to make a surface of the substrate flat. In addition, in a case where a glass substrate is used as the support, it is preferable that an inorganic film is formed on the glass substrate or the glass substrate may be dealkalized to be used. According to this aspect, a film in which the occurrence of foreign matter is further suppressed can be easily formed. In a case where a support including a component (for example, in the case of soda glass, a sodium ion) that is likely to be transferred from the support side such as soda glass to the film formed on the support is used, the component transferred from the support reacts with the pigment derivative to form a salt or the like, and crystals may precipitate. However, even in a case where the composition according to the embodiment of the present disclosure is applied to the support, a film in which the occurrence of foreign matter is suppressed can be formed. Therefore, the composition according to the embodiment of the present disclosure is particularly effective in a case where a film is formed on the support using the composition.

As a method of applying the composition, a well-known method can be used. Examples of the well-known method include: a drop casting method; a slit coating method; a spray coating method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using a mold or the like; and a nanoimprint lithography method. The application method using an ink jet method is not particularly limited, and examples thereof include a method (in particular, pp. 115 to 133) described in "Extension of Use of Ink Jet—Infinite Possibilities in Patent-" (February, 2005, S. B. Research Co., Ltd.) and methods described in JP2003-262716A, JP2003-185831A, JP2003-261827A, JP2012-126830A, and JP2006-169325A.

A composition layer formed by applying the composition may be dried (pre-baked). In a case where a pattern is formed through a low-temperature process, pre-baking is not necessarily performed. In a case where pre-baking is performed, the pre-baking temperature is preferably 150° C. or lower, more preferably 120° C. or lower, and still more preferably 110° C. or lower. The lower limit is, for example, preferably 50° C. or higher and more preferably 80° C. or higher. By setting the pre-baking temperature to be 150° C. or lower, the characteristics can be effectively maintained, for example, even in a case where a photoelectric conversion film of an image sensor is formed of an organic material.

The pre-baking time is preferably 10 seconds to 3,000 seconds, more preferably 40 seconds to 2,500 seconds, and still more preferably 80 seconds to 220 seconds. Drying can be performed using a hot plate, an oven, or the like.

The method of forming the film according to the embodiment of the present disclosure may further include a step of forming a pattern. Examples of a pattern forming method include a pattern forming method using a photolithography method and a pattern forming method using a dry etching method. In a case where the film according to the embodiment of the present disclosure is used as a flat film, the step of forming a pattern is not necessarily performed. Hereinafter, the step of forming a pattern will be described in detail.

—Case where Pattern is Formed Using Photolithography Method—

It is preferable that the pattern forming method using a photolithography method includes: a step (exposure step) of exposing the composition layer, which is formed by applying the composition according to the embodiment of the present disclosure, in a pattern shape; and a step (development step) of forming a pattern by removing a non-exposed portion of the composition layer by development. Optionally, the pattern forming method may further include a step (post-baking step) of baking the developed pattern. Hereinafter, the respective steps will be described.

<<Exposure Step>>

In the exposure step, the composition layer is exposed in a pattern shape. For example, the composition layer can be exposed in a pattern shape using an exposure device such as a stepper through a mask having a predetermined mask pattern. As a result, an exposed portion can be cured. As radiation (light) used during the exposure, ultraviolet rays such as g-rays or i-rays are preferable, and i-rays are more preferable. The irradiation dose (exposure dose) is preferably 0.03 J/cm$^2$ to 2.5 J/cm$^2$, more preferably 0.05 J/cm$^2$ to 1.0 J/cm$^2$, and still more preferably 0.08 J/cm$^2$ to 0.5 J/cm$^2$. The oxygen concentration during exposure can be appropriately selected. The exposure may be performed not only in air but also in a low-oxygen atmosphere having an oxygen concentration of 19 vol % or lower (for example, 15 vol %, 5 vol %, or substantially 0 vol %) or in a high-oxygen atmosphere having an oxygen concentration of higher than 21 vol % (for example, 22 vol %, 30 vol %, or 50 vol %). In addition, the exposure illuminance can be appropriately set and preferably can be selected in a range of 1,000 W/m$^2$ to 100,000 W/m$^2$ (for example, 5,000 W/m$^2$, 15,000 W/m$^2$, or 35,000 W/m$^2$). Conditions of the oxygen concentration and conditions of the exposure illuminance may be appropriately combined. For example, conditions are oxygen concentration: 10 vol % and illuminance: 10,000 W/m$^2$, or oxygen concentration: 35 vol % and illuminance: 20,000 W/m$^2$.

<<Development Step>>

Next, a pattern is formed by removing a non-exposed portion of the exposed composition layer by development. The non-exposed portion of the composition layer can be removed by development using a developer. As a result, a non-exposed portion of the composition layer in the exposure step is eluted into the developer, and only the photo-cured portion remains on the support. As the developer, an alkali developer which does not cause damages to a solid image pickup element as an underlayer, a circuit or the like is desired. For example, the temperature of the developer is preferably 20° C. to 30° C. The development time is preferably 20 seconds to 180 seconds. In addition, in order to further improve residue removing properties, a step of shaking the developer off per 60 seconds and supplying a new developer may be repeated multiple times.

Examples of the alkaline agent used as the developer include: an organic alkaline compound such as ammonia water, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, benzyltrimethylammonium hydroxide, dimethyl bis(2-hydroxyethyl)ammonium hydroxide, choline, pyrrole, piperidine, or 1,8-diazabicyclo[5.4.0]-7-undecene; and an inorganic alkaline compound such as sodium hydroxide, potassium hydroxide, sodium carbonate, sodium bicarbonate, sodium silicate, or sodium metasilicate. As the developer, an alkaline aqueous solution in which the above alkaline agent is diluted with pure water is preferably used. A concentration of the alkaline agent in the alkaline aqueous solution is preferably 0.001 mass % to 10 mass % and more preferably 0.01 mass % to 1 mass %. In addition, a surfactant may be used as the developer.

Examples of the surfactant include the surfactants described above regarding the composition. Among these, a nonionic surfactant is preferable. From the viewpoint of easiness of transport, storage, and the like, the developer may be obtained by temporarily preparing a concentrated solution and diluting the concentrated solution to a necessary concentration during use. The dilution factor is not particularly limited and, for example, can be set to be in a range of 1.5 times to 100 times. In a case where a developer including the alkaline aqueous solution is used, it is preferable that the layer is rinsed with pure water after development.

After the development, the film can also be dried and then heated (post-baking). Post-baking is a heat treatment which is performed after development to completely cure the film. In a case where post-baking is performed, for example, the post-baking temperature is preferably 100° C. to 240° C. From the viewpoint of curing the film, the post-baking temperature is more preferably 200° C. to 230° C. In addition, in a case where an organic electroluminescence (organic EL) element is used as a light-emitting light source, or in a case where a photoelectric conversion film of an image sensor is formed of an organic material, the post-baking temperature is preferably 150° C. or lower, more preferably 120° C. or lower, still more preferably 100° C. or lower, and still more preferably 90° C. or lower. The lower limit is, for example, 50° C. or higher. The film after the development is post-baked continuously or batchwise using heating means such as a hot plate, a convection oven (hot air circulation dryer), or a high-frequency heater under the above-described conditions. In addition, in a case where a pattern is formed through a low-temperature process, post-baking is not necessarily performed.

—Case where Pattern is Formed Using Dry Etching Method—

The formation of a pattern using a dry etching method can be performed using a method including: applying the composition to a support or the like to form a composition layer; curing the composition layer to form a cured composition layer; forming a patterned photoresist layer on the cured composition layer; and dry-etching the cured composition layer with etching gas by using the patterned photoresist layer as a mask. It is preferable that pre-baking is further performed in order to form the photoresist layer. In particular, in a preferable aspect, as a process of forming the photoresist, baking after exposure or baking after development (post-baking) is performed. The details of the pattern formation using the dry etching method can be found in paragraphs "0010" to "0067" of JP2013-064993A, the content of which is incorporated herein by reference.

<Method of Manufacturing Infrared Cut Filter>

An infrared cut filter according to the embodiment of the present disclosure includes the film according to the embodiment of the present disclosure.

The infrared cut filter according to the embodiment of the present disclosure may be a filter that cuts only infrared light in a part of an infrared range or a filter that cuts infrared light in the entire infrared range. Examples of the filter that cuts only infrared light in a part of an infrared range include a near infrared cut filter.

In addition, the infrared cut filter according to the embodiment of the present disclosure is preferably a filter that cuts infrared light in a wavelength range of 750 nm to 1,000 nm, more preferably a filter that cuts infrared light in a wavelength range of 750 nm to 1,200 nm, and still more preferably a filter that cuts infrared light in a wavelength range of 750 nm to 1,200 nm.

The infrared cut filter according to the embodiment of the present disclosure may further include, for example, a layer containing copper, a dielectric multi-layer film, or an ultraviolet absorbing layer in addition to the above-described film. By further including at least the layer containing copper and/or the dielectric multi-layer film, the infrared cut filter according to the embodiment of the present disclosure having a wide viewing angle and excellent infrared shielding properties can be easily obtained. In addition, by including the ultraviolet absorbing layer, the infrared cut filter according to the embodiment of the present disclosure having excellent ultraviolet shielding properties can be obtained. The details of the ultraviolet absorbing layer can be found in the description of an absorption layer described in paragraphs "0040" to "0070" and paragraphs "0119" of "0145" of WO2015/099060, the content of which is incorporated herein by reference. The details of the dielectric multi-layer film can be found in paragraphs "0255" to "0259" of JP2014-041318A, the content of which is incorporated herein by reference. As the layer containing copper, a glass substrate (copper-containing glass substrate) formed of glass containing copper, or a layer (copper complex-containing layer) containing a copper complex may also be used. Examples of the copper-containing glass substrate include a phosphate glass including copper and a fluorophosphate glass including copper. Examples of a commercially available product of the copper-containing glass include NF-50 (manufactured by AGC Techno Glass Co., Ltd.), BG-60 and BG-61 (both of which are manufactured by Schott AG), and CD5000 (manufactured by Hoya Corporation).

The infrared cut filter according to the embodiment of the present disclosure can be used in various devices including a solid image pickup element such as a charge coupled device (CCD) or a complementary metal-oxide semiconductor (CMOS), an infrared sensor, or an image display device.

It is also preferable that the infrared cut filter according to the embodiment of the present disclosure includes: a pixel (pattern) of the film that is formed using the composition according to the embodiment of the present disclosure; and at least one pixel (pattern) selected from the group consisting of a red pixel, a green pixel, a blue pixel, a magenta pixel, a yellow pixel, a cyan pixel, a black pixel, and an achromatic pixel.

A method of manufacturing the infrared cut filter according to the embodiment of the present disclosure is not particularly limited and is preferably a method including: a step of applying the composition according to the embodiment of the present disclosure to a support to form a composition layer; a step of exposing the composition layer in a pattern shape; and a step of forming a pattern by removing a non-exposed portion during the exposure by development, or a method including: a step of applying the composition according to the embodiment of the present disclosure to a support to form a composition layer; a step of forming a photoresist layer on the layer; a step of obtaining a resist pattern by patterning the photoresist layer by exposure and development; and a step of dry-etching the cured layer by using the resist pattern as an etching mask.

The respective steps of the method of manufacturing the infrared cut filter according to the embodiment of the present disclosure can refer to the respective steps of the method of forming the film according to the embodiment of the present disclosure.

<Solid Image Pickup Element>

A solid image pickup element according to the embodiment of the present disclosure includes the film according to the embodiment of the present disclosure. The configuration of the solid image pickup element is not particularly limited as long as it includes the film according to the embodiment of the present disclosure and functions as a solid image pickup element. For example, the following configuration can be adopted.

The solid image pickup element includes plural photodiodes and transfers electrodes on the support, the photodiodes constituting a light receiving area of the solid image pickup element, and the transfer electrode being formed of polysilicon or the like. In the solid image pickup element, a light shielding film formed of tungsten or the like which has openings through only light receiving sections of the photodiodes is provided on the photodiodes and the transfer electrodes, a device protective film formed of silicon nitride or the like is formed on the light shielding film so as to cover the entire surface of the light shielding film and the light receiving sections of the photodiodes, and the film according to the embodiment of the present disclosure is formed on the device protective film. Further, a configuration in which light collecting means (for example, a microlens; hereinafter, the same shall be applied) is provided above the device protective film and below the film according to the embodiment of the present disclosure (on a side thereof close the support), or a configuration in which light collecting means is provided on the film according to the embodiment of the present disclosure may be adopted. In addition, the color filter used in the solid image pickup element may have a structure in which a film which forms each pixel is embedded in a space which is partitioned in, for example, a lattice shape by a partition wall. In this case, it is preferable that the partition wall has a lower refractive index than each pixel. Examples of an imaging device having such a structure include a device described in JP2012-227478A and JP2014-179577A.

<Image Display Device>

An image display device according to the embodiment of the present disclosure includes the film according to the embodiment of the present disclosure. Examples of the image display device include a liquid crystal display device or an organic electroluminescence (organic EL) display device. The definition and details of the image display device can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd.). In addition, the details of a liquid crystal display device can be found in, for example, "Next-Generation Liquid Crystal Display Techniques (Edited by Tatsuo Uchida, Kogyo Chosakai Publishing Co., Ltd., 1994)". The liquid crystal display device to which the present disclosure is applicable is not particularly limited. For example, the present invention is applicable to various liquid crystal display devices described in "Next-Generation Liquid Crystal Display Techniques". The image display device may include a white organic EL element. It is preferable that the white organic EL element has a tandem structure. The tandem structure of the organic EL element is described in, for example, JP2003-045676A, or pp. 326-328 of "Forefront of Organic EL Technology Development—Know-How Collection of High Brightness, High Precision, and Long Life" (Technical Information Institute, 2008). It is preferable that a spectrum of white light emitted from the organic EL element has high maximum emission peaks in a blue range (430 nm to 485 nm), a green range (530 nm to 580 nm), and a yellow range (580 nm to 620 nm). It is more preferable that the spectrum has a maximum emission peak in a red range (650 nm to 700 nm) in addition to the above-described emission peaks.

<Infrared Sensor>

An infrared sensor according to the embodiment of the present disclosure includes the film according to the embodiment of the present disclosure. The configuration of the infrared sensor is not particularly limited as long as it functions as an infrared sensor. Hereinafter, an embodiment of the infrared sensor according to the present disclosure will be described using the drawings.

In FIG. 1, reference numeral 110 represents a solid image pickup element. In an imaging region provided on a solid image pickup element 110, infrared cut filters 111 and infrared transmitting filters 114 are provided. In addition, color filters 112 are laminated on the infrared cut filters 111. Microlenses 115 are disposed on an incidence ray hv side of the color filters 112 and the infrared transmitting filters 114. A planarizing layer 116 is formed so as to cover the microlenses 115.

The infrared cut filter 111 can be formed using the composition according to the embodiment of the present disclosure. Spectral characteristics of the infrared cut filters 111 can be selected according to the emission wavelength of an infrared light emitting diode (infrared LED) to be used.

The color filters 112 is not particularly limited as long as pixels which allow transmission of light having a specific wavelength in a visible range and absorbs the light are formed therein, and well-known color filters of the related art for forming a pixel can be used. For example, pixels of red (R), green (G), and blue (B) are formed in the color filters. For example, the details of the color filters can be found in paragraphs "0214" to "0263" of JP2014-043556A, the content of which is incorporated herein by reference.

Characteristics of the infrared transmitting filters 114 can be selected according to the emission wavelength of the infrared LED to be used. For example, in a case where the emission wavelength of the infrared LED is 850 nm, a maximum value of a light transmittance of the infrared transmitting filter 114 in the thickness direction of the film in a wavelength range of 400 nm to 650 nm is preferably 30% or lower, more preferably 20% or lower, still more preferably 10% or lower and still more preferably 0.1% or lower. It is preferable that the transmittance satisfies the above-described conditions in the entire wavelength range of 400 nm to 650 nm.

A minimum value of a light transmittance of the infrared transmitting filter 114 in the thickness direction of the film in a wavelength range of 800 nm or longer (preferably 800 nm to 1,300 nm) is preferably 70% or higher, more preferably 80% or higher, and still more preferably 90% or higher. It is preferable that the transmittance satisfies the above-described conditions in at least a part of a wavelength range of 800 nm or longer, and it is more preferable that the transmittance satisfies the above-described conditions at a wavelength corresponding to the emission wavelength of the infrared LED.

The thickness of the infrared transmitting filter 114 is preferably 100 µm or less, more preferably 15 µm or less, still more preferably 5 µm or less, and still more preferably 1 µm or less. The lower limit value is preferably 0.1 µm. In a case where the thickness is in the above-described range, the film can satisfy the above-described spectral characteristics.

A method of measuring the spectral characteristics, the thickness, and the like of the infrared transmitting filter 114 are as follows.

The thickness is obtained by measuring the thickness of the dried substrate including the film using a stylus surface profilometer (DEKTAK 150, manufactured by ULVAC Inc.).

The spectral characteristics of the film are values obtained by measuring the transmittance in a wavelength range of 300 nm to 1,300 nm using an ultraviolet-visible-near infrared spectrophotometer (U-4100, manufactured by Hitachi High-Technologies Corporation).

In addition, for example, in a case where the emission wavelength of the infrared LED is 940 nm, it is preferable that a maximum value of a light transmittance of the infrared transmitting filter 114 in a thickness direction in a wavelength range of 450 nm to 650 nm is 20% or lower, that a light transmittance of the infrared transmitting filter 114 in the thickness direction at a wavelength of 835 nm is 20% or lower, and that a minimum value of a light transmittance of the infrared transmitting filter 114 in the thickness direction in a wavelength range of 1,000 nm to 1,300 nm is 70% or higher.

In the infrared sensor shown in FIG. 1, an infrared cut filter (other infrared cut filter) other than the infrared cut filter 111 may be further disposed on the planarizing layer 116. As the other infrared cut filter, for example, at least a layer containing copper or a dielectric multi-layer film may be provided. The details are as described above. In addition, as the other infrared cut filter, a dual band pass filter may be used.

In addition, the absorption wavelengths of the infrared transmitting filter and the infrared cut filter used in the present disclosure are appropriately used in combination according to light source to be used or the like.

(Camera Module)

A camera module according to the embodiment of the present disclosure comprises a solid image pickup element and the infrared cut filter according to the embodiment of the present disclosure.

In addition, it is preferable that the camera module according to the embodiment of the present disclosure further includes a lens and a circuit that processes an image obtained from the solid image pickup element.

The solid image pickup element used in the camera module according to the embodiment of the present disclosure may be the solid image pickup element according to the embodiment of the present disclosure or may be a well-known solid image pickup element.

In addition, as the lens used in the camera module according to the embodiment of the present disclosure and the circuit that processes an image obtained from the solid image pickup element, a well-known lens and a well-known circuit can be used.

Examples of the camera module can be found in a camera module described in JP2016-006476A or JP2014-197190A, the contents of which are incorporated herein by reference.

EXAMPLES

Hereinafter, the present disclosure will be described in detail using Examples. Materials, used amounts, ratios, treatment details, treatment procedures, and the like shown in the following examples can be appropriately changed within a range not departing from the scope of the present disclosure. Accordingly, the scope of the present disclosure is not limited to the following specific examples. Unless specified otherwise, "part(s)" and "%" represent "part(s) by mass" and "mass %".

Examples 1 to 13 and Comparative Examples 1 and 2

<Synthesis of Resin>
<<Synthesis of Resins B-1 to B-11>>

Respective copolymerization components shown in Table 1 were mixed with each other at a molar ratio shown in Table 1, 14 mass % of a thermal polymerization initiator (V-601, manufactured by Wako Pure Chemical Industries, Ltd.) and 300 mass % of propylene glycol monomethyl ether acetate were added dropwise with respect to the total mass of the copolymerization components to carry out polymerization at 80° C. for 2 hours, and the mixture was post-heated at 90° C. for 2 hours. As a result, each of resins B-1 to B-4 and B-6 to B-11 was obtained.

B-5 was obtained by polymerizing 55 mol % of an a-5 component 45 mol % of a b-1 component using the above-described method, adding 10 mol % of glycidyl methacrylate, 0.5 mol % of tetrabutylammonium bromide, and 1,000 ppm of p-methoxyphenol, and causing the components to react with each other at 90° C. for 12 hours. Table 1 shows the glass transition temperature (Tg), the acid value, and the weight-average molecular weight (Mw) of the obtained resin.

TABLE 1

| Resin Name | Kind of Copolymerization Component | | | | | Copolymerization Component Ratio [mol %] | | | | |
|---|---|---|---|---|---|---|---|---|---|---|
| | First Component | Second Component | Third Component | Fourth Component | Fifth Component | First Component | Second Component | Third Component | Fourth Component | Fifth Component |
| B-1 | a-1 | b-1 | — | — | — | 70 | 30 | — | — | — |
| B-2 | a-2 | b-1 | c-1 | — | — | 60 | 30 | 10 | — | — |
| B-3 | a-3 | b-2 | d-1 | — | — | 75 | 15 | 10 | — | — |
| B-4 | a-4 | b-3 | c-1 | d-2 | — | 70 | 20 | 5 | 5 | — |
| B-5 | a-5 | b-1 | c-2 | — | — | 55 | 35 | 10 | — | — |
| B-6 | a-6 | b-1 | c-1 | — | — | 55 | 35 | 10 | — | — |
| B-7 | a-7 | b-1 | c-1 | — | — | 55 | 35 | 10 | — | — |
| B-8 | a-8 | b-1 | c-1 | — | — | 55 | 35 | 10 | — | — |
| B-9 | a-9 | b-1 | c-1 | — | — | 55 | 35 | 10 | — | — |
| B-10 | a-4 | b-1 | d-1 | d-3 | d-4 | 30 | 30 | 10 | 20 | 10 |
| B-11 | d-4 | b-1 | c-1 | — | — | 70 | 20 | 10 | — | — |

| Resin Name | Glass Transition Temperature [° C.] | Acid Value [mgKOH/g] | Weight-Average Molecular Weight |
|---|---|---|---|
| B-1 | 182 | 93 | 12,000 |
| B-2 | 171 | 98 | 9,800 |
| B-3 | 180 | 64 | 9,100 |
| B-4 | 154 | 57 | 8,500 |
| B-5 | 228 | 139 | 17,700 |
| B-6 | 164 | 189 | 24,300 |
| B-7 | 219 | 120 | 13,700 |
| B-8 | 150 | 154 | 10,900 |
| B-9 | 202 | 132 | 14,500 |
| B-10 | 164 | 130 | 11,800 |
| B-11 | 65 | 73 | 15,000 |

Hereinafter, the details of the copolymerization components shown in Table 1 will be described. Each of the following copolymerization components is shown as a constitutional unit, and a corresponding monomer or a precursor thereof was used for the synthesis.
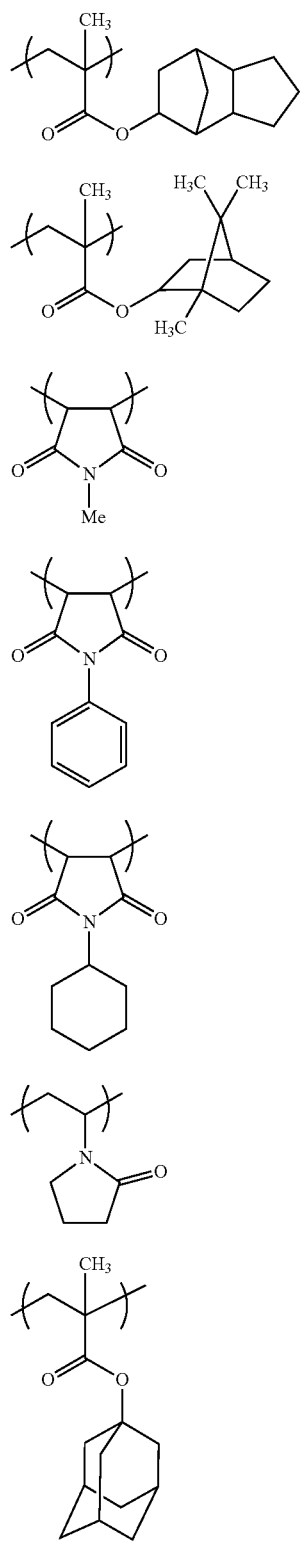
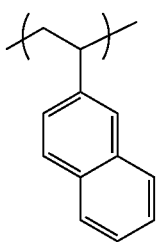
(a-8)
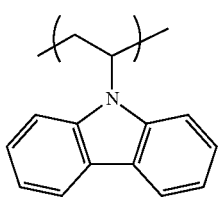
(a-9)
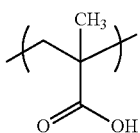
(b-1)
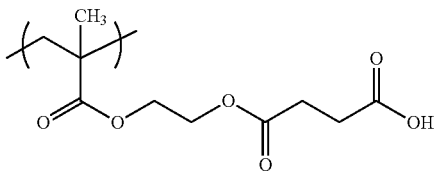
(b-2)
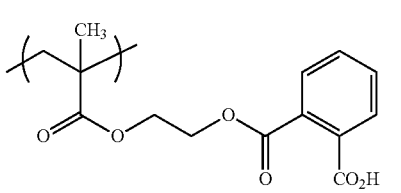
(b-3)
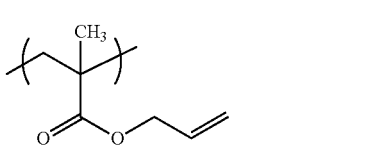
(c-1)
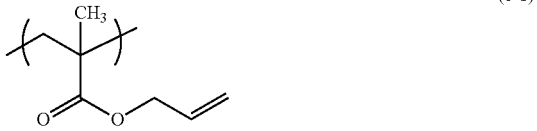
(c-2)
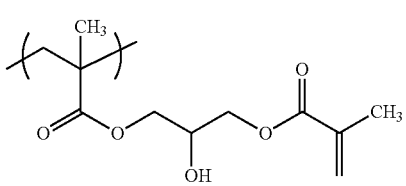
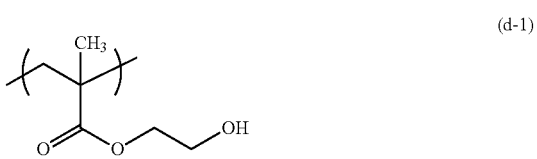
(d-1)

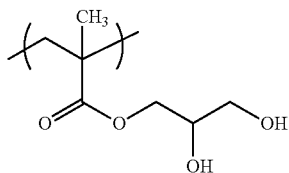
(d-2)

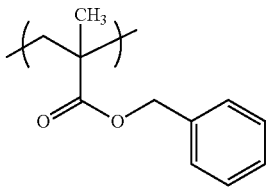
(d-4)

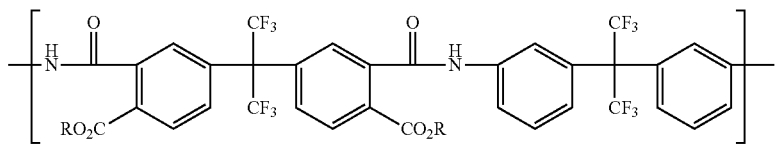
(d-3)

<<Synthesis of Resin Precursors B-21 to B-23>>

Resin precursors B-21 to B-23 were synthesized using a method described in JP2013-050593A. In B-21, the acid value was 105 mgKOH/g, the weight-average molecular weight was 16,200, and the glass transition temperature after imidization was 260° C. In B-22, the acid value was 126 mgKOH/g, the weight-average molecular weight was 18,600, and the glass transition temperature after imidization was 260° C. In B-23, the acid value was 107 mgKOH/g, the weight-average molecular weight was 22,100, and the glass transition temperature after imidization was 335° C.

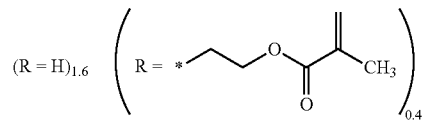
(B-21)

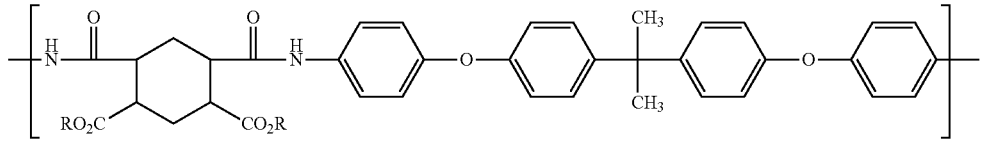
(B-22)

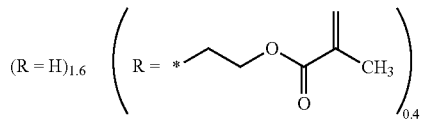

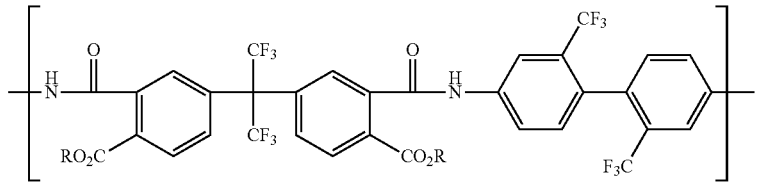
(B-23)

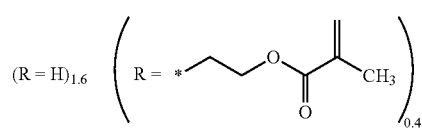

<Preparation of Glass Wafer with Undercoat Layer>

The following raw materials were mixed with each other to prepare a composition for forming an undercoat layer.

Propylene glycol monomethyl ether acetate (PGMEA): 19.20 parts by mass

Ethyl Lactate: 36.67 parts by mass

Resin (a 41% ethyl acetate solution of a copolymer including benzyl methacrylate, methacrylic acid, and 2-hydroxyethyl methacrylate (molar ratio=60:20:20)): 30.51 parts by mass Dipentaerythritol hexaacrylate: 12.20 parts by mass Polymerization inhibitor (p-methoxyphenol): 0.006 parts by mass Surfactant (the following mixture (Mw=14000); in the following formula, "%" (62% and 38%) representing the proportion of a constitutional unit is mass %): 0.83 parts by mass Photopolymerization Initiator (TAZ-107, manufactured by Midori Kagaku Co., Ltd.): 0.59 parts by mass

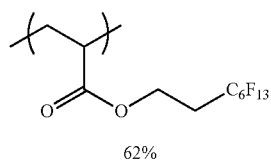

62%

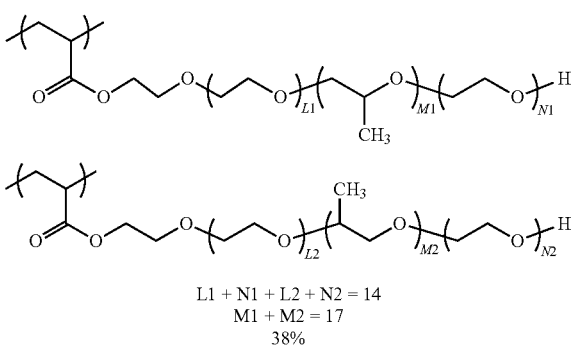

L1 + N1 + L2 + N2 = 14
M1 + M2 = 17
38%

<Preparation of Glass Wafer with Undercoat Layer>

The composition for forming an undercoat layer was applied to an 8 inch (=203.2 mm) glass wafer using a spin coater to form a coating film. Next, the formed coating film was heated using a hot plate at 120° C. for 120 seconds. The rotation speed during the spin coating was adjusted such that the thickness of the heated coating film was about 0.5 m. The heated coating film was further treated in an oven at 220° C. for 1 hour to cure the coating film. As a result, an undercoat layer was formed. This way, the glass wafer with the undercoat layer in which the undercoat layer was formed on the glass wafer was obtained.

<Preparation of Pattern-Forming Composition>

The following components were mixed with each other to prepare a pattern-forming composition.

Infrared absorbing colorant shown in Table 2: 5 parts by mass

Resin shown in Table 2: 13.0 parts by mass

Polymerizable compound shown in Table 2: 4.5 parts by mass

Photopolymerization initiator shown in Table 2: 0.8 parts by mass

Polymerization inhibitor (p-methoxyphenol): 0.001 parts by mass

Surfactant (the above-described mixture): 0.03 parts by mass

Ultraviolet absorber (UV-503, manufactured by Daito Chemical Co., Ltd.): 1.3 parts by mass Solvent (propylene glycol monomethyl ether acetate): 76 parts by mass <Evaluation of Infrared Shielding Properties>

The obtained composition was applied to the glass wafer with the undercoat layer using a spin coater such that the thickness of the dried coating film was 1.0 µm. Next, the coating film was heated using a hot plate at 100° C. for 2 minutes and at 200° C. for 5 minutes. As a result, a cured film was formed. Regarding the prepared cured film, an absorbance at an incidence angle of 0° at a maximum absorption wavelength was measured using a spectrophotometer U4100 (manufactured by Hitachi High-Technologies Corporation). The evaluation standards are as follows.

A: a minimum transmittance in 650 nm to 1,200 nm was lower than 5%

B: a minimum transmittance in 650 nm to 1,200 nm was 5% or higher and lower than 10%

C: a minimum transmittance in 650 nm to 1,200 nm was 10% or higher and lower than 20%

D: a minimum transmittance in 650 nm to 1,200 nm was 20% or higher

<Evaluation of Heat Resistance>

The cured film used for the evaluation of the infrared shielding properties was heated using a hot plate at 265° C. for 5 minutes to perform a heat-resistance test. A transmittance of the cured film in a wavelength range of 400 nm to 1,200 nm was measured before and after the heat-resistance test to calculate a change in transmittance at each wavelength from the following expression. Using a maximum value of the change in transmittance in a wavelength range of 400 nm to 1,200 nm, heat resistance was evaluated based on the following standards.

Change in Transmittance=|Transmittance before Heat-Resistance Test-Transmittance after Heat-Resistance Test|

A: the maximum value of the change in transmittance was lower than 3%

B: the maximum value of the change in transmittance was 3% or higher and lower than 5%

C: the maximum value of the change in transmittance was 5% or higher and lower than 10%

D: the maximum value of the change in transmittance was 10% or higher

<Evaluation of Pattern Shape (Pattern Formability)>

The obtained composition was applied to a silicon wafer with an undercoat layer to form a coating film. The coating film was heated (pre-baked) using a hot plate at 100° C. for 120 seconds such that the thickness of the coating film after drying was 1.0 m.

Next, using an i-ray stepper exposure device FPA-3000 i5+(manufactured by Canon Corporation), the coating film was exposed at a wavelength of 365 nm at different exposure doses of 50 mJ/cm$^2$ to 1200 mJ/cm$^2$ through a 3.0 m×3.0 μm island pattern mask. Next, the irradiated silicon wafer substrate on which the coating film was formed was placed on a horizontal rotary table of a spin-shower developing machine (DW-30, manufactured by Chemitronics Co., Ltd.) and underwent puddle development at 23° C. for 60 seconds using CD-2000 (manufactured by Fujifilm Electronic Materials Co., Ltd.) to form a colored pattern on the silicon wafer provided with the undercoat layer.

The silicon wafer on which the colored pattern was formed was fixed to the horizontal rotary table using a vacuum chuck method. While rotating the silicon wafer at a rotation speed of 50 rpm using a rotating device, the silicon wafer was rinsed with pure water supplied from a region above the rotation center through a spray nozzle, and then was spray-dried.

The obtained substrate was heated (post-baked) using a hot plate at 220° C. for 300 seconds.

A cross-section of the substrate was observed with a scanning electron microscope, an angle of a 3.0 m×3.0 μm square pixel pattern side wall at the optimum exposure dose was measured, and evaluation was performed based on the following evaluation standards.

A: the angle of the side wall was 80° or more and less than 100°

B: the angle of the side wall was 70° or more and less than 80°, or was 100° or more and less than 110°

C: the angle of the side wall was less than 70° and 110° or more

<Evaluation of Development Residue (Development Residue Suppressing Properties)>

The composition obtained as described above was applied to a silicon wafer with an undercoat layer using a spin coating method such that the thickness after the application was 0.7 μm, and then was heated using a hot plate at 100° C. for 2 minutes. As a result, a composition layer was obtained. Next, using an i-ray stepper exposure device FPA-3000 i5+(manufactured by Canon Corporation), the obtained composition layer was exposed (an optimum exposure dose was selected such that the line width was 1.1 μm) through a mask having a 1.1 μm×1.1 μm Bayer pattern. Next, puddle development was performed on the exposed composition layer at 23° C. for 60 seconds using a tetramethylammonium hydroxide (TMAH) 0.3 mass % aqueous solution. Next, the silicon wafer was rinsed by spin showering and was cleaned with pure water. As a result, a pattern was obtained. The amount of residues remaining on the underlayer of the obtained pattern was evaluated by binarization of the image based on the following standards.

A: the amount of the residues was lower than 1.5% with respect to the total area of the underlayer B: the amount of the residues was 1.5% to 5% with respect to the total area of the underlayer C: the amount of the residues was higher than 5% with respect to the total area of the underlayer The evaluation results are collectively shown in Table 2.

TABLE 2

| | Composition Component | | | | Evaluation Result | | | |
|---|---|---|---|---|---|---|---|---|
| | Infrared Absorbing Colorant | Resin | Polymerizable Compound | Photopolymerization Initiator | Infrared Shielding Properties | Heat Resistance | Pattern Shape | Development Residue |
| Example 1 | A-1 | B-1 | C-1 | D-1 | A | B | A | A |
| Example 2 | A-2 | B-2 | C-2 | D-1 | A | C | A | A |
| Example 3 | A-3 | B-3 | C-3 | D-2 | B | B | A | A |
| Example 4 | A-4 | B-4 | C-1/C-2 (1/1) | D-1 | A | A | A | A |
| Example 5 | A-5 | B-5 | C-1/C-3 (3/1) | D-1 | A | A | A | A |
| Example 6 | A-6 | B-6 | C-1 | D-2 | A | A | A | A |
| Example 7 | A-1/A-2 (1/1) | B-7 | C-2 | D-1 | A | C | A | A |
| Example 8 | A-4/A-5 (1/1) | B-8 | C-3 | D-1 | A | A | A | A |
| Example 9 | A-4 | B-9 | C-1 | D-2 | A | A | A | A |
| Example 10 | A-5 | B-10 | C-2 | D-1 | A | A | A | A |
| Example 11 | A-6 | B-9/B-10 (1/1) | C-3 | D-1 | A | A | A | A |
| Example 12 | A-1 | B-21 | C-1 | D-1 | A | B | B | B |
| Example 13 | A-1 | B-22 | C-2 | D-2 | A | B | B | B |
| Comparative Example 1 | A-2 | B-11 | C-1 | D-1 | A | D | C | A |
| Comparative Example 2 | A-1 | B-23 | C-3 | D-2 | A | B | B | C |

In "Composition Component" of Table 2, in a case where two kinds were used, a numerical value in parentheses represents a mass ratio. For example, in Example 7, 2.5 parts by mass of A-1 and 2.5 parts by mass of A-2 were used.

Hereinafter, the details of the respective components shown in Table 2 will be described. As the resins B-1 to B-11 and the resin precursors B-21 and B-23 shown in Table 2, the resins B-1 to B-11 and the resin precursors B-21 and B-23 synthesized as described above were used, respectively.

<Infrared Absorbing Colorant>

A-1: a squarylium compound having the following structure

A-2: NK-5060 (manufactured by Hayashibara Co., Ltd., a cyanine compound, maximum absorption wavelength: 865 nm (film))

A-3: Excolor TX-EX 708K (manufactured by Nippon Shokubai Co., Ltd., a phthalocyanine compound, maximum absorption wavelength: 755 nm (film))

A-4: a pyrrolopyrrole compound having the following structure

A-5: a pyrrolopyrrole compound having the following structure

A-6: a pyrrolopyrrole compound having the following structure

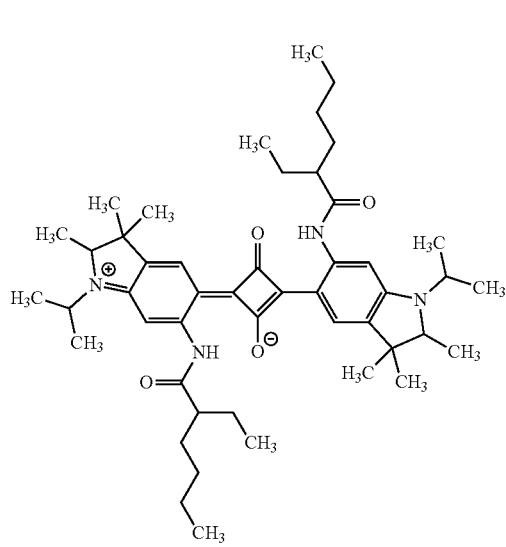

(A-1)

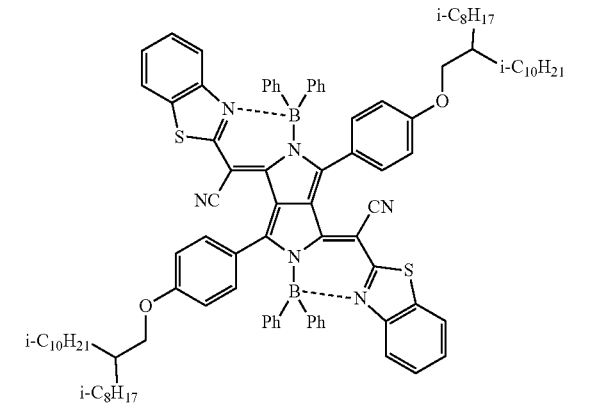

(A-4)

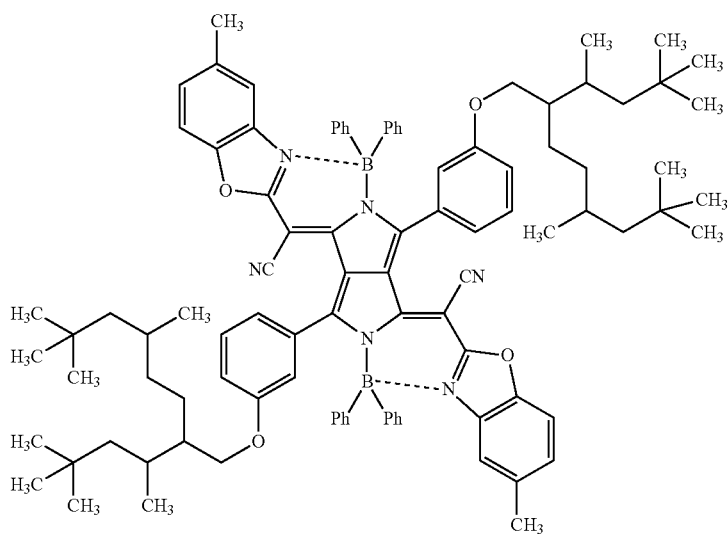

(A-5)

(A-6)

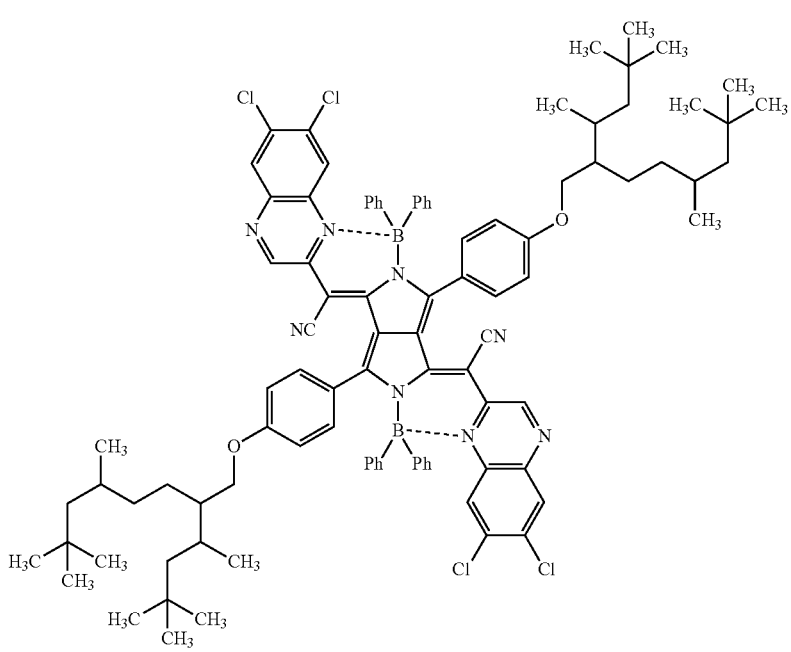

<Polymerizable Compounds>

C-1: ARONIX M-305 (manufactured by Toagosei Co., Ltd.; a mixture of the following compounds; content of triacrylate: 55 mass % to 63 mass %)

C-2: KAYARAD RP-1040 (an ethylene oxide-modified pentaerythritol tetraacrylate; manufactured by Nippon Kayaku Co., Ltd.)

C-3: ARONIX M-510 (a polyfunctional acrylate compound, manufactured by Toagosei Co., Ltd.)

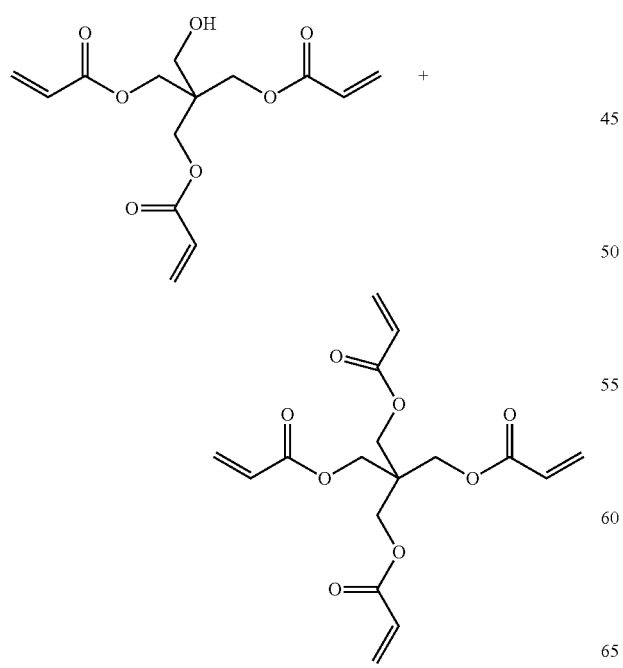

<Photopolymerization Initiator>

D-1: a compound having the following structure

D-2: a compound having the following structure

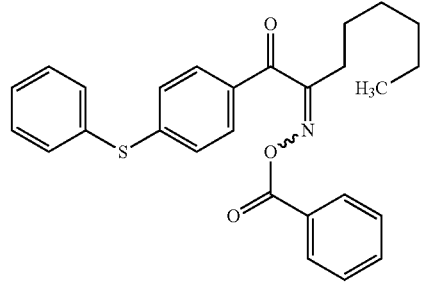

D-1

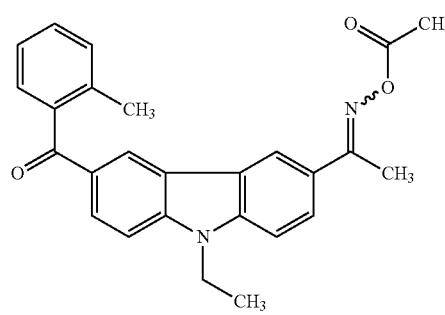

D-2

Example 14

With a positive type pattern-forming composition including the above-described infrared absorbing colorant, a positive type specific compound, and a photoacid generator, the same effects as those of Example 1 or the like can be obtained.

Examples 15 to 17

<Preparation 2 of Pattern-Forming Composition>
The following components were mixed with each other to prepare a pattern-forming composition.
Infrared absorbing colorant shown in Table 3: 5 parts by mass
Resin shown in Table 3: 13.0 parts by mass
Polymerizable compound shown in Table 3: 4.5 parts by mass
Photopolymerization initiator shown in Table 3: 0.8 parts by mass
Polymerization inhibitor (p-methoxyphenol): 0.001 parts by mass
Surfactant (the above-described mixture): 0.03 parts by mass
Ultraviolet absorber (UV-503, manufactured by Daito Chemical Co., Ltd.): 1.3 parts by mass
Solvent (propylene glycol monomethyl ether acetate): 76 parts by mass Using the obtained pattern-forming composition, the same evaluation as that of Examples 1 to 13 was performed. The evaluation results are collectively shown in Table 3.

TABLE 3

| | Composition Component | | | | Evaluation Result | | | |
|---|---|---|---|---|---|---|---|---|
| | Infrared Absorbing Colorant | Resin | Polymerizable Compound | Photopoly- merization Initiator | Infrared Shielding Properties | Heat Resistance | Pattern Shape | Development Residue |
| Example 15 | A-7 | B-5 | C-1 | D-1 | A | B | A | A |
| Example 16 | A-8 | B-5 | C-1 | D-1 | A | B | A | A |
| Example 17 | A-9 | B-5 | C-1 | D-1 | A | B | A | A |

Hereinafter, the details of the respective components shown in Table 3 will be described.
(Infrared Absorbing Colorant)
A-7 to A-9: a squarylium compound having the following structure

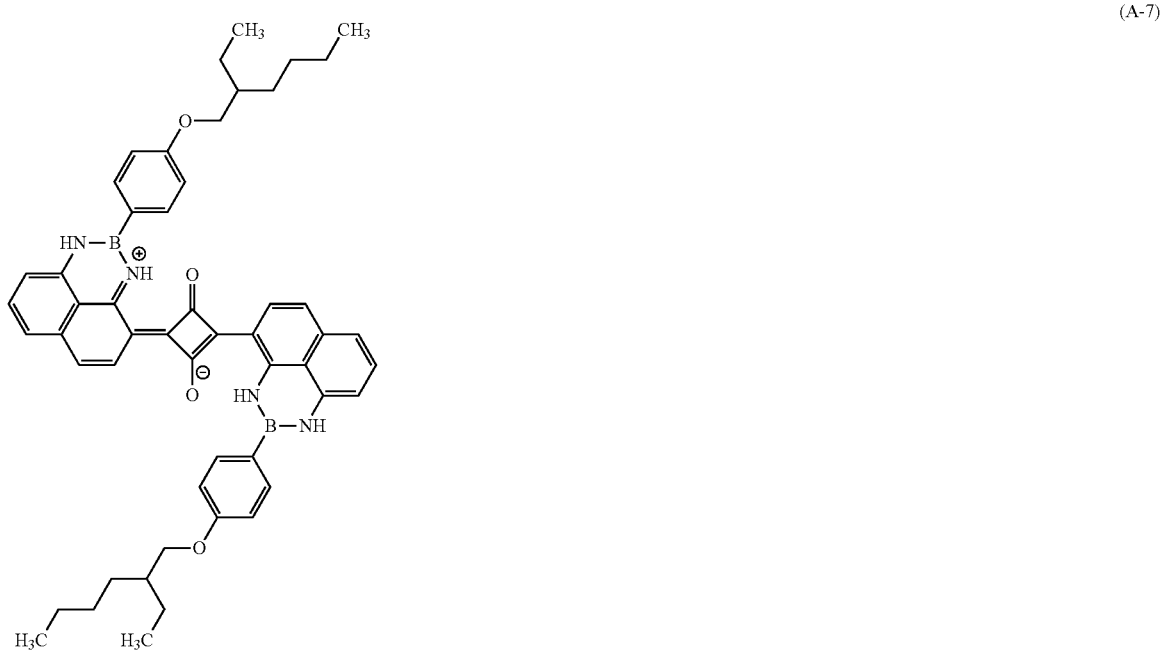

(A-7)

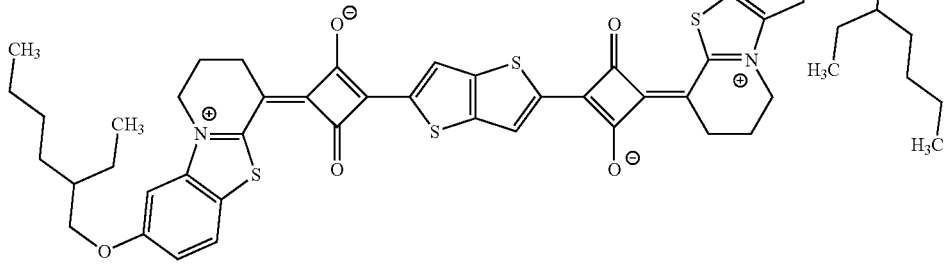

(A-8)

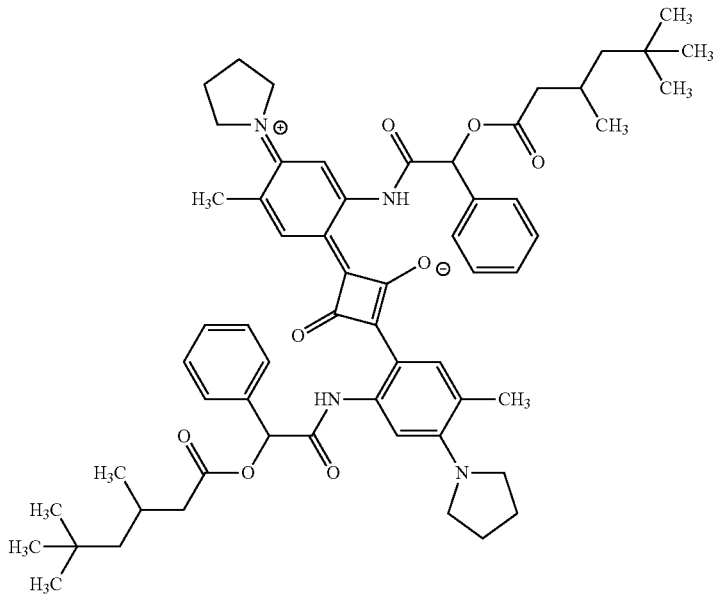

(A-9)

Examples 21 to 44 and Comparative Examples 3 and 4

<Preparation of Dispersion>

13 parts by mass of an infrared absorbing colorant shown in Table 4 below, 7.8 parts by mass of a dispersion resin shown in Table 4, 150 parts by mass of propylene glycol methyl ether acetate (PGMEA), and 230 parts by mass of zirconia beads having a diameter of 0.3 mm were mixed with each other, the mixture was dispersed using a paint shaker for 5 hours, and the beads were separated by filtration. As a result, a dispersion was manufactured. Regarding dispersions 1 to 4, a dispersion 9, a dispersion 11, a dispersion 13, a dispersion 16, dispersions 20 to 22, and a dispersion 24, the components were dispersed after further adding 1 part by mass of a pigment derivative shown in the following Table 4.

TABLE 4

|  | Infrared Absorbing Colorant | Dispersion Resin | Pigment Derivative |
|---|---|---|---|
| Dispersion 1 | A-21 | E-1 | a-1 |
| Dispersion 2 | A-21 | E-1 | a-2 |
| Dispersion 3 | A-22 | E-1 | a-3 |
| Dispersion 4 | A-22 | E-2 | a-4 |
| Dispersion 5 | A-23 | E-1 | — |
| Dispersion 6 | A-24 | E-1 | — |
| Dispersion 7 | A-25 | E-1 | — |
| Dispersion 8 | A-26 | E-2 | — |
| Dispersion 9 | A-27 | E-2 | a-5 |
| Dispersion 10 | A-28 | E-2 | — |
| Dispersion 11 | A-29 | E-2 | a-5 |
| Dispersion 12 | A-30 | E-1 | — |
| Dispersion 13 | A-31 | E-2 | a-5 |
| Dispersion 14 | A-32 | E-2 | — |
| Dispersion 15 | A-33 | E-1 | — |
| Dispersion 16 | A-34 | E-1 | a-6 |
| Dispersion 17 | A-35 | E-1 | — |
| Dispersion 18 | A-36 | E-1 | — |
| Dispersion 19 | A-37 | E-2 | — |
| Dispersion 20 | A-38 | E-2 | a-5 |
| Dispersion 21 | A-39 | E-2 | a-5 |
| Dispersion 22 | A-40 | E-2 | a-5 |
| Dispersion 23 | A-41 | E-1 | — |
| Dispersion 24 | A-42 | E-2 | a-5 |

<Infrared Absorbing Colorant>
A-21 and A-22: pyrrolopyrrole compounds having the following structures
A-23 to A-42: squarylium compounds having the following structures
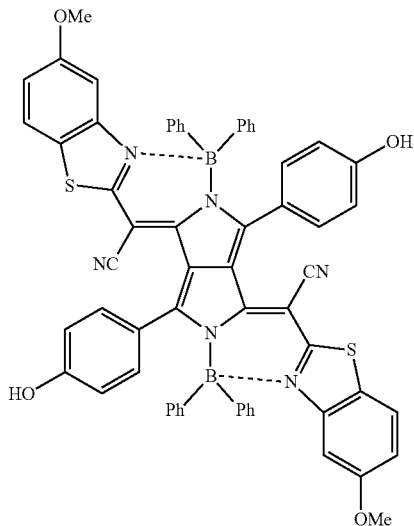
(A-21)
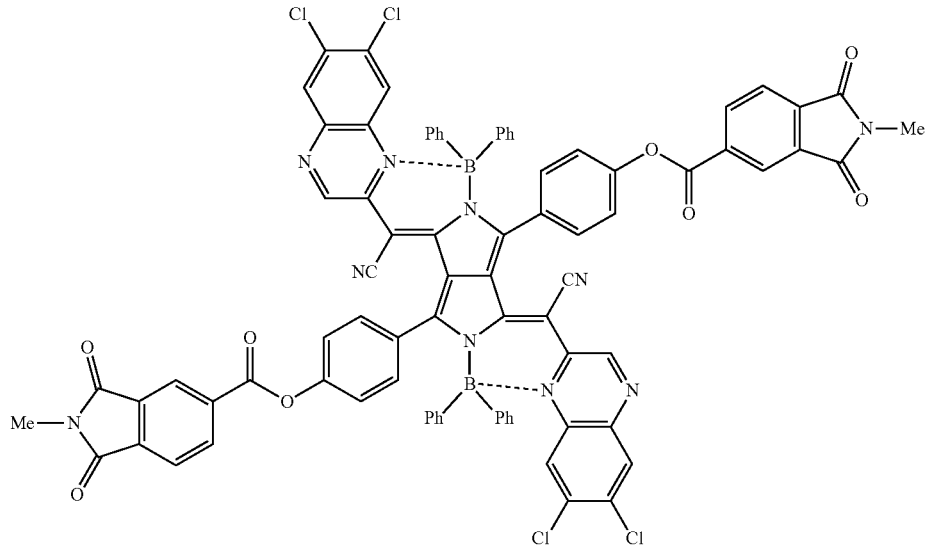
(A-22)
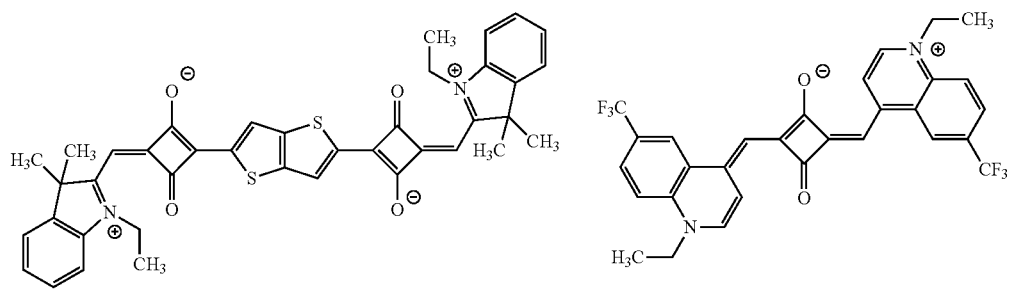
(A-23) (A-24)

(A-25)
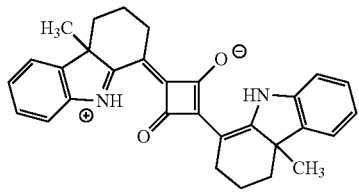
(A-26)
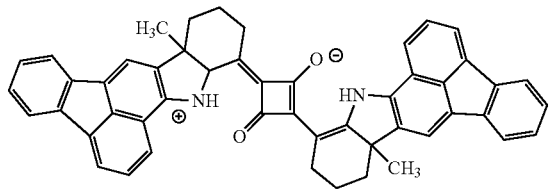
(A-27)
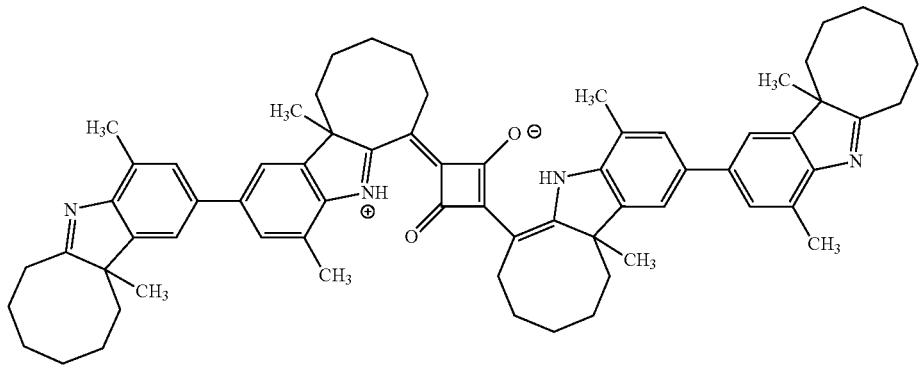
(A-28)
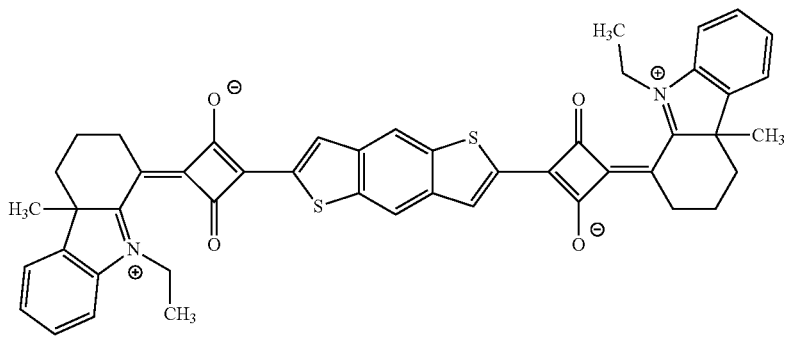
(A-29)
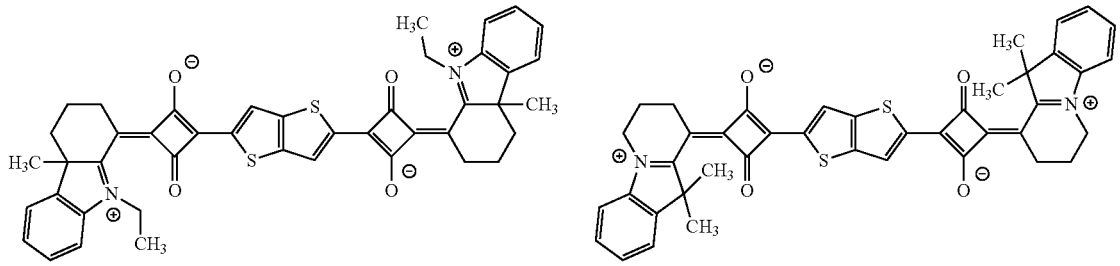
(A-30)
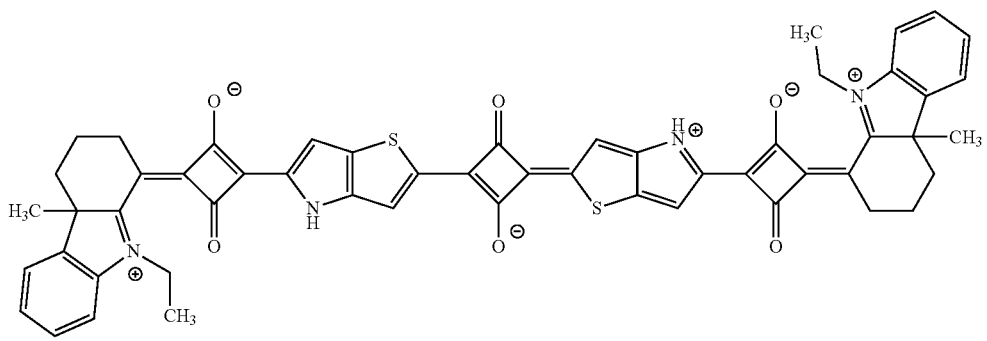
(A-31)

-continued
(A-32)
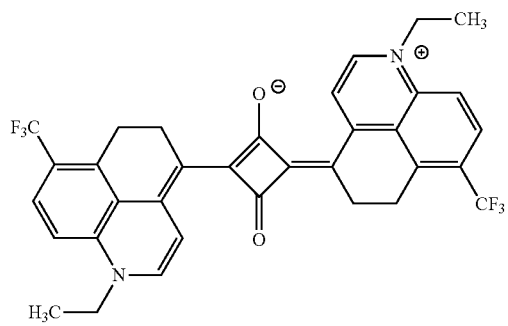
(A-33)
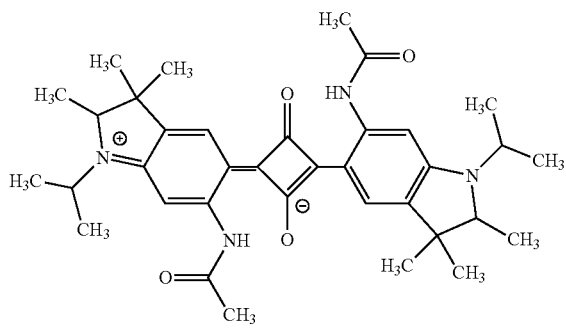
(A-34)
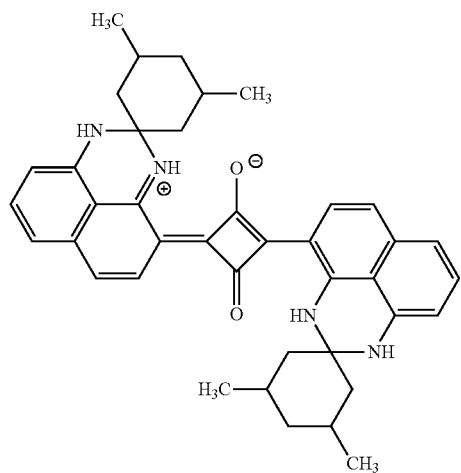
(A-35)
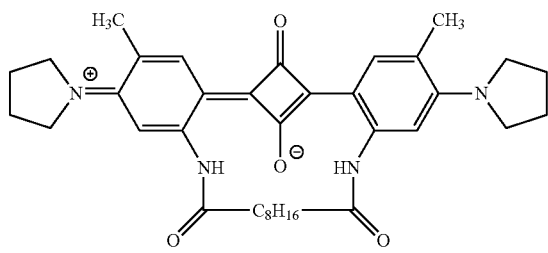
(A-36)
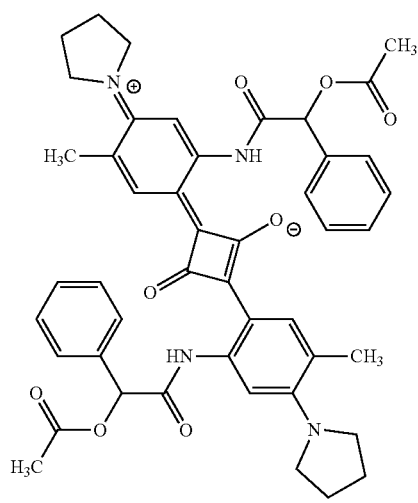
(A-37)
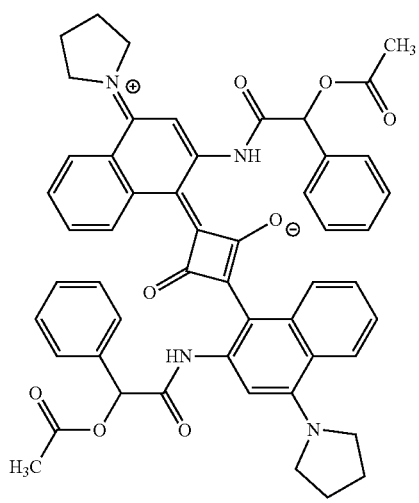

(A-38)
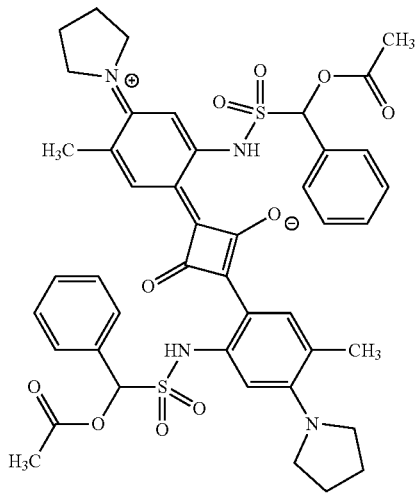
(A-39)
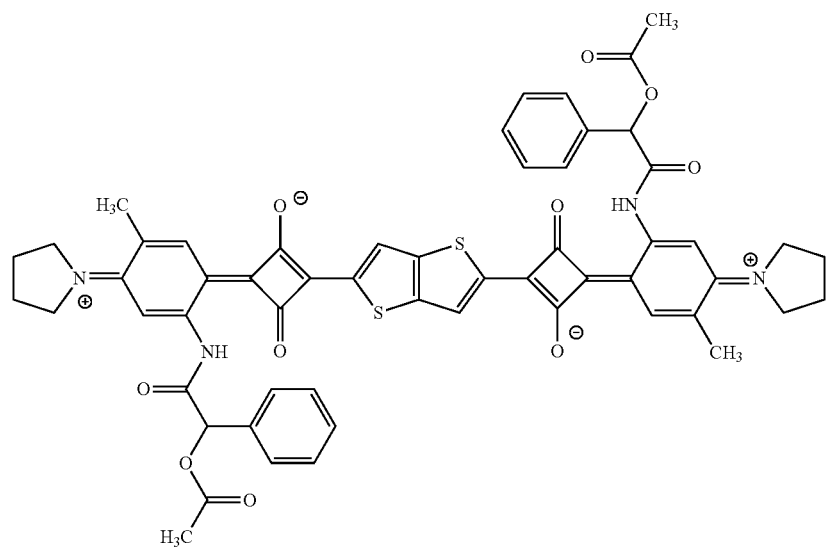
(A-40)
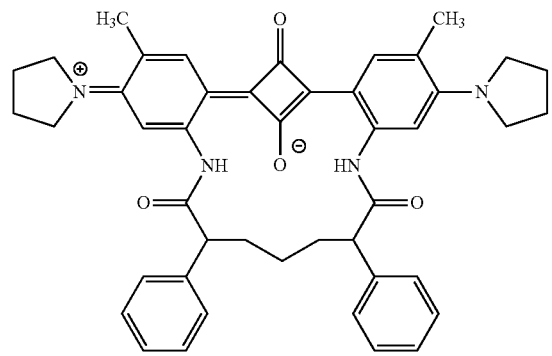
(A-41)
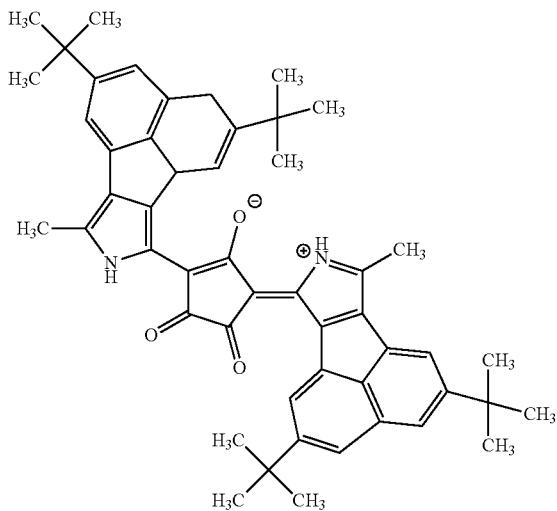

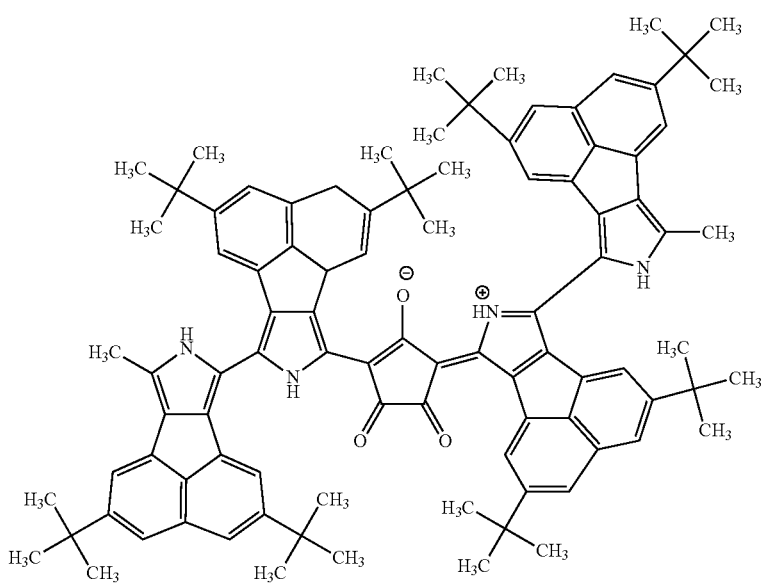

(A-42)

<Dispersion Resin>

E-1: a resin having the following structure (acid value=32.3 mgKOH/g, amine value=45.0 mgKOH/g, weight-average molecular weight=22900; a numerical value added to a main chain represents a molar ratio of a repeating unit; a numerical value added to a side chain represents the number of repeating units)

E-2: a resin having the following structure (acid value=99.1 mgKOH/g, weight-average molecular weight=38000; a numerical value added to a main chain represents a molar ratio of a repeating unit; a numerical value added to a side chain represents the number of repeating units)

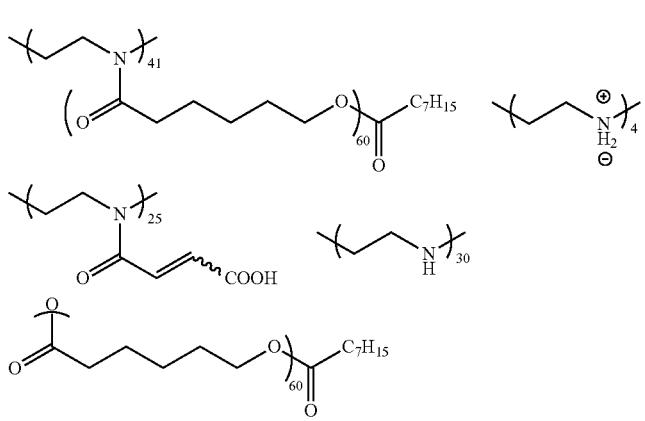

(E-1)

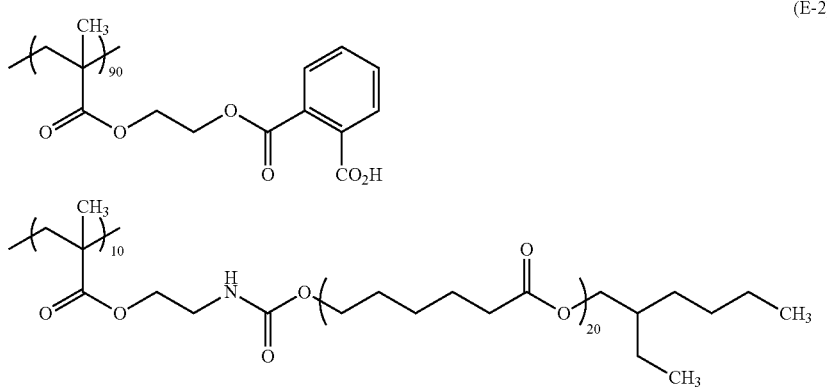

(E-2)

<Pigment Derivative>
a-1 to a-6: compounds having the following structures
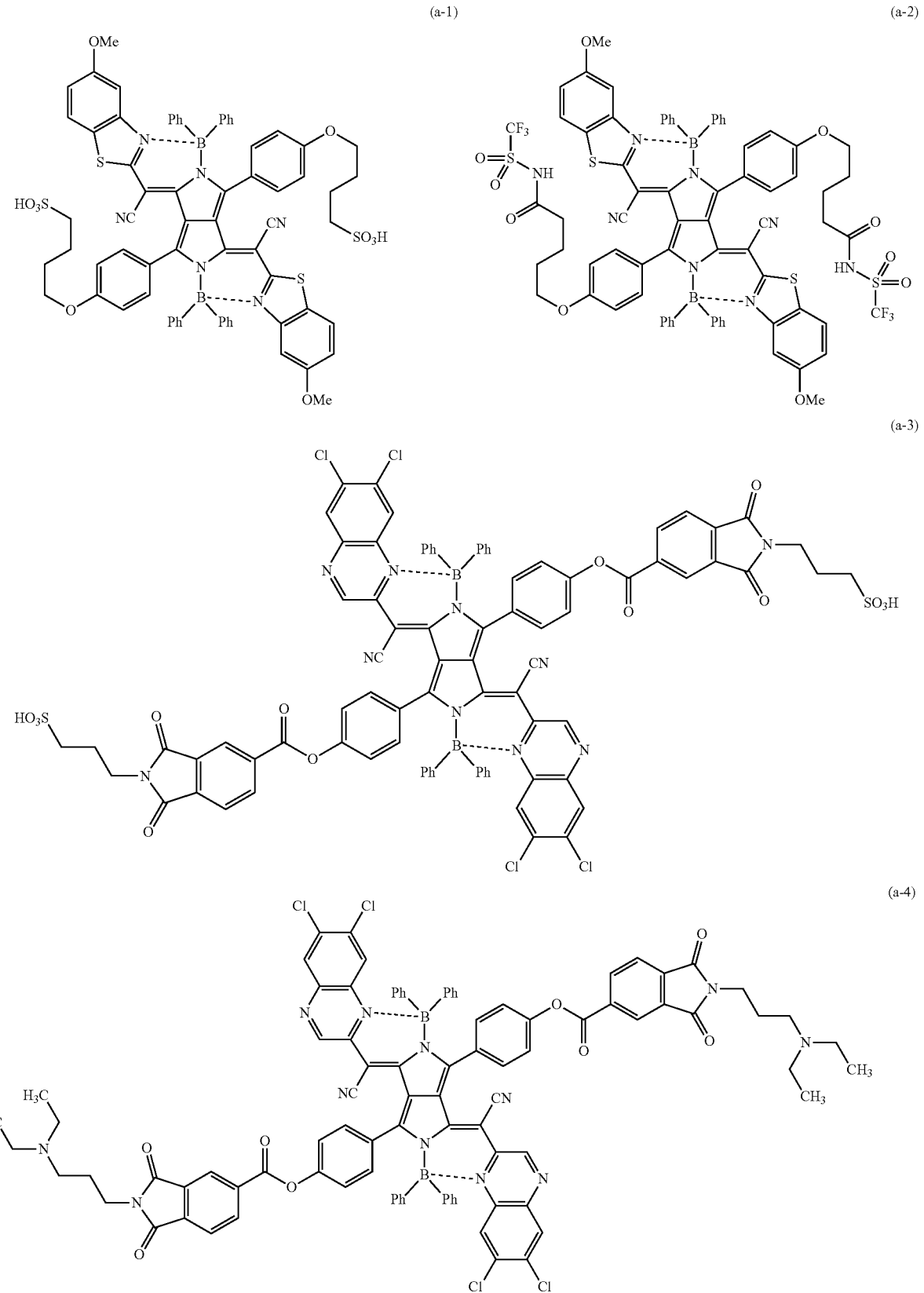

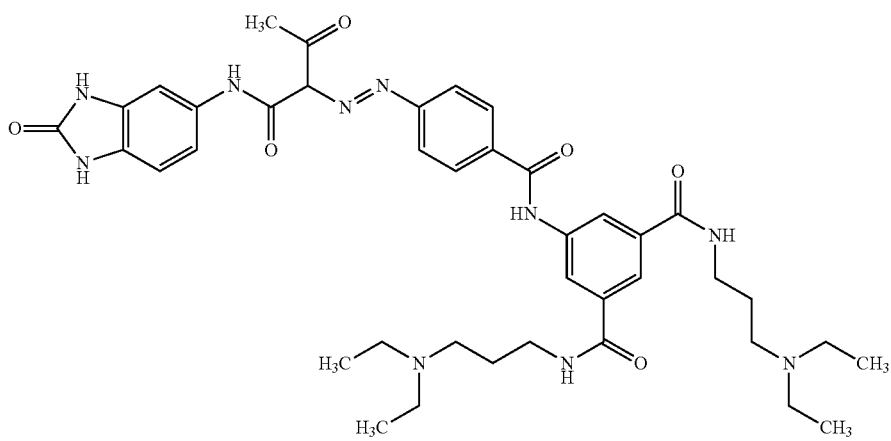

(a-5)

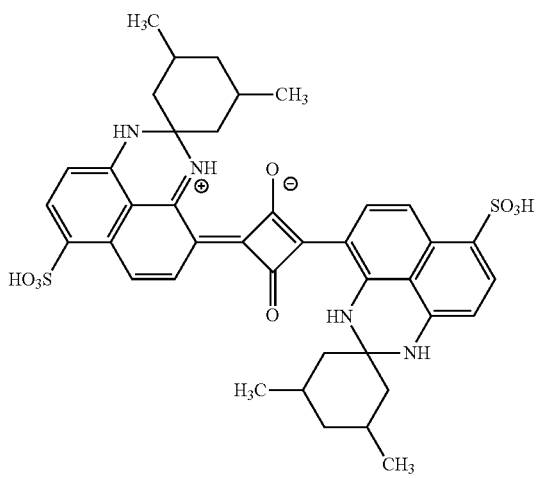

(a-6)

<Preparation 3 of Pattern-Forming Composition>

The following components were mixed with each other to prepare a pattern-forming composition.

Dispersion shown in Table 5: 55 parts by mass
Resin shown in Table 5: 7.0 parts by mass
Polymerizable compound shown in Table 5: 4.5 parts by mass
Photopolymerization initiator shown in Table 5: 0.8 parts by mass
Polymerization inhibitor (p-methoxyphenol): 0.001 parts by mass
Surfactant (the above-described mixture): 0.03 parts by mass
Ultraviolet absorber (UV-503, manufactured by Daito Chemical Co., Ltd.): 1.3 parts by mass
Solvent (propylene glycol monomethyl ether acetate): 31 parts by mass Using the obtained pattern-forming composition, the same evaluation as that of Examples 1 to 13 was performed. The evaluation results are collectively shown in Table 5.

TABLE 5

| | Composition Component | | | | Evaluation Result | | | |
|---|---|---|---|---|---|---|---|---|
| | Dispersion | Resin | Polymerizable Compound | Photopolymerization Initiator | Infrared Shielding Properties | Heat Resistance | Pattern Shape | Development Residue |
| Example 21 | Dispersion 1 | B-1 | C-1 | D-1 | A | A | A | A |
| Example 22 | Dispersion 2 | B-2 | C-2 | D-1 | A | A | A | A |
| Example 23 | Dispersion 3 | B-3 | C-3 | D-2 | A | A | A | A |
| Example 24 | Dispersion 4 | B-4 | C-1 | D-1 | A | A | A | A |
| Example 25 | Dispersion 5 | B-5 | C-2 | D-1 | A | B | A | A |
| Example 26 | Dispersion 6 | B-6 | C-3 | D-2 | A | B | A | A |
| Example 27 | Dispersion 7 | B-7 | C-1 | D-1 | A | B | A | A |
| Example 28 | Dispersion 8 | B-8 | C-2 | D-1 | A | B | A | A |
| Example 29 | Dispersion 9 | B-9 | C-3 | D-2 | A | B | A | A |

TABLE 5-continued

| | Composition Component | | | | Evaluation Result | | | |
|---|---|---|---|---|---|---|---|---|
| | Dispersion | Resin | Polymerizable Compound | Photopoly- merization Initiator | Infrared Shielding Properties | Heat Resistance | Pattern Shape | Development Residue |
| Example 30 | Dispersion 10 | B-10 | C-1 | D-1 | A | B | A | A |
| Example 31 | Dispersion 11 | B-21 | C-2 | D-1 | A | B | B | B |
| Example 32 | Dispersion 12 | B-22 | C-3 | D-2 | A | B | B | B |
| Example 33 | Dispersion 13 | B-1 | C-1 | D-1 | A | B | A | A |
| Example 34 | Dispersion 14 | B-2 | C-2 | D-1 | A | B | A | A |
| Example 35 | Dispersion 15 | B-3 | C-3 | D-2 | A | B | A | A |
| Example 36 | Dispersion 16 | B-4 | C-1 | D-1 | A | B | A | A |
| Example 37 | Dispersion 17 | B-5 | C-2 | D-1 | A | B | A | A |
| Example 38 | Dispersion 18 | B-6 | C-3 | D-2 | A | B | A | A |
| Example 39 | Dispersion 19 | B-7 | C-1 | D-1 | A | B | A | A |
| Example 40 | Dispersion 20 | B-8 | C-2 | D-1 | A | B | A | A |
| Example 41 | Dispersion 21 | B-9 | C-3 | D-2 | A | B | A | A |
| Example 42 | Dispersion 22 | B-10 | C-1 | D-1 | A | B | A | A |
| Example 43 | Dispersion 23 | B-21 | C-2 | D-1 | A | B | B | B |
| Example 44 | Dispersion 24 | B-22 | C-3 | D-2 | A | B | B | B |
| Comparative Example 3 | Dispersion 7 | B-11 | C-1 | D-1 | A | D | C | A |
| Comparative Example 4 | Dispersion 15 | B-23 | C-3 | D-2 | A | B | B | C |

Examples 51 to 61 and Comparative Examples 5 and 6

<Synthesis of Resin>
(Synthesis of Resins B-31 to B-40)
Respective copolymerization components shown in Table 6 were mixed with each other at a molar ratio shown in Table 6, 14 mass % of a thermal polymerization initiator (V-601, manufactured by Wako Pure Chemical Industries, Ltd.) and 300 mass % of propylene glycol monomethyl ether acetate were added dropwise with respect to the total mass of the copolymerization components to carry out polymerization at 80° C. for 2 hours, and the mixture was post-heated at 90° C. for 2 hours. As a result, each of resins B-31 to B-40 was obtained. Table 6 shows the glass transition temperature (Tg), the acid value, and the weight-average molecular weight (Mw) of the obtained resin.

TABLE 6

| | Kind of Copolymerization Component | | | | Copolymerization Component Ratio [mol %] | |
|---|---|---|---|---|---|---|
| Resin Name | First Component | Second Component | Third Component | Fourth Component | First Component | Second Component |
| B-31 | a-1 | b-1 | e-1 | f-1 | 55 | 20 |
| B-32 | a-2 | b-1 | e-1 | f-1 | 55 | 20 |
| B-33 | a-3 | b-1 | e-1 | f-2 | 55 | 15 |
| B-34 | a-4 | b-1 | e-1 | f-1 | 50 | 15 |
| B-35 | a-5 | b-1 | e-1 | f-2 | 55 | 15 |
| B-36 | a-6 | b-1 | e-1 | f-1 | 55 | 25 |
| B-37 | a-7 | b-1 | e-1 | f-2 | 55 | 20 |
| B-38 | a-8 | b-1 | e-1 | f-1 | 52 | 35 |
| B-39 | a-9 | b-1 | e-1 | f-1 | 55 | 15 |
| B-40 | d-5 | b-1 | e-1 | f-1 | 10 | 10 |

| | Copolymerization Component Ratio [mol %] | | Glass Transition Temperature [° C.] | Acid Value [mgKOH/g] | Weight- Average Molecular Weight |
|---|---|---|---|---|---|
| Resin Name | Third Component | Fourth Component | | | |
| B-31 | 20 | 5 | 153 | 63 | 11,700 |
| B-32 | 20 | 5 | 156 | 62 | 10,500 |
| B-33 | 20 | 10 | 173 | 67 | 13,200 |
| B-34 | 25 | 10 | 173 | 53 | 11,100 |
| B-35 | 20 | 10 | 170 | 51 | 14,000 |
| B-36 | 15 | 5 | 151 | 122 | 16,600 |
| B-37 | 20 | 5 | 186 | 62 | 9,800 |
| B-38 | 10 | 3 | 152 | 149 | 15,200 |
| B-39 | 25 | 5 | 173 | 50 | 12,900 |
| B-40 | 40 | 40 | 82 | 39 | 15,000 |

Hereinafter, the details of the copolymerization components shown in Table 6 will be described. Each of the following copolymerization components is shown as a constitutional unit, and a corresponding monomer or a precursor thereof was used for the synthesis.

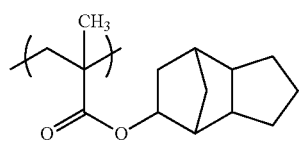
(a-1)

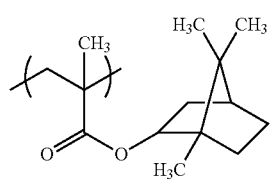
(a-2)

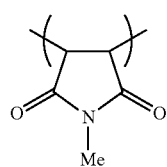
(a-3)

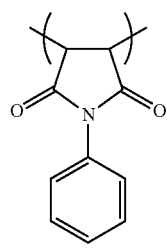
(a-4)

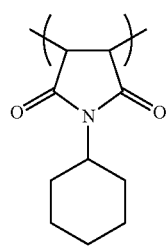
(a-5)

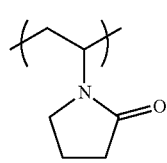
(a-6)

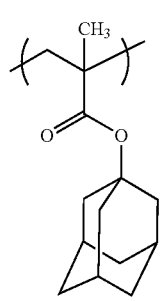
(a-7)

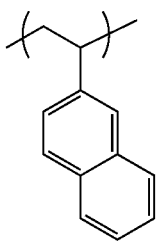
(a-8)

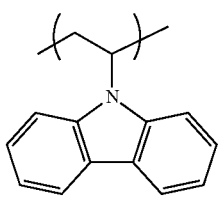
(a-9)

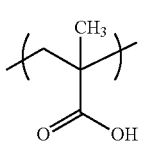
(b-1)

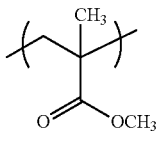
(d-5)

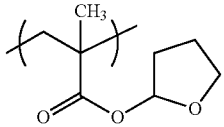
(e-1)

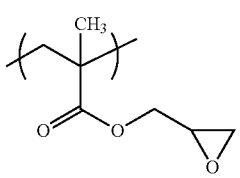
(f-1)

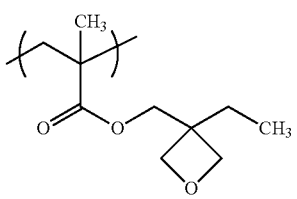
(f-2)

(Synthesis of Resin Precursors B-41 to B-43)

Resin precursors B-51 to B-53 were synthesized using a method described in JP2013-050593A. In B-51, the weight-average molecular weight was 14,200 and the glass transition temperature after imidization was 260° C. In B-52, the weight-average molecular weight was 16,600 and the glass transition temperature after imidization was 260° C. In B-53, the weight-average molecular weight was 20,100 and the glass transition temperature after imidization was 335° C.

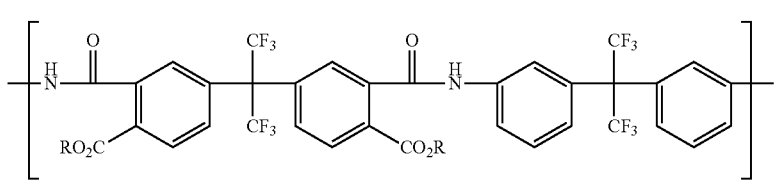
(B-51)

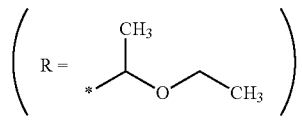

(B-52)
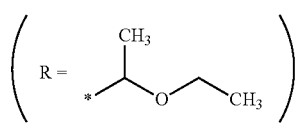

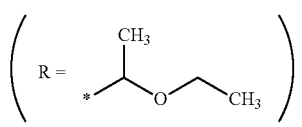
(B-53)

<Preparation 4 of Pattern-Forming Composition>

The following components were mixed and stirred, and the obtained mixture was filtered through a nylon filter (manufactured by Pall Corporation) having a pore size of 0.45 μm to prepare a pattern-forming composition.

Infrared absorbing colorant shown in Table 7: 2.54 parts by mass
Resin shown in Table 7:14.08 parts by mass
Crosslinking agent shown in Table 7: 2.82 parts by mass
Photoacid generator shown in Table 7: 0.34 parts by mass
Basic compound shown in Table 7: 0.02 parts by mass
Surfactant shown in Table 7: 0.02 parts by mass
Solvent (propylene glycol monomethyl ether acetate): 80.18 parts by mass Using the obtained pattern-forming composition, the same evaluation as that of Examples 1 to 13 was performed. The evaluation results are collectively shown in Table 7.

TABLE 7

| | Composition Component | | | | | | Evaluation Result | | | |
|---|---|---|---|---|---|---|---|---|---|---|
| | Infrared Absorbing Colorant | Resin | Crosslinking Agent | Photoacid Generator | Basic Compound | Surfactant | Infrared Shielding Properties | Heat Resistance | Pattern Shape | Development Residue |
| Example 51 | A-1 | B-31 | G-1 | H-1 | 1 | 1 | A | B | B | A |
| Example 52 | A-2 | B-32 | G-2 | H-1 | 1 | 1 | A | C | B | A |
| Example 53 | A-3 | B-33 | G-3 | H-1 | 2 | 2 | B | B | B | A |
| Example 54 | A-4 | B-34 | G-4 | H-2 | 1 | 3 | A | A | B | A |
| Example 55 | A-5 | B-35 | G-1 | H-2 | 1 | 1 | A | A | B | A |
| Example 56 | A-6 | B-36 | G-2 | H-2 | 2 | 1 | A | A | B | A |
| Example 57 | A-7 | B-37 | G-3 | H-3 | 1 | 2 | A | B | B | A |
| Example 58 | A-8 | B-38 | G-4 | H-3 | 1 | 3 | A | B | B | A |
| Example 59 | A-9 | B-39 | G-1 | H-3 | 2 | 1 | A | B | B | A |
| Example 60 | A-1 | B-51 | G-2 | H-4 | 1 | 1 | A | B | B | B |

TABLE 7-continued

| | Composition Component | | | | | | Evaluation Result | | | |
|---|---|---|---|---|---|---|---|---|---|---|
| | Infrared Absorbing Colorant | Resin | Crosslinking Agent | Photoacid Generator | Basic Compound | Surfactant | Infrared Shielding Properties | Heat Resistance | Pattern Shape | Development Residue |
| Example 61 | A-1 | B-52 | G-3 | H-4 | 1 | 2 | A | B | B | B |
| Comparative Example 5 | A-2 | B-40 | G-1 | H-1 | 1 | 1 | A | D | C | A |
| Comparative Example 6 | A-1 | B-53 | G-1 | H-1 | 1 | 1 | A | B | C | C |

Hereinafter, the details of the respective components shown in Table 7 will be described.

<Crosslinking Agent>

G-1: a compound having the following structure (JER YX4000HK, manufactured by Mitsubishi Chemical Corporation, a biphenyl type bifunctional epoxy, molecular weight: 354)

G-2: a compound having the following structure (JER 1031S, manufactured by Mitsubishi Chemical Corporation, a tetrafunctional epoxy, molecular weight: 623)

G-3: a compound having the following structure (a bifunctional oxetane, molecular weight: 364)

G-4: a compound having the following structure (a bifunctional oxetane, molecular weight: 334)

<Photoacid Generator>

H-1: a compound having the following structure (PAG-103, manufactured by BASF SE)

H-2: a compound having the following structure (GSID-26-1, manufactured by BASF SE, a triarylsulfonium salt)

H-3: a compound having the following structure

H-4: a compound having the following structure

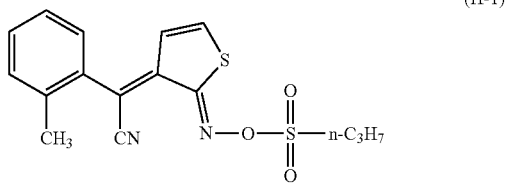

(H-1)

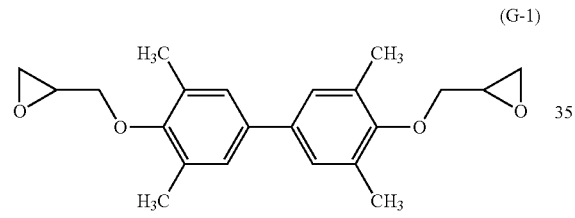

(G-1)

(H-2)

(G-2)

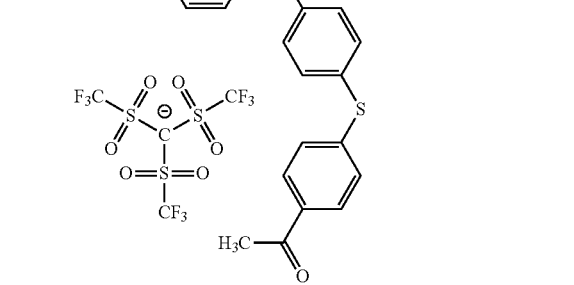

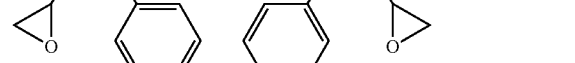

(G-3)

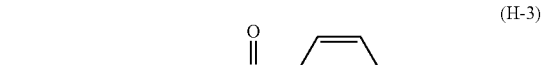

(H-3)

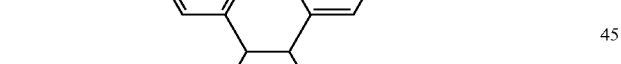

(G-4)

(H-4)

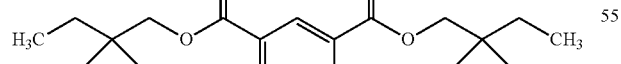
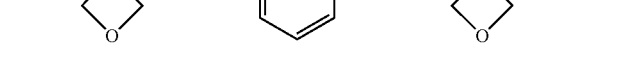

<Basic Compound>
Basic compound 1: 1,8-diazabicyclo[5.4.0]-7-undecene
Basic compound 2: a compound having the following structure

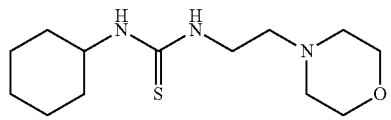 [SMILES: S=C(NCCN1CCOCC1)NC1CCCCC1]

<Surfactant>
Surfactant 1: a silicone surfactant (manufactured by Dow Corning Corporation, SH8400 FLUID)
Surfactant 2: a fluorine surfactant (manufactured by Neos Co., Ltd., FTERGENT FTX-218)
Surfactant 3: a perfluoroalkyl group-containing nonionic surfactant (manufactured by DIC Corporation, F-554)

Examples 71 to 94 and Comparative Examples 7 and 8

<Preparation 5 of Pattern-Forming Composition>

The following components were mixed and stirred, and the obtained mixture was filtered through a nylon filter (manufactured by Pall Corporation) having a pore size of 0.45 μm to prepare a pattern-forming composition.

Dispersion shown in Table 8: 33.37 parts by mass
Resin shown in Table 8: 12.83 parts by mass
Crosslinking agent shown in Table 8: 2.56 parts by mass
Photoacid generator shown in Table 8: 0.34 parts by mass
Basic compound shown in Table 8: 0.02 parts by mass
Surfactant shown in Table 8: 0.02 parts by mass
Solvent (propylene glycol monomethyl ether acetate): 50.86 parts by mass Using the obtained pattern-forming composition, the same evaluation as that of Examples 1 to 13 was performed. The evaluation results are collectively shown in Table 8.

TABLE 8

| | Composition Component | | | | | | Evaluation Result | | | |
| --- | --- | --- | --- | --- | --- | --- | --- | --- | --- | --- |
| | | | | | | | | Infrared | | |
| | Dispersion | Resin | Crosslinking Agent | Photoacid Generator | Basic Compound | Surfactant | Shielding Properties | Heat Resistance | Pattern Shape | Development Residue |
| Example 71 | Dispersion 1 | B-31 | G-1 | H-1 | 1 | 1 | A | A | B | A |
| Example 72 | Dispersion 2 | B-32 | G-2 | H-1 | 1 | 1 | A | A | B | A |
| Example 73 | Dispersion 3 | B-33 | G-3 | H-1 | 2 | 2 | A | A | B | A |
| Example 74 | Dispersion 4 | B-34 | G-4 | H-2 | 1 | 3 | A | A | B | A |
| Example 75 | Dispersion 5 | B-35 | G-1 | H-2 | 1 | 1 | A | B | B | A |
| Example 76 | Dispersion 6 | B-36 | G-2 | H-2 | 2 | 1 | A | B | B | A |
| Example 77 | Dispersion 7 | B-37 | G-3 | H-3 | 1 | 2 | A | B | B | A |
| Example 78 | Dispersion 8 | B-38 | G-4 | H-3 | 1 | 3 | A | B | B | A |
| Example 79 | Dispersion 9 | B-39 | G-1 | H-3 | 2 | 1 | A | B | B | A |
| Example 80 | Dispersion 10 | B-51 | G-2 | H-4 | 1 | 1 | A | B | B | B |
| Example 81 | Dispersion 11 | B-52 | G-3 | H-4 | 1 | 2 | A | B | B | B |
| Example 82 | Dispersion 12 | B-31 | G-4 | H-4 | 2 | 3 | A | B | B | A |
| Example 83 | Dispersion 13 | B-32 | G-1 | H-1 | 1 | 1 | A | B | B | A |
| Example 84 | Dispersion 14 | B-33 | G-2 | H-1 | 1 | 1 | A | B | B | A |
| Example 85 | Dispersion 15 | B-34 | G-3 | H-1 | 2 | 2 | A | B | B | A |
| Example 86 | Dispersion 16 | B-35 | G-4 | H-2 | 1 | 3 | A | B | B | A |
| Example 87 | Dispersion 17 | B-36 | G-1 | H-2 | 1 | 1 | A | B | B | A |
| Example 88 | Dispersion 18 | B-37 | G-2 | H-2 | 2 | 1 | A | B | B | A |
| Example 89 | Dispersion 19 | B-38 | G-3 | H-3 | 1 | 2 | A | B | B | A |
| Example 90 | Dispersion 20 | B-39 | G-4 | H-3 | 1 | 3 | A | B | B | A |
| Example 91 | Dispersion 21 | B-51 | G-1 | H-3 | 2 | 1 | A | B | B | B |
| Example 92 | Dispersion 22 | B-52 | G-2 | H-4 | 1 | 1 | A | B | B | B |
| Example 93 | Dispersion 23 | B-31 | G-3 | H-4 | 1 | 2 | A | B | B | A |
| Example 94 | Dispersion 24 | B-32 | G-4 | H-4 | 2 | 3 | A | B | B | A |
| Comparative Example 7 | Dispersion 7 | B-40 | G-1 | H-1 | 1 | 1 | A | D | C | A |
| Comparative Example 8 | Dispersion 15 | B-53 | G-1 | H-1 | 1 | 1 | A | B | C | C |

Examples 101 to 113, Examples 115 to 117,
Examples 121 to 144, Examples 151 to 161, and
Examples 171 to 194

The composition obtained in each of Examples 1 to 13, Examples 15 to 17, Examples 21 to 44, Examples 51 to 61, and Examples 71 to 94 was applied to a silicon wafer using a spin coating method such that the thickness of the formed film was 1.0 µm. Next, the coating film was heated using a hot plate at 100° C. for 2 minutes. Next, the coating film was heated using a hot plate at 200° C. for 5 minutes. Next, a 2 µm×2 µm pattern (infrared cut filter) was formed using a dry etching method.

Next, a Red composition was applied to the pattern of the infrared cut filter using a spin coating method such that the thickness of the formed film was 1.0 µm. Next, the coating film was heated using a hot plate at 100° C. for 2 minutes. Next, using an i-ray stepper exposure device FPA-3000 i5+(manufactured by Canon Corporation), the coating film was exposed through a mask having a 2 µm×2 µm dot pattern at 1,000 mJ/cm². Next, puddle development was performed at 23° C. for 60 seconds using a tetramethylammonium hydroxide (TMAH) 0.3 mass % aqueous solution. Next, the coating film was rinsed by spin showering and was cleaned with pure water. Next, the coating film was heated using a hot plate at 200° C. for 5 minutes. As a result, the Red composition was patterned on the pattern of the infrared cut filter. Likewise, a Green composition and a Blue composition were sequentially patterned to form red, green, and blue color patterns (Bayer patterns).

The Bayer pattern refers to a pattern in which color filter elements including one Red element, two Green elements, and one Blue element were repeated in a 2×2 array as disclosed in U.S. Pat. No. 3,971,065A. In the example, filter elements including one Red element, one Green element, one Blue element, and one infrared transmitting filter element were repeated in a 2×2 array to form a Bayer pattern.

Next, an infrared transmitting filter-forming composition (the following composition 100 or the following composition 101) was applied to the pattern-formed film using a spin coating method such that the thickness of the formed film was 2.0 µm. Next, the coating film was heated using a hot plate at 100° C. for 2 minutes. Next, using an i-ray stepper exposure device FPA-3000 i5+(manufactured by Canon Corporation), the coating film was exposed through a mask having a 2 µm×2 µm Bayer pattern at 1,000 mJ/cm². Next, puddle development was performed at 23° C. for 60 seconds using a tetramethylammonium hydroxide (TMAH) 0.3 mass % aqueous solution. Next, the coating film was rinsed by spin showering and was cleaned with pure water. Next, the silicon wafer was heated using a hot plate at 200° C. for 5 minutes. As a result, the infrared transmitting filter was patterned on a portion of the Bayer pattern of the infrared cut filter where the color pattern was not formed. This filter was incorporated into a solid image pickup element using a well-known method The obtained solid image pickup element was irradiated with infrared light emitted from an infrared light emitting diode (infrared LED) as a light source in a low-illuminance environment (0.001 Lux) to acquire images. Next, the imaging performance of the solid image pickup element was evaluated. Even in a case where any composition obtained in Examples 1 to 13, Examples 15 to 17, Examples 21 to 44, Examples 51 to 61, and Examples 71 to 94 was used, the image was able to be clearly recognized even in a low-illuminance environment.

The Red composition, the Green composition, the Blue composition, and the infrared transmitting filter-forming composition used in Examples 101 to 113, Examples 115 to 117, Examples 121 to 144, Examples 151 to 161, and Examples 171 to 194 are as follows.

—Red Composition—

The following components were mixed and stirred, and the obtained mixture was filtered through a nylon filter (manufactured by Pall Corporation) having a pore size of 0.45 µm to prepare a Red composition.

Red Pigment Dispersion: 51.7 parts by mass
Resin 4 (40 mass % PGMEA solution): 0.6 parts by mass
Polymerizable compound 4: 0.6 parts by mass
Photopolymerization initiator 1: 0.3 parts by mass
Surfactant 1: 4.2 parts by mass
PGMEA: 42.6 parts by mass —Green Composition—

The following components were mixed and stirred, and the obtained mixture was filtered through a nylon filter (manufactured by Pall Corporation) having a pore size of 0.45 µm to prepare a Green composition.

Green pigment dispersion: 73.7 parts by mass
Resin 4 (40 mass % PGMEA solution): 0.3 parts by mass
Polymerizable compound 1: 1.2 parts by mass
Photopolymerization initiator 1: 0.6 parts by mass
Surfactant 1: 4.2 parts by mass
Ultraviolet absorber (UV-503, manufactured by Daito Chemical Co., Ltd.): 0.5 parts by mass
PGMEA: 19.5 parts by mass —Blue Composition—

The following components were mixed and stirred, and the obtained mixture was filtered through a nylon filter (manufactured by Pall Corporation) having a pore size of 0.45 µm to prepare a Blue composition.

Blue pigment dispersion: 44.9 parts by mass
Resin 4 (40 mass % PGMEA solution): 2.1 parts by mass
Polymerizable compound 1: 1.5 parts by mass
Polymerizable compound 4: 0.7 parts by mass
Photopolymerization initiator 1: 0.8 parts by mass
Surfactant 1: 4.2 parts by mass
PGMEA: 45.8 parts by mass —Infrared Transmitting Filter-Forming Composition—

The components having the following compositions were mixed and stirred, and the obtained mixture was filtered through a nylon filter (manufactured by Pall Corporation) having a pore size of 0.45 µm to prepare an infrared transmitting filter-forming composition.

<Composition 100>
Pigment Dispersion 1-1: 46.5 parts by mass
Pigment Dispersion 1-2: 37.1 parts by mass
Polymerizable compound 5: 1.8 parts by mass
Resin 4: 1.1 parts by mass
Photopolymerization initiator 2: 0.9 parts by mass
Surfactant 1: 4.2 parts by mass
Polymerization inhibitor (p-methoxyphenol): 0.001 parts by mass
Silane coupling agent: 0.6 parts by mass
PGMEA: 7.8 parts by mass <Composition 101>
Pigment dispersion 2-1: 1,000 parts by mass
Polymerizable compound (dipentaerythritol hexaacrylate): 50 parts by mass
Resin: 17 parts by mass
Photopolymerization initiator (1-[4-(phenylthio)]-1,2-octanedione-2-(O-benzoyloxime)): 10 parts by mass
PGMEA: 179 parts by mass Alkali-soluble polymer F-1: 17 parts by mass (concentration of solid contents: 35 parts by mass)

<Synthesis Example of Alkali-Soluble Polymer F-1>

In a reaction vessel, 14 parts of benzyl methacrylate, 12 parts of N-phenylmaleimide, 15 parts of 2-hydroxyethyl methacrylate, 10 parts of styrene, and 20 parts of methacrylic acid were dissolved in 200 parts of propylene glycol monomethyl ether acetate, and 3 parts of 2,2'-azoisobutyronitrile and 5 parts of α-methylstyrene dimer were further put thereinto. After nitrogen purge, the inside of the reaction vessel was heated at 80° C. for 5 hours under stirring and nitrogen bubbling. As a result, a solution including an alkali-soluble polymer F-1 (concentration of solid contents: 35 mass %) was obtained. In this polymer, the weight-average molecular weight in terms of polystyrene was 9,700, the number-average molecular weight was 5,700, and Mw/Mn was 1.70.

<Pigment Dispersion 2-1>

60 parts of C.I. Pigment Black 32, 20 parts of C.I. Pigment Blue 15:6, 20 parts of C.I. Pigment Yellow 139, 80 parts of SOLSPERSE 76500 (manufactured by Lubrication Technology Inc., concentration of solid contents: 50 mass %), 120 parts (concentration of solid contents: 35 mass %) of the solution including the alkali-soluble polymer F-1, and 700 parts of propylene glycol monomethyl ether acetate were mixed with each other, and the obtained mixture was dispersed using a paint shaker for 8 hours. As a result, a colorant dispersion 2-1 was obtained.

Raw materials used in the Red composition, the Green composition, the Blue composition, and the infrared transmitting filter-forming composition are as follows.

Red Pigment Dispersion 9.6 parts by mass of C.I. Pigment Red 254, 4.3 parts by mass of C.I. Pigment Yellow 139, 6.8 parts by mass of a dispersant (Disperbyk-161, manufactured by BYK Chemie), and 79.3 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2,000 kg/cm³ at a flow rate of 500 g/min. This dispersing treatment was repeated 10 times. As a result, a Red pigment dispersion was obtained.

Green Pigment Dispersion 6.4 parts by mass of C.I. Pigment Green 36, 5.3 parts by mass of C.I. Pigment Yellow 150, 5.2 parts by mass of a dispersant (Disperbyk-161, manufactured by BYK Chemie), and 83.1 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2,000 kg/cm³ at a flow rate of 500 g/min. This dispersing treatment was repeated 10 times. As a result, a Green pigment dispersion was obtained.

Blue Pigment Dispersion 9.7 parts by mass of C.I. Pigment Blue 15:6, 2.4 parts by mass of C.I. Pigment Violet 23, 5.5 parts of a dispersant (Disperbyk-161, manufactured by BYK Chemie), 82.4 parts of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2,000 kg/cm³ at a flow rate of 500 g/min. This dispersing treatment was repeated 10 times. As a result, a Blue pigment dispersion was obtained.

Pigment Dispersion 1-1

A mixed solution having a composition shown below was mixed and dispersed for 3 hours using a beads mill (a high-pressure disperser with a pressure reducing mechanism, NANO-3000-10 (manufactured by Nippon BEE Chemical Co., Ltd.)) in which zirconia beads having a diameter of 0.3 mm were used. As a result, Pigment Dispersion 1-1 was prepared.

Mixed pigment including a red pigment (C.I. Pigment Red 254) and a yellow pigment (C.I. Pigment Yellow 139): 11.8 parts by mass Resin (Disperbyk-111, manufactured by BYK Chemie): 9.1 parts by mass PGMEA: 79.1 parts by mass Pigment Dispersion 1-2

A mixed solution having a composition shown below was mixed and dispersed for 3 hours using a beads mill (a high-pressure disperser with a pressure reducing mechanism, NANO-3000-10 (manufactured by Nippon BEE Chemical Co., Ltd.)) in which zirconia beads having a diameter of 0.3 mm were used. As a result, Pigment Dispersion 1-2 was prepared.

Mixed pigment including a blue pigment (C.I. Pigment Blue 15:6) and a violet pigment (C.I. Pigment Violet 23): 12.6 parts by mass Resin (Disperbyk-111, manufactured by BYK Chemie): 2.0 parts by mass Resin A: 3.3 parts by mass Cyclohexanone: 31.2 parts by mass PGMEA: 50.9 parts by mass Resin A: the following structure (Mw=14,000, a ratio in each constitutional unit is a molar ratio)

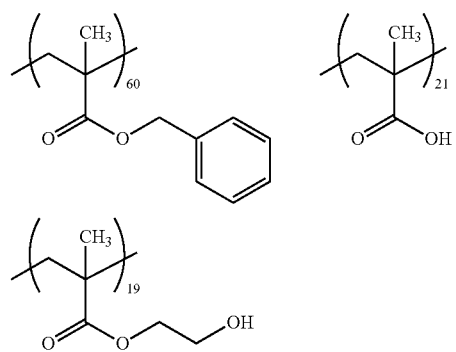

Polymerizable compound 1: KAYARAD DPHA (a mixture of dipentaerythritol hexaacrylate and dipentaerythritol pentaacrylate, manufactured by Nippon Kayaku Co., Ltd.)

Polymerizable Compound 4: the following structure

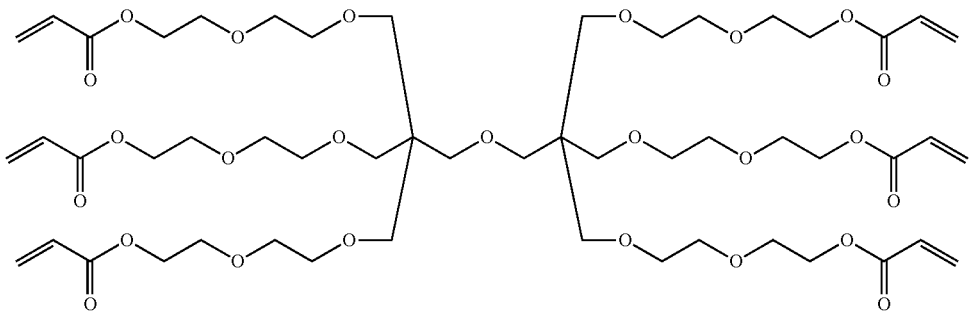 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

Polymerizable Compound 5: the following structures (a mixture in which a molar ratio between a left compound and a right compound is 7:3)

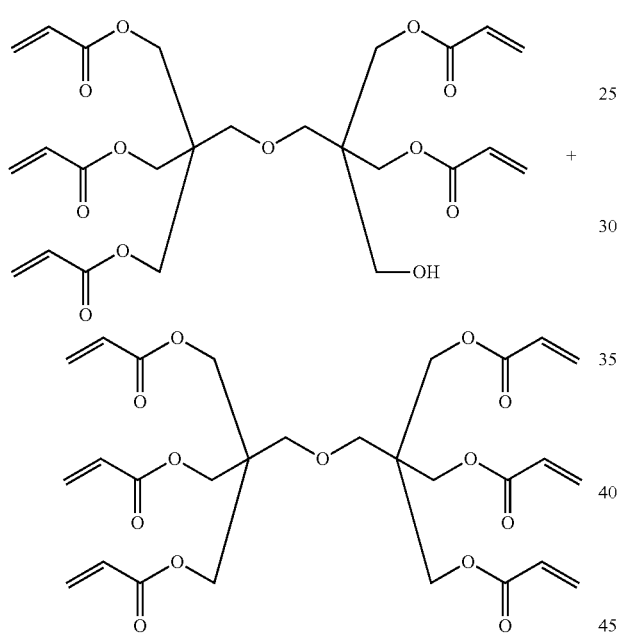

Resin 4: the following structure (acid value: 70 mgKOH/g, Mw=11,000; a ratio in each constitutional unit is a molar ratio)

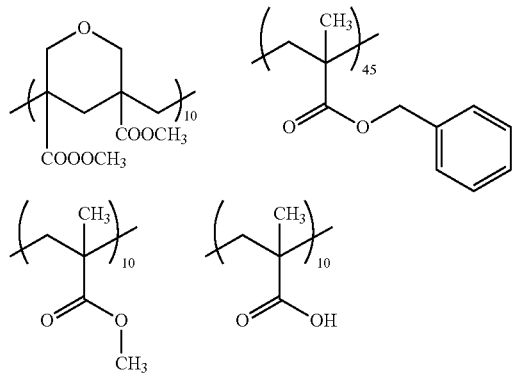

-continued

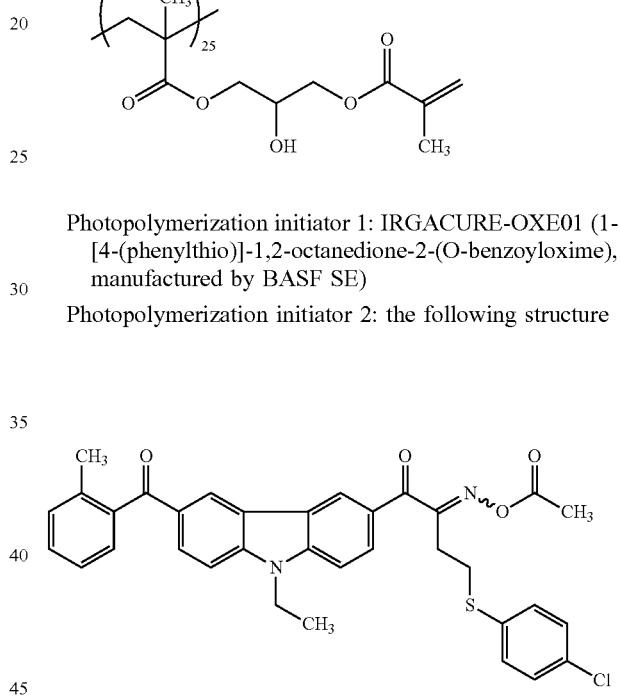

Photopolymerization initiator 1: IRGACURE-OXE01 (1-[4-(phenylthio)]-1,2-octanedione-2-(O-benzoyloxime), manufactured by BASF SE)

Photopolymerization initiator 2: the following structure

Surfactant 1 (a 1 mass % PGMEA solution of the following mixture (Mw=14,000); in the following formula, "%" (62% and 38%) representing the proportion of a constitutional unit is mass %)

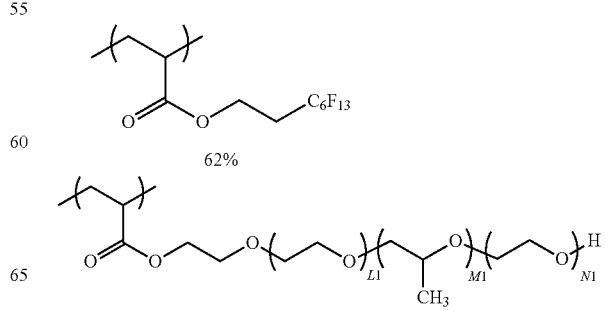

-continued

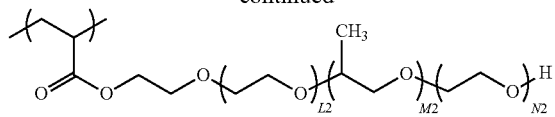

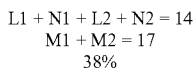

Silane coupling agent: a compound having the following structure In the following structural formulae, Et represents an ethyl group.

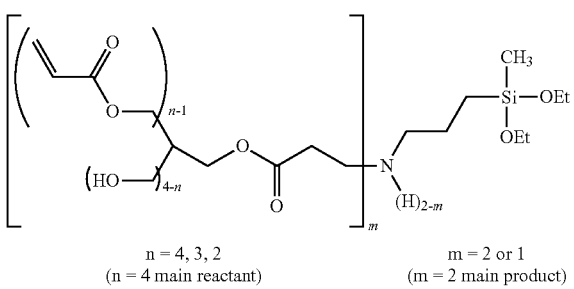

n = 4, 3, 2
(n = 4 main reactant)

m = 2 or 1
(m = 2 main product)

Example 201

The following composition was mixed and stirred, and the obtained mixture was filtered through a nylon filter (manufactured by Pall Corporation) having a pore size of 0.45 μm to prepare a pattern-forming composition according to Example 201.

Pattern-forming composition according to Example 1: 22.67 parts by mass

Pigment dispersion 2-1: 51.23 parts by mass

In a case where the heat resistance, the pattern shape, and the development residue were evaluated with the same method as that of Example 1 using the pattern-forming composition according to Example 201, the same effects as those of Example 1 were obtained. In addition, the cured film obtained using the pattern-forming composition according to Example 201 was able to shield light in a visible range and to allow transmission of at least a part of light (near infrared light) in a near infrared range.

Example 202

The following composition was mixed and stirred, and the obtained mixture was filtered through a nylon filter (manufactured by Pall Corporation) having a pore size of 0.45 μm to prepare a pattern-forming composition according to Example 202.

Pattern-forming composition according to Example 1: 36.99 parts by mass

Pigment Dispersion 1-1: 46.5 parts by mass

Pigment Dispersion 1-2: 37.1 parts by mass

In a case where the heat resistance, the pattern shape, and the development residue were evaluated with the same method as that of Example 1 using the pattern-forming composition according to Example 202, the same effects as those of Example 1 were obtained. In addition, the cured film obtained using the pattern-forming composition according to Example 202 was able to shield light in a visible range and to allow transmission of at least a part of light (near infrared light) in a near infrared range.

Example 301

Even in a case where the infrared shielding properties, the heat resistance, the pattern shape, and the development residue were evaluated with the same method as that of Example 1 except that the composition in each of Examples 1 to 13, Examples 15 to 17, Examples 21 to 44, Examples 51 to 61, and Examples 71 to 94 was used, a glass substrate was used as the substrate, and the composition was applied to the glass substrate, the same effects as those of Examples 1 to 13, Examples 15 to 17, Examples 21 to 44, Examples 51 to 61, and Examples 71 to 94 were obtained.

Example 302

Even in a case where the heat resistance, the pattern shape, and the development residue were evaluated using the same method as that of Example 201 or 202 except that the composition obtained in each of Examples 201 and 202 was used, a glass substrate was used as the substrate, and the composition was applied to the glass substrate, the same effects as those of each of Examples 201 and 202 were obtained.

The disclosure of Japanese Patent Application No. 2017-179153 filed on Sep. 19, 2017 and Japanese Patent Application No. 2018-154670 filed on Aug. 21, 2018 is incorporated herein in its entirety.

All publications, patent applications, and technical standards mentioned in this specification are herein incorporated by reference to the same extent as if each individual publication, patent application, or technical standard was specifically and individually indicated to be incorporated by reference.

EXPLANATION OF REFERENCES

110: solid image pickup element
111: infrared cut filter
112: color filter
114: infrared transmitting filter
115: microlens
116: planarizing layer

What is claimed is:
1. A pattern-forming composition, comprising:
an infrared absorbing colorant; and
at least one compound selected from the group consisting of a resin (A) having a glass transition temperature of 150° C. to 300° C. and a precursor of a resin (B) having a glass transition temperature of 150° C. to 300° C.,
wherein the resin (A) having a glass transition temperature of 150° C. to 300° C. comprises a resin comprising a constitutional unit represented by any one of (a-1), (a-4) to (a-6), and (a-8), and a constitutional unit represented by Formula 1:

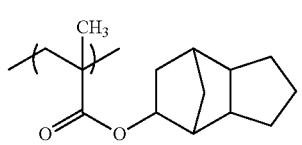

(a-1)

-continued (a-4)
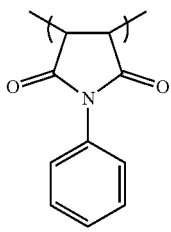

(a-5)
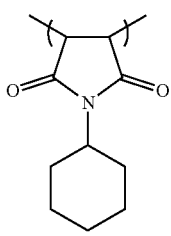

(a-6)
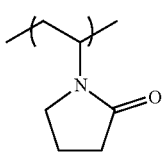

(a-8)
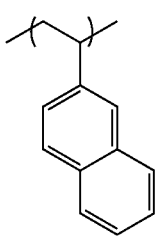

Formula 1
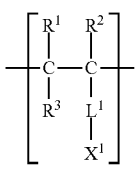

wherein, in Formula 1, each of $R^1$ to $R^3$ independently represents a hydrogen atom, an alkyl group, or a halogen atom, $L^1$ represents a single bond or a divalent linking group, and $X^1$ represents a carboxy group, a phenolic hydroxy group, or a sulfonamide group; and the precursor of a resin (B) having a glass transition temperature of 150° C. to 300° C. comprises a resin comprising a constitutional unit represented by Formula 3 or Formula 4:

Formula 3
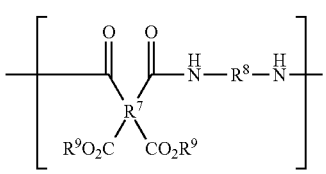

Formula 4
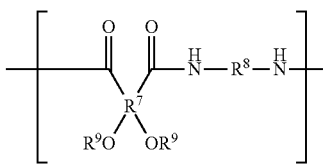

wherein, in Formulae 3 and 4, $R^7$ represents a tetravalent organic group comprising a fluorine atom, $R^8$ represents a divalent organic group, at least one of $R^7$ or $R^8$ in the precursor represents an organic group having an alicyclic group or a fluorine atom, each of $R^9$'s independently represents a hydrogen atom or an organic group, and at least one of $R^9$'s in the precursor represents a hydrogen atom and at least one of $R^9$'s in the precursor represents a polymerizable group.

2. The pattern-forming composition according to claim 1, wherein the infrared absorbing colorant comprises at least one selected from the group consisting of a squarylium compound, a cyanine compound, a phthalocyanine compound, a pyrrolopyrrole compound, a perylene compound, a croconium compound, an oxonol compound, and an iminium compound.

3. The pattern-forming composition according to claim 1, further comprising:
   a polymerizable compound; and
   a photopolymerization initiator.

4. The pattern-forming composition according to claim 1, wherein the resin (A) having a glass transition temperature of 150° C. to 300° C. further comprises a constitutional unit represented by Formula 2:

Formula 2
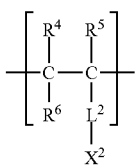

wherein, in Formula 2, each of $R^4$ to $R^6$ independently represents a hydrogen atom, an alkyl group, or a halogen atom, $L^2$ represents a single bond or a divalent linking group, and $X^2$ represents a (meth)acryloyloxy group, a vinyl group, a (meth)acrylamide group, a styryl group, or a maleimide group.

5. A film, formed by curing the pattern-forming composition according to claim 1.

6. An infrared cut filter, comprising:
   the film according to claim 5.

7. A camera module, comprising:
   a solid image pickup element; and
   the infrared cut filter according to claim 6.

8. An infrared transmitting filter, comprising:
   the film according to claim 5.

9. A solid image pickup element, comprising:
   the film according to claim 5.

10. An infrared sensor, comprising:
    the film according to claim 5.

* * * * *